United States Patent
Tanabe et al.

(10) Patent No.: US 7,132,691 B1
(45) Date of Patent: Nov. 7, 2006

(54) SEMICONDUCTOR LIGHT-EMITTING DEVICE AND METHOD FOR MANUFACTURING THE SAME

(75) Inventors: Tetsuhiro Tanabe, Kyoto (JP); Ken Nakahara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/786,338

(22) PCT Filed: Sep. 9, 1999

(86) PCT No.: PCT/JP99/04903

§ 371 (c)(1),
(2), (4) Date: Mar. 8, 2001

(87) PCT Pub. No.: WO00/16411

PCT Pub. Date: Mar. 23, 2000

(30) Foreign Application Priority Data

| Sep. 10, 1998 | (JP) | 10/257167 |
| Sep. 28, 1998 | (JP) | 10/274026 |
| Nov. 11, 1998 | (JP) | 10/320909 |
| Nov. 11, 1998 | (JP) | 10/320910 |
| Nov. 13, 1998 | (JP) | 10/324004 |
| Nov. 18, 1998 | (JP) | 10/328269 |
| Nov. 18, 1998 | (JP) | 10/328271 |
| Nov. 18, 1998 | (JP) | 10/328272 |
| Nov. 18, 1998 | (JP) | 10/328273 |
| Dec. 18, 1998 | (JP) | 10/361557 |
| Dec. 18, 1998 | (JP) | 10/361559 |
| Dec. 18, 1998 | (JP) | 10/361561 |
| Dec. 18, 1998 | (JP) | 10/361562 |
| Jan. 12, 1999 | (JP) | 11/5678 |
| Feb. 1, 1999 | (JP) | 11/24168 |
| Feb. 1, 1999 | (JP) | 11/24169 |

(51) Int. Cl.
*H01L 27/15* (2006.01)

(52) U.S. Cl. .............................. 257/79; 257/13; 257/80; 257/82; 257/89; 257/93; 257/98; 257/103

(58) Field of Classification Search ................... 257/13, 257/79–82, 89, 93, 98, 99, 103, 918
See application file for complete search history.

(56) References Cited

U.S. PATENT DOCUMENTS 5,661,074 A * 8/1997 Tischler ........................ 438/32

(Continued)

OTHER PUBLICATIONS

"Heteroeitaxy of ZnO and GaN and its Implications for Fabrication of Hybrid Optoelectronic Devices", Vispute et al, *Applied Physics Letters, American Institute of Physics,* vol. 73, No. 3, Jul. 20, 1998, pp. 348–350.

(Continued)

*Primary Examiner*—Long Pham
*Assistant Examiner*—Wai-Sing Louie
(74) *Attorney, Agent, or Firm*—Arent Fox, PLLC

(57) ABSTRACT

It has a structure in which an active layer (5) that emits light by electric current injection is sandwiched between an n-type cladding layer (4) and a p-type cladding layer (6) made of materials having a larger band gap than the active layer (5), wherein the active layer (5) is made, for example, of $Cd_xZn_{1-x}O$ ($0 \leq x < 1$). It is further more preferable if the cladding layers (4), (6) are made, for example, of $Mg_yZn_{1-y}O$ ($0 \leq y < 1$). This narrows the band gap of the ZnO materials, and an oxide semiconductor capable of being wet-etched, easy to handle with, and excellent in crystallinity can be used as a material for an active layer or a cladding layer of a semiconductor light emitting device such as a blue light emitting diode or a blue laser diode in which an active layer is sandwiched between cladding layers, so that a blue semiconductor light emitting device being excellent in light emission characteristics can be obtained.

45 Claims, 28 Drawing Sheets

U.S. PATENT DOCUMENTS 5,700,718 A * 12/1997 McTeer .................... 437/192
5,714,006 A * 2/1998 Kizuki et al. ................ 117/89
5,889,295 A * 3/1999 Rennie et al. ............... 257/96
5,966,396 A * 10/1999 Okazaki et al. .............. 372/46
6,057,561 A * 5/2000 Kawasaki et al. ........... 257/94
6,270,574 B1 * 8/2001 Hooper ..................... 117/105

OTHER PUBLICATIONS

"Electroluminescence in (ZnO–CdO) Alloy System", Singh et al, *Indian J. Pure Appl. Phys. (India)*, *Indian Journal of Pure and Applied Physics*, vol. 13, No. 7, Jul. 1975, English Abstract of pp. 486–488.

* cited by examiner

F I G. 8 (a)
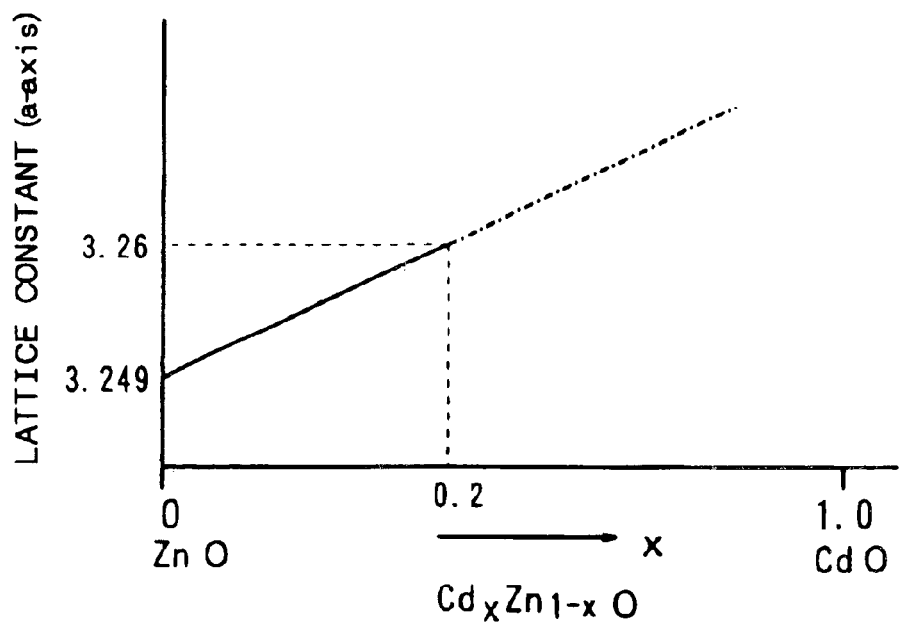
F I G. 8 (b)
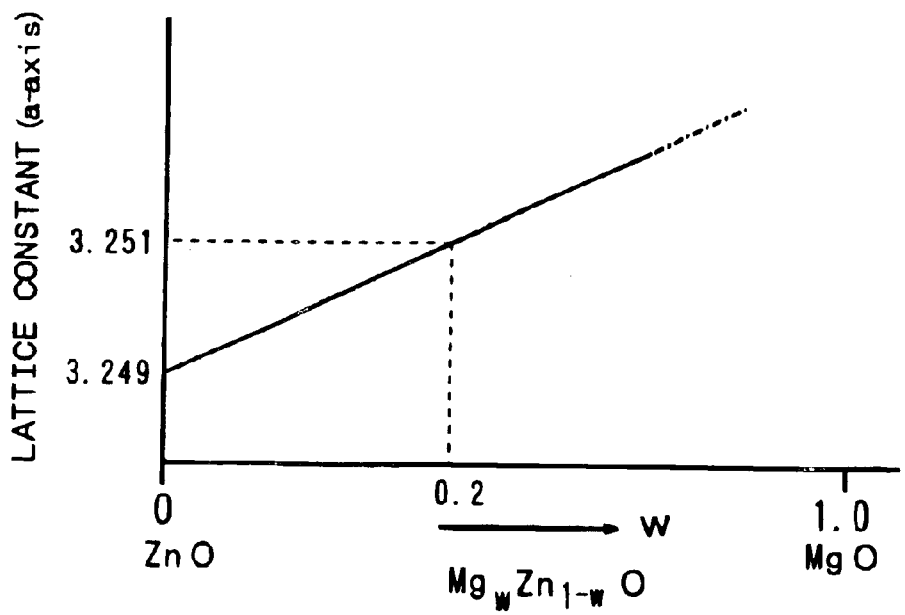

SIDE ETCHING

SEMICONDUCTOR LIGHT-EMITTING DEVICE AND METHOD FOR MANUFACTURING THE SAME

TECHNICAL FIELD

The present invention relates to a compound semiconductor light emitting device, such as a light emitting diode or a laser diode, that emits light with a short wavelength of blue color from ultraviolet to around yellow, and a method for manufacturing the same. More particularly, the present invention relates to a semiconductor light emitting device typically made of a ZnO-based compound semiconductor and being excellent in crystallinity and easy to handle with.

BACKGROUND ART

A blue light emitting diode (hereinafter referred to as LED) used as a light source of full color display or a signal lamp and a blue laser diode (hereinafter referred to as LD) used as a light source of a highly fine next-generation DVD that continuously oscillates at room temperature are attracting people's attention because it has recently become possible to obtain them by lamination of GaN-based compound semiconductor on a sapphire substrate.

Conventional blue semiconductor light emitting devices of this type (which means a color from ultraviolet rays to around yellow; the same applies hereinafter) are obtained by successive lamination of Group III nitride compound semiconductor (GaN-based compound semiconductor) on a sapphire substrate 71 by means of the metal organic chemical vapor deposition (hereinafter referred to as MOCVD), and are constructed in such a manner that a GaN buffer layer 72, an n-type GaN layer 73, an n-type stress-alleviating layer 74 made of $In_{0.1}Ga_{0.9}N$, an n-type cladding layer 75 made of $Al_{0.2}Ga_{0.88}N$, an n-type optical wave guide layer 76 made of GaN, an active layer 77 made of a multiple quantum well structure of InGaN-based compound semiconductor, a p-type optical wave guide layer 78 made of p-type GaN, a p-type first cladding layer 79 made of p-type $Al_{0.2}Ga_{0.8}N$, a p-type second cladding layer 80 made of $Al_{0.12}Ga_{0.88}N$, and a contact layer 81 made of p-type GaN are successively laminated, and a portion of the laminated semiconductor layers is etched by dry etching or the like, as illustrated in FIG. 47, to expose the n-type GaN layer 73 on the surface of which an n-side electrode 83 is formed, and a p-side electrode 82 is formed on the aforesaid contact layer 81.

Further, in the second ICNS (International Conference on Nitride Semiconductor) held in Tokushima, Japan in 1997, a semiconductor light emitting device having a structure is reported in which GaN-based compound semiconductor layers are laminated on a substrate with the use of 6H-SiC. However, the lamination structure of gallium nitride (GaN) compound semiconductor is the same as the aforesaid structure, the only difference being in the substrate.

Such a Group III nitride compound semiconductor for a blue short-wavelength semiconductor light emitting device is thermally and chemically extremely stable and highly reliable, and has extremely excellent properties in view of increasing its life. However, since it is stable, it must be grown at an extremely high temperature such as about 1000° C. in order to obtain semiconductor layers having a good crystallinity, as shown in Japanese Patent Gazette No. 2713094. On the other hand, with regard to semiconductor layers containing In (indium) such as an active layer, mixed crystals of the element In and GaN are not easily formed, and also the vapor pressure of In is high, so that crystals can be stacked only at a temperature of about 700° C. or less if sufficient In is to be introduced. Therefore, the temperature cannot be raised to a high temperature needed for obtaining a semiconductor layer having an excellent crystallinity, so that it is not possible to obtain semiconductor layers having a good crystallinity, raising a problem of reduction in the light-emission efficiency or deterioration in the life characteristic.

Further, a semiconductor laser constructed with AlGaN/InGaN/GaN based semiconductor has a drawback as an important physical property. Namely, the InGaN/GaN system is a lattice-mismatched system, so that an internal electric field (piezoelectric field) is always generated in the InGaN active layer by stress. In particular, InGaN materials have a physical property intrinsic to the materials such that the piezoelectric field is intensely generated. If this internal electric field is strong, electrons and holes are spatially separated, thereby reducing the recombination probability and raising the threshold value of the semiconductor laser. For this reason, reduction of the threshold value is achieved by doping the InGaN active layer with Si or the like to generate a Coulomb potential shield effect for reducing the internal electric field. On the other hand, if it is doped with an impurity, it is not possible to avoid generation of a non-light emitting recombination center, so that carriers are consumed in a process other than the light emission, thereby conversely raising the threshold value and inviting the temperature rise of the element during light emission. This imposes an obstacle in improving the life of the element, particularly in the improvement of life at the time of producing a high output. Therefore, in semiconductor lasers, doping of active layers must be avoided, so that the threshold value cannot be lowered by doping.

As described above, the InGaN materials used for an active layer of a conventional blue semiconductor light emitting device have a problem that the threshold value tends to rise by the stress accompanying the lattice mismatch. On the other hand, if mixed crystals of In with GaN are made, the lattice constant will be smaller, whereas if mixed crystals of Al with GaN are made, the lattice constant will be larger. Therefore, in a blue semiconductor light emitting device having a structure such that an active layer made of InGaN is sandwiched between cladding layers made of AlGaN, this stress cannot be eliminated.

Further, most of the apparatus for growing Group III nitride compound semiconductor layers that do not contain In are vacuum apparatus, so that continuance of crystal growth while keeping the temperature around 1000° C. imposes a heavy load on the apparatus, and also failure such as leakage is liable to occur often, raising a problem that it is extremely difficult to stably operate the apparatus.

Further, since the Group III nitride compound semiconductor is stable, it is extremely difficult to perform wet etching with chemicals, and in particular, it is not possible to build an internal electric current constriction layer therein which is needed in constructing a laser element. Also, the etching for forming a mesa-type shape must be a physical etching such as reactive ion etching (RIE), raising a problem that it is extremely difficult to form it into a semiconductor laser structure as a process.

Therefore, the inventors of the present invention have attempted to produce a blue semiconductor light emitting device using an oxide compound semiconductor. It is known in the art that ZnO, which is one of the oxide compound semiconductor, can be epitaxially grown at a temperature lower than about 600° C. by using the laser MBE method or the like, and is soluble in an alkali solution, so that the wet etching can be performed, as described in Phys. Stat. Sol., Vol. 202 (1997), pp. 669–672. However, this ZnO has a band gap of 3.2 eV, so that if this material is used as it is in an active layer, only the light emission in an ultraviolet region around 370 nm can be achieved. In order to use it, for example, as a light source of a highly fine DVD, both the transmissivity of an optical disk substrate and the recordation density onto a disk must be satisfied, so that the wavelength region of the light source is required to be within the range from 400 to 430 nm, as described in Functional Materials, Vol. 17 (1997), No. 8, pp. 18–25. In other words, as illustrated in FIG. 46, if the wavelength is shorter, the transmissivity of the optical disk substrate is greatly reduced, so that the wavelength of light is required to be larger than 400 nm because transmissivity of 75% or more is needed. Also, if the wavelength is longer, the recordation density is reduced. Due to the need in the recordation density that 15 GB or more is required on one surface of a disk in a highly fine DVD, the wavelength is required to be 430 nm or less.

On the other hand, a wider band gap of ZnO materials is achieved by forming mixed crystals of ZnO and MgO, as described in Applied Physics Letter (Appl. Phys. Lett.). Vol. 72 (1998), No. 19, pp. 2466–2468, or Material Society Forum (Mat. Sci. Forum), Vols. 264–268, pp. 1463–1466, 1998, or the like. However, a concrete method of narrowing the band gap of ZnO is not yet known in the art.

The present invention has been made in view of these circumstances, and an object of the present invention is to narrow the band gap of ZnO materials and to provide a semiconductor light emitting device with improved light-emission characteristics by using an oxide semiconductor having few crystal defects and being excellent in crystallinity as a material for an active layer of a semiconductor light emitting device such as a blue light emitting diode or a blue laser diode in which the active layer is sandwiched between cladding layers.

Another object of the present invention is to provide a blue semiconductor laser such as used in a light source of a highly fine DVD.

Still another object of the present invention is to provide a light emitting device such as a semiconductor laser in which the formation of a mesa-type shape or an internal electric current constriction layer (electric current restricting layer) is facilitated by constructing laminated semiconductor layers with oxide semiconductor capable of being subjected to wet etching.

Still another object of the present invention is to provide a semiconductor light emitting device in which an electrically conductive material is used as a substrate and electrodes can be taken out from both upper and lower surfaces.

Still another object of the present invention is to narrow the band gap of a ZnO-based compound semiconductor and to provide a semiconductor light emitting device using the ZnO-based compound semiconductor.

Still another object of the present invention is to provide a semiconductor light emitting device having a structure such that blue light is emitted without the use of an InGaN-based compound semiconductor in an active layer and stresses accompanying the lattice mismatch are not imposed on the active layer.

Still another object of the present invention is to improve the crystallinity or the electric conductivity of oxide semiconductor layers by growing each layer with good crystallinity or by improving the lamination structure, the electrode structure, or the like and to improve the efficiency of taking out the light to the outside (external differential quantum efficiency) to improve its light-emission characteristics in the case where the light emitting device is formed with the use of a znO-based compound semiconductor.

Still another object of the present invention is to provide a semiconductor laser with high characteristics in which an electric current constriction layer is effectively buried in the inside by utilizing the wet etching property of a ZnO-based oxide semiconductor.

DISCLOSURE OF THE INVENTION

A semiconductor light emitting device according to the invention of claim 5 is a semiconductor light emitting device having a substrate and a light emitting layer forming portion disposed on the substrate so that an active layer that emits light by electric current injection is sandwiched between n-type and p-type cladding layers made of materials having a larger band gap than the active layer, wherein the active layer is made of an oxide compound semiconductor containing at least one of Cd and Zn. Specifically, the aforesaid active layer is formed, for example, of $Cd_xZn_{1-x}O$ ($0 \leq x < 1$).

Here, if the term "light emitting layer forming portion" is simply used, it means to include a portion in which semiconductor layers are laminated in order to have a structure capable of emitting light such as a pn-junction structure or a MIS (Metal-Insulating layer-Semiconductor layer) structure in addition to a double heterojunction structure in which an active layer is sandwiched between n-type and p-type cladding layers.

By adopting this structure, an active layer having a band gap that emits light of a desired wavelength can be produced as a semiconductor layer with good crystallinity, so that a semiconductor light emitting device having a high light emitting efficiency can be produced.

The aforesaid cladding layers can be formed of a ZnO-based oxide compound semiconductor or a Group III nitride compound semiconductor.

Here, the ZnO-based compound semiconductor represents an oxide containing Zn, specific examples thereof being oxides of Group IIA with Zn, or Group IIB with Zn, or Group IIA and Group IIB with Zn in addition to ZnO. Further, the Group III nitride compound semiconductor represents a semiconductor made of a compound of a Group III element Ga and a Group V element N, or a compound in which a part or the whole of a Group III element Ga is substituted with another Group III element such as Al or In, and/or a compound in which a part of a Group V element N is substituted with another Group V element such as P or As, and is also referred to as a gallium nitride based (GaN-based) compound semiconductor.

A semiconductor light emitting device according to the invention of claim 5 is a semiconductor light emitting device having an active layer that emits light by electric current injection and cladding layers made of materials having a larger band gap than the active layer and sandwiching the active layer from both sides thereof, wherein the cladding layers are made of oxide compound semiconductor containing Zn or Mg and Zn. Specifically, the aforesaid cladding layers are formed, for example, of $Mg_yZn_{1-y}O$ ($0 \leq y < 1$).

In view of lattice matching, the substrate on which the cladding layers and the active layer are laminated is preferably one kind selected from the group consisting of GaN, Si having SiC formed thereon, single crystal Sic, and sapphire.

If the aforesaid active layer is a single quantum well structure or a multiple quantum well structure, it is. preferable because the light emitting efficiency is improved to produce a semiconductor laser with high outputs.

A semiconductor laser capable of precisely defining an electric current injection region can be produced by comprising an active layer that emits light by electric current injection, and n-type and p-type cladding layers made of materials having a larger band gap than the active layer and sandwiching the active layer from both sides thereof, wherein the active layer is made of $Cd_xZn_{1-x}O$ ($0 \leq x < 1$), the cladding layers are made of $Mg_yZn_{1-y}O$ ($0 \leq y < 1$), and an internal electric current constriction layer is built therein.

A method of narrowing a band gap of a ZnO compound semiconductor according to the invention aims at reducing the band gap of ZnO by forming a solid solution of CdO and ZnO to make a mixed crystal having a general formula represented by $Cd_xZn_{1-x}O$ ($0 \leq x < 1$).

In the invention described in claim 1, the aforesaid active layer is made of a bulk layer of $Cd_xZn_{1-x}O$ ($0 \leq x < 1$) or a quantum well structure constructed with a composition modification of $Cd_xZn_{1-x}O$ ($0 \leq x < 1$), and a stress-alleviating layer is disposed on at least one side of the n-type cladding layer side and the p-type cladding layer side of the active layer so as to be in contact with the active layer, the stress-alleviating layer being made of a material having a larger band gap than the active layer and having a composition with approximately the same lattice constant as a material of the composition located on the outermost side of the active layer of the at least one side. By adopting this structure, the semiconductor layer having a large band gap which is in direct contact with the active layer and constitutes a double heterojunction can be constructed with a layer having approximately the same lattice constant as the active layer, so that little stress is imposed on the active layer, and the stress accompanying the lattice mismatch from the cladding layers and others is absorbed by the stress-alleviating layer.

Here, the term "bulk layer" represents a layer in which the active layer is constructed with a single layer with constant x. The term "quantum well structure constructed with a composition modification of $Cd_xZn_{1-x}O$ ($0 \leq x < 1$)" represents a structure in which one or more sets of a well layer with a certain value of x and a barrier layer with a different value of x are alternately laminated. Further, the term "located on the outermost side of the active layer of the at least one side" refers to a portion of the active layer which is on the side where the stress-alleviating layer is disposed and which is in contact with the stress-alleviating layer. If the stress-alleviating layer is disposed on both sides of the n-side and the p-side, the term refers to a portion of each side that is in contact. Further, the term "approximately the same lattice constant" refers to a relationship in which the difference is so small that little internal electric field is generated by the stress accompanying the lattice mismatch. A blue semiconductor light emitting device can be realized with a material capable of being subjected to wet etching if the stress-alleviating layer is made of $Mg_wZn_{1-w}O$ ($0 \leq w < 1$), and the cladding layer is made of an oxide compound semiconductor containing Mg and Zn.

A semiconductor laser according to the invention of claim 12 has an active layer that emits light by electric current injection and n-type and p-type cladding layers made of materials having a larger band gap than the active layer and sandwiching the active layer from both sides thereof, wherein the active layer is made of a quantum well structure constructed with a composition modification of $Cd_xZn_{1-x}O$ ($0 \leq x < 1$), and a stress-alleviating layer is disposed on at least one side of the n-type cladding layer side and the p-type cladding layer side of the active layer so as to be in contact with the active layer, the stress-alleviating layer being made of $Mg_wZn_{1-w}O$ ($0 \leq w < 1$) having a composition with approximately the same lattice constant as the composition located on the outermost side of the active layer of the at least one side.

It may have a structure such that the cladding layers are made of $Mg_yZn_{1-y}O$ ($0 \leq y < 1$), and an optical wave guide layer is disposed between the stress-alleviating layer and the n-type or p-type cladding layer.

In the invention described in claim 4, a low-temperature ZnO layer may be disposed at least on the active layer side between the active layer and an upper cladding layer. By adopting this structure, a film of the low-temperature ZnO layer is formed on the active layer, so that even if ZnO or MgZnO is grown thereon at a high temperature, evaporation of Cd in the active layer having a large vapor pressure is restrained by the low-temperature ZnO layer. On the other hand, at the time when the low-temperature ZnO layer is formed, it is grown at a low temperature of the same degree as the growth temperature of the active layer, so that evaporation of Cd is restrained. As a result, each semiconductor layer can be grown without letting the Cd of the active layer be evaporated. Therefore, light emission of a longer wavelength in a blue range can be achieved, and also the crystallinity of the active layer is improved to improve the light emission characteristics. Here, although this low-temperature ZnO layer is inferior in crystallinity because it is grown at a low temperature, it does not affect the crystallinity of the active layer because the active layer is already stacked. Also, even if it is extremely thin, evaporation of Cd can be prevented. Since it is disposed to have a thickness, for example, of about 100 to 1000 Å, its influence is small. Moreover, the crystallinity is repaired by the temperature at the time of growing ZnO at a high temperature, so that the influence on the light emission characteristics can be almost completely eliminated.

A method of manufacturing a ZnO-based compound semiconductor is an embodiment of the present invention is a method of manufacturing a ZnO-based compound semiconductor light emitting device in which an active layer made of a ZnO-based compound semiconductor containing cd is sandwiched between cladding layers made of ZnO-based compound semiconductor, comprising the steps of growing the active layer made of the ZnO-based compound semiconductor containing Cd, growing a Cd-evaporation-preventing layer made of ZnO at approximately the same low temperature as the growth temperature of the active layer, and then a ZnO-based compound semiconductor layer is grown at a high temperature.

A semiconductor light emitting device according to claim 16 comprises a sapphire substrate, a buffer layer made of an $Al_2O_3$ film disposed on the sapphire substrate, and a light emitting layer forming portion made of ZnO-based compound semiconductor disposed on the buffer layer, the light emitting layer forming portion including at least n-type and p-type layers to form a light emitting layer.

By adopting this structure, an $Al_2O_3$ film is disposed on a mirror surface of the front surface of the sapphire substrate, so that an initial crystal nucleus for growing crystals is created on the entire front surface thereof. In other words, in the case of a mirror surface of a sapphire substrate, there will be a portion where the initial crystal nucleus is not formed due to the fact that the surface is polished, so that there will not be a growth in the lateral direction at a position where the crystal nucleus is absent, and often a crystal grain boundary is partly generated in which the growth in the longitudinal direction does not proceed easily, as described before. However, by forming an $Al_2O_3$ film in advance, the film is firmly formed since the sapphire substrate and the $Al_2O_3$ film are materials of the same quality, and its front surface is in a state in which the molecules are deposited. Therefore, the initial crystal nucleus is created uniformly over the entire front surface thereof in growing the ZnO-based compound semiconductor and, with the initial crystal nucleus serving as a seed, crystals of the ZnO-based compound grow. As a result, it is possible to grow a uniform crystal layer of the ZnO-based compound semiconductor without generating a crystal grain boundary.

If the aforesaid light emitting layer forming portion has a double heterojunction structure in which the active layer made of $Cd_xZn_{1-x}O$ ($0 \leq x < 1$) is sandwiched between n-type and p-type cladding layers made of $Mg_yZn_{1-y}O$ ($0 \leq y < 1$), it is possible to obtain a highly bright LED or LD having a double heterojunction structure using a ZnO-based compound semiconductor in which an active layer having a band gap energy suitable for blue wavelength is sandwiched with materials having a larger band gap energy than that. An LD of still higher output is produced by forming a semiconductor laser in which the aforesaid active layer has a multiple quantum well structure by alternate lamination of layers with different values of x.

A method of manufacturing a semiconductor light emitting device according to an embodiment of the present invention comprises the steps of depositing an $Al_2O_3$ film at a low temperature on a sapphire substrate, raising the temperature of the sapphire substrate to a temperature such that single crystals can be grown, and growing a light emitting layer forming portion which is made of ZnO-based compound semiconductor and comprises a first conductivity layer and a second conductivity layer to form a light emitting layer.

Thus, by first forming an $Al_2O_3$ film at a low temperature and then raising the temperature to a high temperature for crystal growth, crystals do not grow at the low temperature at which the $Al_2O_3$ film is formed, so that the film is uniformly formed over the entire surface irrespective of the surface state of the sapphire substrate. Then, by raising the temperature to a temperature of crystal growth for growing the ZnO-based compound semiconductor, at least the front surface side of the $Al_2O_3$ film is crystallized, and the initial crystal nucleus can be easily created uniformly on the front surface, so that it is preferable.

A semiconductor light emitting device according to claim 18 comprises a substrate, and a semiconductor laminate section disposed on the substrate and made of oxide compound semiconductor layers and including a light emitting layer forming portion, wherein an oxide thin film containing Zn is disposed as a buffer layer on a front surface of the substrate at a lower temperature than the temperature of growing the semiconductor layers of the semiconductor laminate section and is interposed between the substrate and the semiconductor laminate section.

By adopting this structure, the oxide semiconductor layer containing Zn is formed at a low temperature on the substrate, so that the film is formed uniformly irrespective of the state of the substrate. As a result, the initial crystal nucleus is created uniformly on the front surface when the temperature becomes high in growing an oxide compound semiconductor such as ZnO thereon. With the crystal nucleus serving as a seed, a uniform crystal layer grows. For this reason, the restrain of the substrate can be alleviated, that is, an oxide compound semiconductor layer can be epitaxially grown while selecting the substrate in a somewhat arbitrary manner. Moreover, since a semiconductor layer of the same quality such as ZnO-based layer that is grown thereon, a homojunction to the buffer layer is formed, so that a semiconductor layer with good crystals can be easily grown.

If the buffer layer is formed to have a thickness of 20 to 200 nm by an MBE (molecular beam epitaxy) method, an MOCVD (metal organic chemical vapor deposition) method, or a plasma CVD method between 100 and 300° C., the oxide compound semiconductor layer can be grown successively by the same apparatus after the film of the buffer layer is formed. Therefore, it can be grown in an extremely clean state, and an oxide compound semiconductor layer with fewer crystal defects can be grown, so that it is preferable.

A method of manufacturing a semiconductor light emitting device according to claim 20 comprises the steps of, forming a non-crystalline or polycrystalline oxide thin film containing Zn on a substrate by a sputtering method, a vacuum vapor deposition method, or a laser ablation method, putting the substrate into an apparatus for epitaxial growth of semiconductor layers and raising a substrate temperature to a growth temperature, and laminating an oxide compound semiconductor layer to form a light emitting layer forming portion.

According to this method, the film is formed by a method such as the sputtering method which is utterly different from the method of growing ordinary semiconductor layers and which is different from the thin film epitaxial growth, so that a dense film can be formed. By this denseness that is not derived from epitaxial growth, it is possible to prevent the influence of the property of the substrate on the semiconductor layers laminated thereon, so that the film can be formed on any substrate more irrespective of the crystal structure of the substrate. In this case also, the initial crystal nucleus is created uniformly on the front surface of the buffer layer by raising the temperature with the apparatus of growing oxide compound semiconductor layers, in the same manner as previously described. With the initial crystal nucleus serving as a seed, the oxide compound semiconductor layer can be grown uniformly over the entire surface. Moreover, the growth temperature of, for example, ZnO is about 500° C. and is comparatively low, so that it is not necessary to grow it at a high temperature of 1000° C. or more such as in the case of a GaN-based compound semiconductor, and also the need for selecting a substrate capable of withstanding the high temperature is eliminated. As a result, the substrate can be selected freely.

A semiconductor light emitting device according to the invention of claim 21 comprises a substrate, and a semiconductor laminate section including a light emitting layer forming portion made of compound semiconductor layers disposed on the substrate and having n-type and p-type layers to form a light emitting layer, wherein a buffer layer is disposed between the substrate and the semiconductor laminate section, the buffer layer being made of a material having a thermal expansion coefficient larger than the thermal expansion coefficient of an epitaxial growth layer at the lowermost layer of the semiconductor laminate section and smaller than the thermal expansion coefficient of the substrate.

Here, the epitaxial growth layer at the lowermost layer refers to a semiconductor layer that is epitaxially grown initially in growing the semiconductor laminate section.

By adopting this structure, a buffer layer having an intermediate shrinkability between the shrinkability of the substrate and the shrinkability of the epitaxial growth layer at the lowermost layer of the semiconductor laminate section is interposed at the time of lowering the temperature of the growth furnace after the semiconductor laminate section is grown, so that cracks due to the difference in shrinkability are not easily generated. If the cracks are not generated at the time of lowering the temperature, there will not be a phenomenon that the cracks are further generated on the basis of the existing cracks, so that it is possible to produce a semiconductor growth layer with fewer crystal defects such as cracks as a whole.

If the substrate is made of a sapphire substrate, and the epitaxial growth layer of the lowermost layer is made of a ZnO-based compound semiconductor, and the buffer layer is a compound semiconductor having a wurtzite structure, then the ZnO-based compound semiconductor layer can be easily grown to have a good crystal structure on the buffer layer since the ZnO-based compound semiconductor has a wurtzite structure.

It is especially preferable if the buffer layer is made of $Al_pGa_{1-p}N$ ($0 \leq p < 1$), because $Al_pGa_{1-p}N$ has a thermal expansion coefficient lying between the sapphire substrate and the ZnO-based compound semiconductor and also its crystal structure is a wurtzite structure which is the same as ZnO. If the light emitting layer forming portion of the semiconductor laminate section has a double heterojunction structure in which an active layer made of $Cd_xZn_{1-x}O$ ($0 \leq x < 1$) is sandwiched between n-type and p-type cladding layers made of $Mg_yZn_{1-y}O$ ($0 \leq y < 1$), it is possible to produce a highly bright LED or LD having a double heterojunction structure using a ZnO-based compound semiconductor in which the active layer having a band gap energy suitable for a blue wavelength is sandwiched with materials having a larger band gap energy than that. Further, an LD of still higher output is produced by forming a semiconductor laser in which the aforesaid active layer has a multiple quantum well structure by alternate lamination of layers with different values of x.

A semiconductor light emitting device according to claim 24 comprises a substrate, a reflective film for reflecting light from a front surface side of the substrate, and a semiconductor laminate section, wherein the reflective film is laminated by an even number of dielectric films or semiconductor films having different refractive indices with a thickness of $\lambda/(4n)$ (n is a refractive index of the dielectric film or the semiconductor film, and $\lambda$ is a light emission wavelength) on the substrate so that a layer having a smaller refractive index and a layer having a larger refractive index are alternately laminated in this order, and wherein in the semiconductor laminate section in which semiconductor layers are laminated on the reflective film to form a light emitting layer.

By adopting this structure, the reflective film is disposed immediately under the semiconductor laminate section that forms the light emitting layer, so that the light proceeding in the direction opposite to the surface for taking out the light is also reflected to proceed to the surface for taking out the light, thereby greatly improving the efficiency of taking out the light to the outside. Moreover, since the light is reflected immediately near to the light emitting layer, there is no waste of light, thereby all the more improving the efficiency of taking out the light. Further, in the case of an LD also, since the reflective film having a larger reflectivity returns the light to the active layer, the efficiency of enclosing the light is improved, thereby reducing the threshold current and improving the quantum efficiency.

It is preferable if a buffer layer formed at a low temperature is disposed on the reflective film and the semiconductor laminate section is formed by lamination of oxide compound semiconductor on the buffer layer, because the semiconductor laminate section can be grown to have good crystallinity without being affected by the reflective film or the substrate, owing to the presence of the buffer layer. More preferably, the buffer layer is formed by forming a non-crystalline or polycrystalline oxide thin film containing Zn by a sputtering method, a vacuum vapor deposition method, or a laser ablation method, and the semiconductor laminate section is formed by lamination of a ZnO-based compound semiconductor on the buffer layer.

A ZnO-based compound semiconductor light emitting device according to claim 27 is a ZnO-based compound semiconductor light emitting device comprising a substrate, and a light emitting layer forming portion disposed on the substrate and forming a light emitting layer by lamination of ZnO-based compound semiconductor having at least an n-type layer, wherein an n-side electrode disposed in contact with the n-type layer of the ZnO-based compound semiconductor is formed so that a portion of the n-side electrode which is in contact with the n-type layer is formed of Ti or Cr, the portion not containing Al.

By adopting this structure, it is confirmed that a good ohmic contact is obtained between the electrode material and the n-type ZnO-based compound semiconductor layer, so that a semiconductor light emitting device such as LED or LD having a small contact resistance and being excellent in forward direction characteristics is obtained.

It is preferable if a layer containing Ti and Al is disposed on the layer of Ti or Cr that does not contain Al, because connection with another lead such as a wire bonding will be extremely good.

If the Ti and Al are formed into an alloy by an annealing treatment after the layer containing Ti and Al is formed, the ohmic contact property will be further more improved.

A method of growing a p-type ZnO-based compound semiconductor according to an embodiment of the invention is characterized in that a ZnO-based compound semiconductor is epitaxially grown by introducing a Group IA element as a p-type dopant while introducing a Group VIIB element as a buffering agent in epitaxially growing the ZnO-based compound semiconductor.

By using this method, the Group VIIB element serves to shield against a Coulomb attraction force between Zn and O to which the Coulomb attraction force acts on the basis of the aforesaid hexagonal crystal system structure, so that the Group IA element is substituted with Zn to exhibit a p-type. Further, the holes will not be localized at the position of the p-type dopant owing to the effect of shielding against the Coulomb potential. This permits the holes to overlap their wave functions with each other, so that the wave functions will spread over the entire crystal to realize the p-type.

At least one kind of an element selected from the group consisting of Li, Na, K, and Rb is used as the Group IA element, and at least one kind of an element selected from the group consisting of F, Cl, Br, and I is used as the Group VIIB element. Further, if the molar number of the introduced Group IA element is larger than the molar number of the Group VIIB element, a superfluous buffering agent can be canceled.

A method of growing a p-type ZnO-based compound semiconductor according to an embodiment of the invention is a method in which a ZnO-based compound semiconductor is epitaxially grown by introducing a Group VB element as a p-type dopant while introducing a Group IIIB element as a buffering agent in epitaxially growing the ZnO-based compound semiconductor.

By adopting this method, the Group IIIB element serves to shield against a Coulomb attraction force as described in the previous case, so that the Group VB element is substituted with Zn to exhibit a p-type.

At least one kind of an element selected from the group consisting of N, P, As, and Sb is used as the Group VB element, and at least one kind of an element selected from the group consisting of B, Al, Ga, In, and Tl is used as the Group IIIB element. Further, if the molar number of the introduced Group VB element is larger than the molar number of the Group IIIB element, it is preferable because a superfluous buffering agent can be canceled.

A semiconductor light emitting device according to the invention of claim 30 is a semiconductor light emitting device comprising a substrate, and a light emitting layer forming portion made of ZnO-based compound semiconductor layers disposed on the substrate and forming a light emitting layer with an n-type layer and a p-type layer, wherein the p-type layer contains an element capable of becoming an n-type dopant as a buffering agent.

A method of growing a compound semiconductor by vapor deposition according to an embodiment of the invention is characterized in that, when a p-type compound semiconductor layer is epitaxially grown by an MOCVD method, the p-type semiconductor layer is grown by alternately repeating a step of introducing a reaction gas for growing the compound semiconductor layer into a growth apparatus to grow a thin film of the semiconductor layer and a step of introducing a p-type dopant gas for carrying out a doping process.

By adopting this method, when the dopant gas is decomposed to enter the semiconductor layer, the dopant gas enters the semiconductor layer without being combined with hydrogen because active hydrogen atoms produced by unreacted material gas or the like are absent in the surroundings. As a result, the dopant having entered the semiconductor layer fully functions, thereby to produce a p-type semiconductor layer having a high carrier concentration.

It is more preferable if the reaction gas for growing the semiconductor layer is purged after the step of growing the thin film of the semiconductor layer and thereafter the dopant gas is introduced for carrying out the doping process, because hydrogen atoms that are liable to be generated by being decomposed from the reaction gas can be completely removed.

It is preferable if only an organic metal material, which does not have a structure such that a material is combined directly with hydrogen such as in the case of $H_2Se$ or $H_2S$, is used as the reaction gas for growing the semiconductor layer, because hydrogen atoms are easily eliminated from the reaction gas and there will be little influence of the reaction gas even if some of the reaction gas is left.

It is preferable if nitrogen or a rare gas of Group 0 is introduced into the growth apparatus for purging the reaction gas, because the reaction gas can be completely eliminated to remove its influence. Here, since the hydrogen gas used as the carrier gas is in the form of hydrogen molecules, it is not easily decomposed at around the temperature of growing semiconductor, so that there will be little influence. However, it is more preferable if the carrier gas is also made of an inert gas.

It is preferable if, as a p-type dopant gas, a material having a structure such that elements of the dopant are not directly bonded to hydrogen atoms is used when a p-type compound semiconductor layer is epitaxially grown by an MOCVD method, because generation of hydrogen atoms from the dopant gas can also be prevented, and the combination of the dopant and hydrogen can be prevented with more certainty. Here, the use of this p-type dopant gas is effective irrespective of the aforesaid method of repeating the steps of growth and doping.

A method of growing crystals of an oxide compound semiconductor according to an embodiment of the invention is a method in which the single crystals of the oxide compound semiconductor are grown on a substrate by introducing an element constituting the compound semiconductor and oxygen in a plasma state, characterized in that the crystals of the oxide compound semiconductor are grown while removing or deviating charged particles generated in the plasma so that the charged particles will not be radiated directly onto the substrate.

By adopting this method, the charged particles generated in the plasma are not directly radiated onto the substrate, so that the charged particles will not produce defects in the crystal layer grown on the substrate surface by hitting the substrate, nor will ions adhere to the substrate surface to repel the elements for forming the film. Therefore, only oxygen in an active atomic state, such as radical oxygen, can be radiated onto the substrate, making it possible to grow a semiconductor layer with good crystallinity and fewer crystal defects.

A blue (wavelength region from ultraviolet to yellow) semiconductor light emitting device using a ZnO-based compound semiconductor can be produced if removal or deviation of the charged particles is carried out by applying an electric field and/or a magnetic field and crystals of ZnO-based compound semiconductor are grown as the oxide compound semiconductor.

An apparatus for growing crystals of an oxide compound semiconductor according to an embodiment of the invention has a main chamber, a substrate holder disposed in the main chamber, and a cell group disposed to be capable of radiating elements constituting the compound semiconductor towards a substrate held by the substrate holder, and a plasma source for radiating a plasma, wherein an electromagnetic field applying apparatus for applying an electric field and/or a magnetic field is disposed at least at a radiation outlet for radiating the plasma of the plasma source.

A ZnO-based compound semiconductor light emitting device according to the invention of claim 31 is a ZnO-based compound semiconductor light emitting device comprising a substrate and a light emitting layer forming portion that forms a light emitting layer by lamination of a ZnO-based compound semiconductor layer disposed on the substrate, wherein the ZnO-based compound semiconductor layer contains a C element. In other words, since an organic metal compound is used as a material for Zn, Zn and C are combined with 0 in a state in which some of Zn and C are in a bonded state because Zn and C have a large bonding energy, although the bonding of carbon and hydrogen in an organic metal is weak and liable to be cut off and hydrogen is liable to escape. As a result, some of Zn and C are in a bonded state, whereby the evaporation of Zn during the crystal growth can be prevented.

The C element can be C (carbon) of an organic metal material used as a Zn material in growing the ZnO-based compound semiconductor layer.

A method of manufacturing a ZnO-based compound semiconductor light emitting device according to an embodiment of the invention is characterized in that, in manufacturing a ZnO-based compound semiconductor light emitting device in which a ZnO-based compound semiconductor layer is laminated on a substrate to form a light emitting layer, the ZnO-based compound semiconductor is epitaxially grown on the substrate by radiating an organic metal compound of Zn as a Zn material of the ZnO-based compound onto a surface of the substrate for reaction on the substrate surface.

Here, the term "radiating it onto a surface of the substrate for reaction on the substrate surface" means a state in which the respective materials meet for the first time on the substrate or on the front surface of the substrate for reaction, such as in the MBE (molecular beam epitaxy) method, instead of reacting it in the entire chamber such as in the MOCVD (metal organic chemical vapor deposition) method.

A semiconductor laser according to the invention of claim 33 comprises a substrate, a first cladding layer disposed on the substrate and made of a first conductivity type semiconductor, an active layer disposed on the first cladding layer, a second cladding layer disposed on the active layer and made of a second conductivity type semiconductor, and an electric current constriction layer disposed in the inside of or in the vicinity of the second cladding layer, wherein the electric current constriction layer is made of a ZnO-based compound semiconductor doped with a Group IA or Group VB element.

The electric current injection region can be efficiently narrowed and a blue semiconductor laser with improved oscillation efficiency can be obtained if the first cladding layer, the active layer, and the second cladding layer are made, for example, of ZnO-based or GaN-based compound semiconductor (Group III nitride compound semiconductor).

By adopting this structure, in a blue semiconductor laser using a ZnO-based or GaN-based compound semiconductor, by similar crystal growth of a semiconductor layer, an insulated electric current constriction layer can be formed successively by growth of the semiconductor layer and can be built near the active layer. Moreover, since the electric current constriction layer is formed of a ZnO-based compound semiconductor, an electric current injecting portion can be formed easily by wet etching. As a result, the electric current can be injected precisely into a needed region, and also there will be little damage to the semiconductor layer. Therefore, even in the case of epitaxially growing a semiconductor layer thereon again, the semiconductor layer can be grown to have a good crystallinity, and the threshold value decreases to produce a semiconductor laser being excellent in oscillation efficiency and having high characteristics.

If the electric current constriction layer is made of $Mg_zZn_{1-z}O$ ($0 \leq z < 1$), the refractive index will be small and, even if it is disposed near the active layer, it does not absorb the light emitted by the active layer. Therefore, it can be disposed near the active layer, and a semiconductor laser of real refractive index wave-guiding type is obtained.

A semiconductor laser according to the invention of claim 36 comprises a substrate, a first cladding layer disposed on the substrate and made of a first conductivity type semiconductor, an active layer disposed on the first cladding layer, a second cladding layer disposed on the active layer and made of a second conductivity type semiconductor, and an electric current constriction layer disposed in the inside of or in the vicinity of the second cladding layer and made of $Mg_zZn_{1-z}O$ ($0 \leq z < 1$), wherein an etching stopping layer made of $Cd_sZn_{1-s}O$ ($0 < s < 1$) or $Be_tZn_{1-t}O$ ($0 < t < 1$) is disposed on the substrate side of the electric current constriction layer.

By adopting this structure, the electric current constriction layer made of $Mg_zZn_{1-z}O$ can be etched with good selectivity by etching it with an alkaline etchant because $Cd_sZn_{1-s}O$ has a small etching rate to an alkaline etchant though it has a large etching rate to an acidic etchant. Further, since the band gap energy of $Cd_sZn_{1-s}O$ becomes larger according as the value of s decreases, the absorption of light can be eliminated by using CdZnO having a larger band gap energy than the band gap energy of CdZnO of the active layer. Furthermore, since $Be_tZn_{1-t}O$ has a small etching rate to either of an acidic and alkaline etchants, the electric current constriction layer can be etched with good selectivity by using either etchant.

A method of manufacturing a semiconductor laser according to an embodiment of the invention comprises the steps of growing a first conductivity type cladding layer, an active layer, and a second conductivity type lower cladding layer made of ZnO-based compound semiconductor on a substrate; growing an etching stopping layer made of $Cd_sZn_{1-s}O$ ($0 < s < 1$) and an insulating or first conductivity type electric current constriction layer made of $Mg_zZn_{1-z}O$ ($0 \leq z < 1$) on the second conductivity type lower cladding layer; etching the electric current constriction layer with an alkali solution to form an electric current injecting region; and growing a second conductivity type upper cladding layer made of a ZnO-based compound semiconductor. The electric current constriction layer may be grown in a similar manner by using $Be_tZn_{1-t}O$ ($0 < t < 1$) as the etching stopping layer, and the electric current constriction layer may be etched with an acidic or alkaline etchant.

An oxide compound semiconductor LED according to the invention of claim 37 has a so-called MIS-type structure comprising an n-type layer made of an n-type ZnO-based compound semiconductor, an i-layer made of a semiinsulating ZnO-based compound semiconductor, and an electrically conductive layer disposed on a surface of the i-layer.

By adopting this structure, an insulating layer is securely obtained with a simple structure, and a stable oxide compound semiconductor LED due to the MIS structure is produced. Moreover, light emission having a large brightness is obtained with a small electric current, owing to the light emission of excitons of ZnO.

This MIS-type oxide compound semiconductor LED can be constructed, specifically, with an n-type layer made of an n-type ZnO-based compound semiconductor, a doped layer in which a ZnO-based compound semiconductor layer is doped with at least one kind of an element selected from the group consisting of Group IA, Group IB, and Group VB elements, and an electrically conductive layer disposed on a front surface of the doped layer. In this case also, the doped layer acts almost as an insulating layer and operates in the same manner as in the aforesaid MIS structure.

Doping the n-type layer with a Group IIIB element produces an effect of stabilizing the crystals after doping (for example, Group IV carbon or the like makes the crystals unstable).

A semiconductor light emitting device according to the invention of claim 40 comprises a substrate and a light emitting layer forming portion disposed on the substrate and forming a light emitting layer by lamination of compound semiconductor layers having at least an n-type layer and a p-type layer, wherein the n-type layer is made of a ZnO-based compound semiconductor and the p-type layer is made of a GaN-based compound semiconductor.

By adopting this structure, it is possible to use a p-type GaN-based compound semiconductor instead of a ZnO-based compound semiconductor that cannot be easily formed to have a p-type and also, by using a ZnO-based compound semiconductor in a light emitting layer portion, a highly efficient electric current injection light-emission of pn-junction type can be realized by utilizing light-emission using excitons. Further, by forming an n-type layer made, for example, of a ZnO-based compound semiconductor at an upper part, only the ZnO-based compound semiconductor can be etched by wet etching, since a GaN-based compound semiconductor is present under the ZnO-based compound semiconductor.

If an active layer made of $Cd_xZn_{1-x}O$ ($0 \leq x \leq 0.5$) is disposed between the n-type layer and the p-type layer, the ZnO-based compound semiconductor layer being excellent in light-emission characteristics can be made as a light emitting layer, thereby improving the light emission efficiency.

If an n-type ZnO-based compound semiconductor layer made of a material having a larger band gap energy than the active layer is disposed between the active layer and the p-type layer, it is possible to restrain the influence of an interface level accompanying the process of joining a ZnO-based compound semiconductor, a heterogeneous semiconductor layer to become a light emitting layer, on a GaN-based compound semiconductor layer with the use of a ZnO-based compound semiconductor layer, which does not directly become a light emitting layer, as a buffer layer.

Specifically, the semiconductor light emitting device is constructed with an insulating substrate, a light emitting layer forming portion formed of a p-type layer disposed on the insulating substrate and made of a GaN-based compound semiconductor and an n-type layer disposed on the p-type layer and made of a ZnO-based compound semiconductor, an n-side electrode disposed on the n-type layer, and a p-side electrode disposed on the p-type layer which is exposed by removal of a portion of the ZnO-based compound semiconductor layer through etching.

If the light emitting layer forming portion has a semiconductor laser structure having a p-type layer made of a GaN-based compound semiconductor, an active layer made of a ZnO-based compound semiconductor having a smaller band gap energy than the p-type layer, and an n-type layer made of a ZnO-based compound semiconductor having a larger band gap energy than the active layer, and if the laminated ZnO-based compound semiconductor layers are removed by etching except for a region for injecting an electric current into the active layer, then the electric current injecting region can be defined with certainty and a wasteful electric current is eliminated to realize a highly efficient oscillation.

If a buffer layer made of an n-type ZnO-based compound semiconductor having a larger band gap energy than the active layer is disposed between the p-type layer and the active layer, the crystallinity of the active layer can be improved.

BRIEF DESCRIPTION OF THE DRAWINGS

FIG. 8 is a view showing change in lattice constant when the value of x and z in $Cd_xZn_{1-x}O$ and $Mg_zZn_{1-z}O$ are each changed.

BEST MODES FOR CARRYING OUT THE INVENTION

Next, a semiconductor light emitting device of the present invention will be explained with reference to the drawings.

Figure 1:
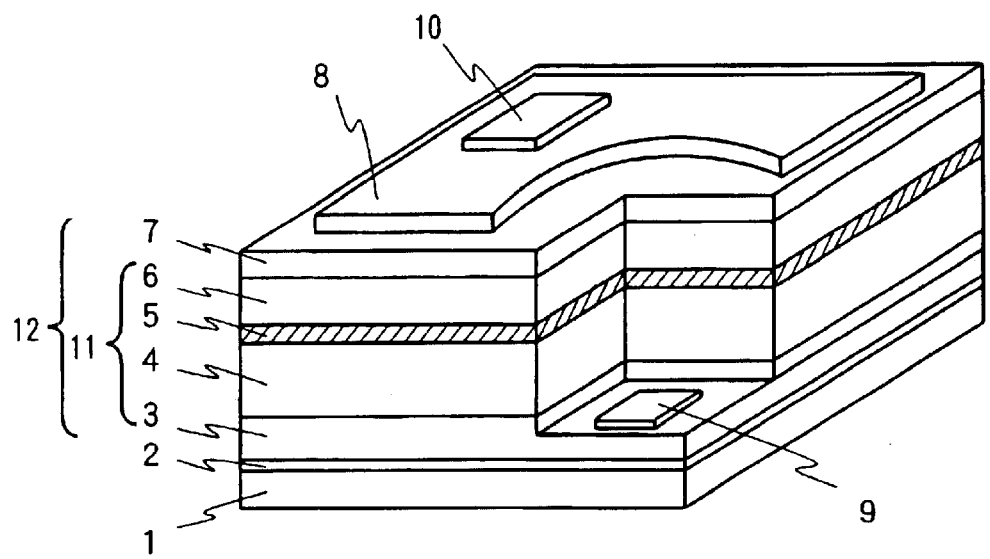
FIG. 1 is a perspective explanatory view of one embodiment according to a semiconductor light emitting device of the present invention.

A semiconductor light emitting device of the present invention has a structure such that an active layer 5 emitting light by electric current injection is sandwiched between an n-type cladding layer 4 and a p-type cladding layer 6 made of materials having a larger band gap than the active layer 5 as illustrated in FIG. 1 showing a perspective view of a LED chip as an embodiment thereof, and said active layer 5, is made of an oxide compound semiconductor containing at least one of Cd and Zn.

The active layer 5 is a layer for emitting light by recombination of carriers, and its band gap determines the wavelength of the emitted light. A material having a band gap that corresponds to the wavelength of the light to be emitted is used. For example, the active layer 5 is a single active layer formed to have a thickness of about 0.3 μm. The present invention is characterized in that the active layer 5 is made of an oxide compound semiconductor containing at least one of Cd and Zn, such as $Cd_xZn_{1-x}O$ ($0 \leq x < 1$, for example, x=0.2).

In other words, as previously described, in a conventional blue semiconductor light emitting device that emits light by sandwiching an active layer with cladding layers having a larger band gap than the active layer, a gallium nitride compound semiconductor is used, and an InGaN-based (which means that the crystal mixing ratio of In can be changed to give a desired band gap) compound semiconductor is used as its active layer. However, as previously described, the InGaN-based compound semiconductor has poor crystallinity and the crystal mixing ratio cannot be increased above a certain value, so that emission of light having a wavelength longer than a certain level is not possible. For this reason, the inventor of the present invention have repeatedly made eager studies and found out that the band gap can be made smaller than the inherent band gap of ZnO by forming a solid solution of ZnO and CdO to make a mixed crystal having a general formula $Cd_xZn_{1-x}O$ ($0 \leq x < 1$), thereby narrowing the band gap.

The band gap of this $Cd_xZn_{1-x}O$ has a smaller band gap according as the value of x increases. In order to allow emission of light having a previously described wavelength of about 400 to 430, the value of x is preferably about 0.02 to 0.4, more preferably about 0.06 to 0.3. However, in the case of emitting light in an ultraviolet region, even if the value of x is zero, the light can be emitted if the cladding layers are made of materials (MgZnO having a large crystal mixing ratio of Mg) having a larger band gap than the active layer. Here, the active layer 5 is preferably non-doped in order to avoid formation of a non-light emitting recombination center. However, the active layer 5 need not be a solid solution of Cd and Zn alone, but may be a solid solution further containing another element. Here, in order to obtain such a solid solution, a solid solution having a desired crystal mixing ratio can be obtained, for example, by introducing reaction gases of Cd, Zn, and O together with a carrier gas by the MOCVD method and adjusting their flow rates, as described later.

In the example shown in FIG. 1, the n-type and p-type cladding layers 4, 6 constituting the light emitting layer forming portion 11 together with the active layer 5 are made of $Mg_yZn_{1-y}O$ ($0 \leq y < 1$, for example, y=0.15). It is sufficient if the cladding layers 4, 6 have a larger band gap than the active layer 5 and produce an effect of enclosing the carriers effectively within the active layer 5, so that the cladding layers 4, 6 may be made of another Group III element nitride (gallium nitride compound semiconductor) or the like. However, use of $Mg_yZn_{1-y}O$ allows wet etching unlike the case of the gallium nitride compound semiconductor and, in the case of a later-mentioned LD or the like, it is preferable because it can be easily formed to have a mesa-type shape and an internal current constriction layer can be easily built therein. The n-type cladding layer 4 is formed to have a thickness, for example, of about 2 μm, and the p-type cladding layer 6 is formed to have a thickness, for example, of about 0.5 μm.

The substrate 1 to be used may be, for example, a sapphire substrate, and also may be a GaN substrate, a silicon substrate having SiC formed thereon, a single crystal SiC substrate, or the like including the case in which a gallium nitride compound semiconductor is used as a cladding layer. A buffer layer 2 for alleviating the lattice mismatch of compound semiconductor is formed, for example, of ZnO to a thickness of about 0.1 μm on the front surface of the substrate 1. This buffer layer 2 may be either non-doped or of other conductivity if the substrate 1 is an insulating substrate such as sapphire. However, in the case where the substrate 1 is an electrically conductive substrate and one of the electrodes is taken out from the rear surface of the substrate 1, the buffer layer is formed to have the same conductivity as the substrate. Further, an n-type contact layer 3 made of ZnO is formed to have a thickness of about 1 to 2 μm. A p-type contact layer 7 made of ZnO is formed to have a thickness of about 0.3 μm on the p-type cladding layer 6, and a transparent electrode 8 made of ITO or the like is formed on the front surface thereof. Also, by vacuum vapor deposition of Ti and Au or the like and the patterning or lift-off method, an n-side electrode pad 9 is formed on the n-type contact layer 3 which is exposed by removal of a portion of the laminated semiconductor layers 3 to 7 through etching. Further, a p-side electrode 10 made of Ni/Al/Au or the like is formed, for example, by the lift-off method on a portion of the transparent electrode 8.

In order to produce this LD, the substrate 1 is set, for example, in an MOCVD apparatus and, with the substrate temperature set at about 300 to 600° C., reaction gases and necessary dopant gases are introduced together with a carrier gas of $H_2$ for performing a gaseous phase reaction to grow the semiconductor layers. By successively changing the reaction gases or changing their flow rates, a semiconductor layer having a desired crystal mixing ratio can be laminated. Here, diethylzinc ($Zn(C_2H_5)_2$) for Zn, tetrahydrofuran ($C_4H_8O$) for O, cyclopentadiethylmagnesium ($Cp_2Mg$) for Mg, and diethylcadmium ($Cd(C_2H_5)_2$) for Cd are used as the reaction gases. As the dopant gases, ethyl chloride ($C_2H_5Cl$) is supplied as an n-type dopant gas of Cl, and plasma $N_2$ or the like is supplied as a p-type dopant gas. The aforesaid thickness of each semiconductor layer can be controlled by controlling the reaction time.

Then, the n-type contact layer 3 is exposed by etching a portion of the laminated semiconductor layers by the RIE method or the like. Thereafter, the rear surface of the substrate 1 is ground to have a thickness of about 100 μm, and an n-side electrode pad 9 is formed on the front surface of the exposed n-type contact layer 3, for example, by forming a film of Ti/Au or the like through vacuum vapor deposition or the like by means of the lift-off method or the like. A transparent electrode 8 is formed by forming an ITO film on the front surface of the p-type contact layer 7 through vacuum vapor deposition or the like. Further, a p-side electrode 10 is formed, for example, through vacuum vapor deposition of Ni/Al/Au by means of the lift-off method. Thereafter, chips are formed from the obtained wafer to produce the LED chip shown in FIG. 1.

Figure 2:
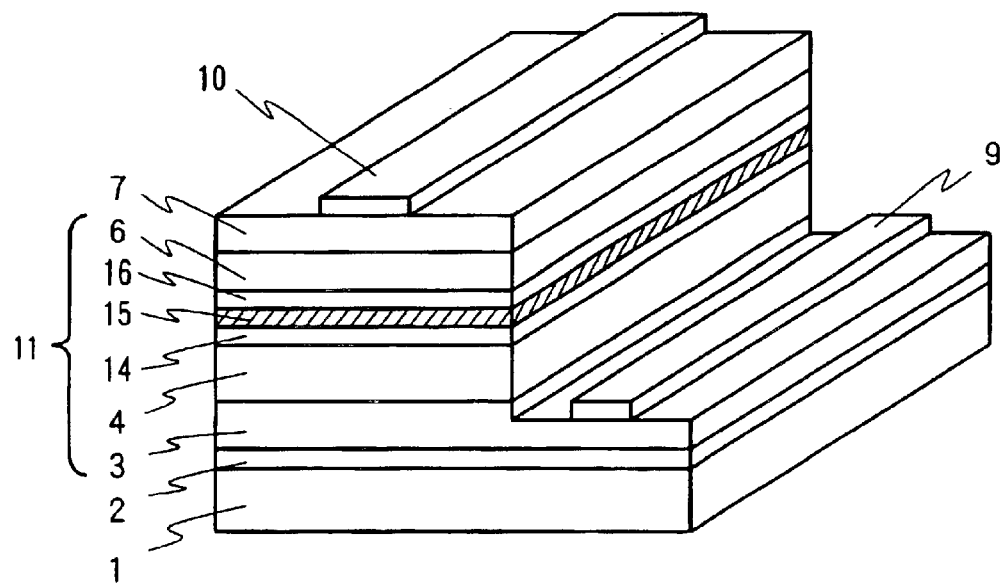
FIG. 2 is a perspective explanatory view of another embodiment according to the present invention.

FIG. 2 is a perspective explanatory view of an LD chip of electrode stripe type as another embodiment of a semiconductor light emitting device according to the present invention. Basically, this LD chip also has the same structure as the LED chip of FIG. 1. However, in order to make it into an LD, the main differences lie in that optical wave guide layers 14, 16 are disposed between the active layer 15 and the cladding layers in the light emitting layer forming portion 11, and also the active layer 15 is formed to have a multiple quantum well structure. Namely, if the active layer 15 is formed of a material having a larger refractive index than the cladding layers 4, 6, light can be enclosed within the active layer 15. However, if the active layer 15 is thin and cannot sufficiently enclose the light, the light leaks out from the active layer 15. Therefore, in order to form a part of an optical wave guide path, the optical wave guide layers 14, 16 having a refractive index of an intermediate value between the cladding layers 4, 6 and the active layer 15 are disposed. However, if the light can be enclosed sufficiently with the active layer, the optical wave guide layers 14, 16 need not be disposed.

For detailed description, a buffer layer 2 made of ZnO is formed to have a thickness of about 0.1 μm on a sapphire substrate 1, and an n-type contact layer 3 made of ZnO is disposed thereon to have a thickness of about 1 ‖m. An n-type cladding layer 4 made of $Mg_yZn_{1-y}O$ ($0 \leq y<1$, for example, y=0.15) is disposed thereon to have a thickness of about 2 μm, and then an n-type optical wave guide layer 14 made of n-type ZnO and constituting a part of an optical wave guide path is disposed to have a thickness of about 0.05 μm. The active layer 15 is formed to have a multiple quantum well structure in which barrier layers and well layers made, for example, of non-doped $Cd_{0.06}Zn_{0.94}O/Cd_{0.3}Zn_{0.7}O$ are alternately laminated at 50 Å and 40 Å, respectively, each for 2 to 5 layers. On the active layer 15, a p-type optical wave guide layer 16 made of ZnO and constituting a part of the optical wave guide path is disposed to have a thickness of about 0.05 μm, and a p-type cladding layer 6 made of $Mg_yZn_{1-y}O$ ($0 \leq y<1$, for example, y=0.15) is disposed to have a thickness of about 2 μm, and further, a p-type contact layer 7 made of ZnO is disposed to have a thickness of about 1 μm. Further, like the LED chip, an n-side electrode 9 made of Ti/Au or the like is disposed on the n-type contact layer 3 which is exposed by removal of a portion of the laminated semiconductor layers through etching. Furthermore, a p-side electrode 10 made, for example, of Ni/Al/Au or the like is disposed on the surface of the p-type contact layer 7. In the case of a semiconductor laser, the light is not radiated from an upper surface, but is radiated from an edge surface of the active layer 15, so that a transparent electrode is not needed on the upper surface. Therefore, in order to form an electric current passageway, a p-side electrode 10 formed in a stripe shape of a width of about 10 μm is formed directly on the p-type contact layer 7.

Even in the case of forming such an LD chip, since the laminated semiconductor layers are oxide semiconductor layers, the crystallinity of the active layer will be good, its etching is easy, and wet etching can be performed. Therefore, even if the substrate is made of sapphire or the like and cannot be easily cleaved, the radiating surface of light which is an edge surface of the active layer can be formed as a flat plane, so that a good resonator can be easily formed.

Figure 3:
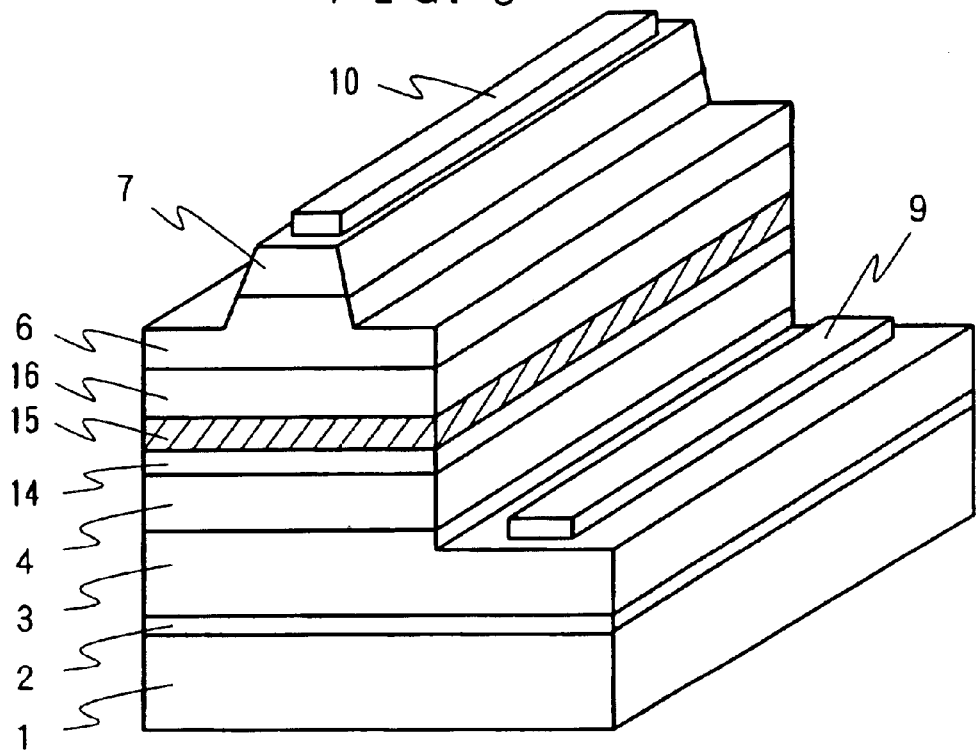
FIG. 3 is a perspective explanatory view of still another embodiment according to the present invention.

FIG. 3 is a perspective explanatory view of an LD chip as another embodiment of a semiconductor light emitting device according to the present invention. In this example, stripes are not made in the p-side electrode 10 alone, and it is formed to have a mesa stripe type structure in which up to a portion of the p-type cladding layer 6 is etched in a mesa-type shape. This mesa-type etching can be formed simply by forming a mask again simultaneously with the etching for exposing the n-type contact layer 3. The laminate structure of the other semiconductor layers is the same as the structure shown in FIG. 2, and its production method is similar.

Figure 4:
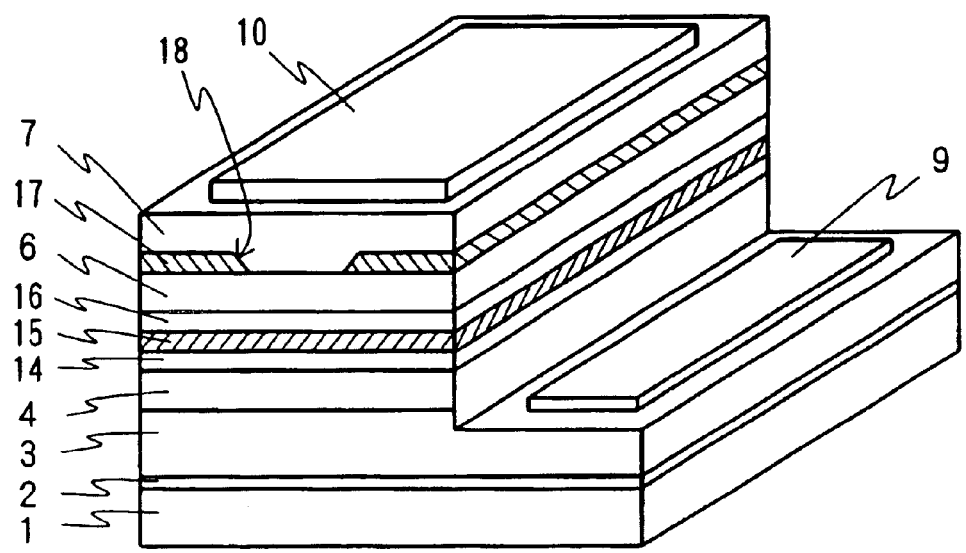
FIG. 4 is a perspective explanatory view of still another embodiment according to the present invention.

FIG. 4 is a similar explanatory view of an LD chip as still another embodiment of a semiconductor light emitting device according to the present invention. This example is an example of an SAS-type structure in which an n-type current restricting layer (inner current constriction layer) 17 is disposed on the p-type cladding layer 6 side. In order to produce an LD chip of this structure, a buffer layer 2, an n-type contact layer 3, an n-type optical wave guide layer 14, an active layer 15, a p-type optical wave guide layer 16, and a p-type cladding layer 6 are successively laminated on a substrate 1 as previously described, and then an electric current restricting layer 17 made, for example, of n-type $Mg_{0.2}Zn_{0.8}O$ is grown to have a thickness of about 0.4 μm. Then, after the obtained wafer is take out from the crystal growth apparatus, a resist film is formed on the front surface and patterned in stripes, and the electric current restricting layer 17 is etched in stripes with the use of an alkali solution such as NaOH to form a stripe groove 18. Thereafter, the wafer is returned into the MOCVD apparatus again, and a p-type contact layer 7 made of p-type ZnO is grown in the same manner as in the previous example. Then, an n-side electrode 9 and a p-side electrode 10 are formed in the same manner as in each of the previous examples, and the wafer is made into chips to produce an LD chip having a structure shown in FIG. 4. Here, the p-type cladding layer 6 may be made to have a two-step structure and the electric current restricting layer 17 may be built therebetween.

Since a conventional blue laminate structure using a gallium nitride compound semiconductor is stable against chemicals, it is not possible to form a stripe groove by etching the semiconductor layers such as in this example, so that the electric current passageway cannot be concentrated up to the vicinity of the active layer. However, according to the present invention, an electric current restricting layer (internal current constriction layer) 17 having a stripe groove formed therein can be built in a semiconductor layer.

Figure 5:
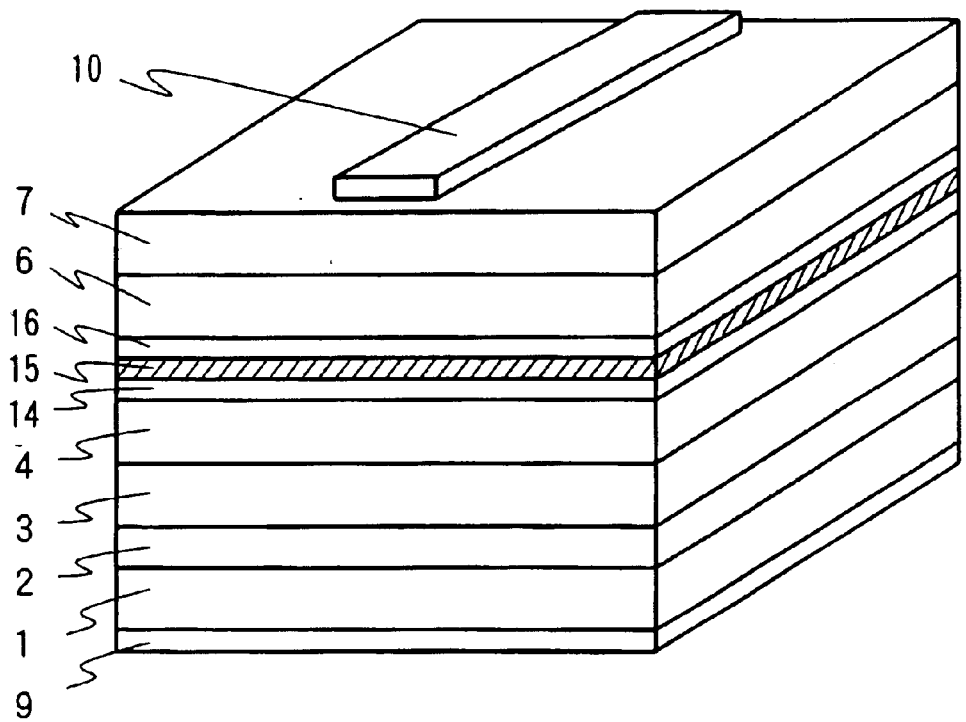
FIG. 5 is a perspective explanatory view of still another embodiment according to the present invention.

FIG. 5 is a similar explanatory view of an LD chip as another embodiment of a semiconductor light emitting device according to the present invention. In this example, the substrate 1 is made of an electrically conductive substrate instead of sapphire and, as a result, the n-side electrode 9 is disposed on the rear surface of the substrate 1. In this example, a silicon (Si) substrate 1 is used as the substrate; a cubic SiC layer 2 is formed on the front surface of the Si substrate 1; and the previously mentioned semiconductor layers are laminated on the front surface thereof directly or through the intermediary of a buffer layer which is not illustrated. The SiC layer 2 is formed, for example, by forming a SiC film, which is not illustrated, to a thickness of about 100 Å through a carbonizing process by holding the Si substrate 1 at about 1020° C. for about 60 minutes in an atmosphere of acetylene ($C_2H_2$) and hydrogen, and then growing the SiC film 2 to a thickness of about 2 μm by the thermal CVD method in the same furnace by introducing dichlorosilane ($SiH_2Cl_2$) as a material gas for Si and $C_2H_2$ as a material gas for carbon. The subsequent lamination of each semiconductor layer is carried out in the same manner as in the previously described examples. This example is directed to a structure in which the semiconductor layers are not etched. However, the lamination of each semiconductor layer can be grown at a low temperature of about 600° C. or less instead of growing it at a high temperature as in the case of a gallium nitride compound semiconductor. Therefore, the load imposed on the growth apparatus is extremely light, the maintenance of the apparatus is easy, and the growth of the semiconductor layers can be carried out easily. Furthermore, since the crystallinity of the active layer is excellent, an LD and an LED having a high light-emission efficiency can be obtained.

For simplicity, the example shown in FIG. 5 is made to have an electrode stripe structure. However, it may have the structure of each of the previously described examples such as a structure in which the electric current restricting layer is buried. By using such an electrically conductive substrate, both of the p-side and n-side electrodes can be taken out from the upper and lower surfaces of the chip, thereby achieving an element that can be extremely easily handled with for bonding the chip or the like. By using a SiC crystal substrate, a GaN substrate, or the like as such an electrically conductive substrate instead, an oxide semiconductor can be laminated in the same manner as previously described.

In each of the previously described example, an example of a multiple quantum well structure has been shown as the active layer of the LD. However, the structure is not limited to the example shown above, and it can be formed to have a single quantum well structure or a bulk structure. Furthermore, it goes without saying that, if an optical wave guide path can be formed sufficiently with the active layer, the optical wave guide layer need not be formed separately. This applies to each of the following examples.

According to the present invention, a method of narrowing the band gap of ZnO has been obtained, so that it is possible to obtain a band gap that emits light from ultraviolet (ZnO can be used as the active layer in the ultraviolet region) to a wavelength of 400 to 430 nm required in the light source for a highly fine DVD, by using a zn0-based oxide semiconductor, and it can be advantageously used in a semiconductor light emitting device of a short wavelength.

Further, since the semiconductor light emitting device according to the above-described examples has a structure in which the active layer is sandwiched between the cladding layers, and uses an oxide compound semiconductor containing Cd and Zn in producing the emission of blue light, the crystallinity does not decrease as in the case of an InGaN-based compound semiconductor, so that an active layer emitting light near 400 to 430 nm and having an extremely good crystallinity is obtained. As a result, the light-emission efficiency is improved to produce a blue semiconductor light emitting device having a high brightness.

Furthermore, if an oxide compound semiconductor containing Zn or Mg and Zn is used as the cladding layer, the cladding layer will have a larger band gap than the active layer, so that the light emitting device can be constructed, and also it can be extremely easily handled with because the wet-etching process that cannot be easily carried out in the case of a gallium nitride compound semiconductor can be carried out, and semiconductor layers can be grown at a low temperature of 600° C. or less, whereby a blue semiconductor light emitting device can be easily produced. In semiconductor lasers, an electric current injection region must be defined. However, since the burying or mesa-etching of an electric current restricting layer can be carried out easily, it has a great advantage.

Furthermore, since the aforesaid oxide semiconductor layer can be grown on SiC disposed on a Si substrate or on a SiC substrate, a vertical-type chip can be made in which the electrodes are taken out from the upper and lower surfaces of the chip. As a result, it is sufficient to perform wire-bonding on only one electrode, thereby greatly improving the handling property.

According to the present invention, blue light emission can be made by using a ZnO-based oxide semiconductor layer which is different from a conventional gallium nitride compound semiconductor, thereby manufacturing a semiconductor light emitting device having a high light-emission efficiency by using a semiconductor layer having a good crystallinity.

Furthermore, by using a ZnO-based oxide semiconductor, the semiconductor layers can be laminated at an extremely low temperature as compared with the gallium nitride compound semiconductor, whereby the load imposed on the growth apparatus will be extremely light, and wet etching can be carried out to enable lamination of stable semiconductor layers that can be easily handled with.

Figure 6:
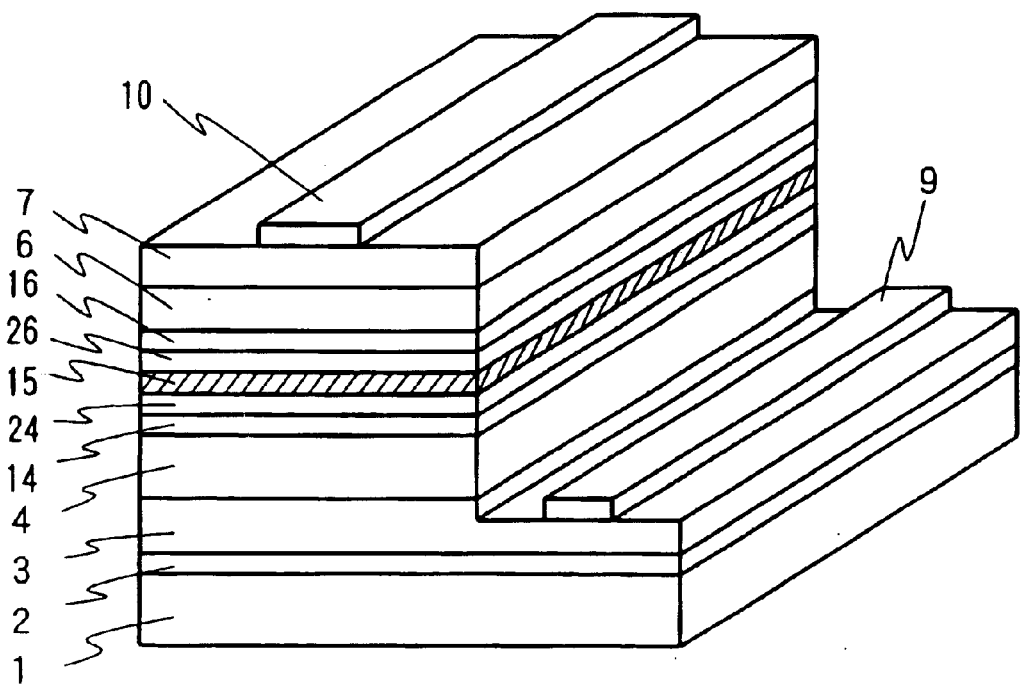
FIG. 6 is a perspective explanatory view of still another embodiment according to the present invention.

FIG. 6 shows a perspective view of an LD chip as still another embodiment. In this example, the active layer 15 is made of a bulk layer of $Cd_xZn_{1-x}O$ ($0 \leq x < 1$) or a quantum well structure formed by composition modulation of $Cd_xZn_{1-x}O$ ($0 \leq x < 1$), and stress-alleviating layers 24, 26 made, for example, of $Mg_wZn_{1-w}O$ ($0 \leq w < 1$) and made of a material of a composition having approximately the same lattice constant as the material of the active layer at its contact portion are disposed on the n-type cladding layer 4 side and the p-type cladding layer 6 side of the active layer 15 so as to be in contact with the active layer 15.

Figure 7:
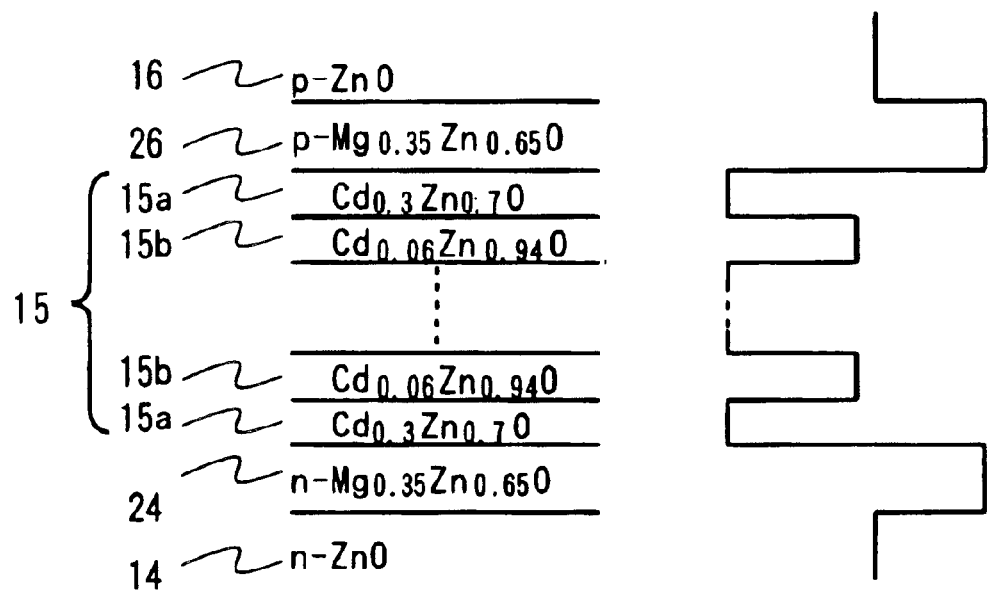
FIG. 7 is an enlarged view for explaining a cross-sectional structure near the active layer of FIG. 6, and a view showing the relationship of the band gap of each layer.

As previously mentioned, the active layer 15 is a layer that emits light by recombination of carriers, and the wavelength of the emitted light is determined by its band gap, so that a material having a band gap corresponding to the wavelength of the light to be emitted is used. In this example, $Cd_xZn_{1-x}O$ ($0 \leq x < 1$) obtained by narrowing the band gap of ZnO with the use of Cd is used. For example, the active layer 15 is formed to have a multiple quantum well structure in which barrier layers and well layers made, for example, of non-doped $Cd_{0.06}Zn_{0.94}O/Cd_{0.3}Zn_{0.7}O$ are alternately laminated at 50 Å and 40 Å, respectively, each for 2 to 5 layers. In this structure, well layers 15a made of $Cd_{0.3}Zn_{0.7}O$ and barrier layers 15b made of $Cd_{0.06}Zn_{0.94}O$ are alternately laminated, and the last layer ends with a well layer 15a, as illustrated, for example, in FIG. 7 showing an enlarged cross-sectional view of the vicinity of the active layer 15 and a state of change in its band gap as an example. In this example, stress-alleviating layers 24, 26 made of $Mg_{0.35}Zn_{0.65}O$ having approximately the same lattice constant as $Cd_{0.3}Zn_{0.7}O$ are disposed on both sides of the active layer 15.

The n-type and p-type stress-alleviating layers 24, 26 are made of $Mg_wZn_{1-w}O$ ($0 \leq w < 1$) or a Group III nitride compound semiconductor having approximately the same lattice constant as the composition on the outermost side of the active layer 15 and having a larger band gap than the active layer, and each stress-alleviating layer is -formed to have a thickness of about 0.02 µm. In other words, as previously described, when mixed crystals of ZnO with Cd or Mg are formed, the lattice constant will each be larger than ZnO, as shown in FIG. 8, and the same tendency is found both in the CdZnO system and the MgZnO system. For this reason, the wavelength of the light to be emitted determines the value of x in $Cd_xZn_{1-x}O$ of the active layer and, in accordance with its lattice constant, the value of w in $Mg_wZn_{1-w}O$ is determined to define the composition of the stress-alleviating layers 24, 26. However, a Group III nitride compound semiconductor having a composition with approximately the same lattice constant can be used.

The stress-alleviating layers 24, 26 serve to prevent the stress, which comes from the cladding layers or the like having a different lattice constant from the active layer 15, from reaching the active layer 15, and may have a thickness capable of absorbing the stress such as, for example, about 0.005 to 0.1 µm, more preferably 0.01 to 0.05 µm. If the thickness is too large, a problem of stress generation in the cladding layers arises, whereas if the thickness is too small, a stress is imposed on the active layer 15.

In the previously described example, the active layer 15 has a multiple quantum well structure, and its outermost layer is made of a well layer. However, in some cases, the active layer ends with a barrier layer. In such a case, the stress-alleviating layers 24, 26 are formed to have a composition corresponding to the lattice constant of the barrier layer. Here, if the barrier layer becomes an optical wave guide layer as it is, the composition is made to correspond to the lattice constant of the well layer. Further, if the active layer is made of a bulk layer formed with a single layer having the same composition, the stress-alleviating layers 24, 26 are formed to meet to the lattice constant corresponding to the composition of the active layer 15. Furthermore, in the example shown in FIG. 6, the n-type and p-type stress-alleviating layers 24, 26 are disposed on both sides of the active layer 15. However, the effect of a stress-alleviating layer is large even if it is disposed on only one side of the active layer 15 instead of being disposed on both sides thereof.

The other constituents such as the substrate, the cladding layers, and the optical wave guide layers, and their production methods are the same as in the previously described example shown in FIG. 2, so that their explanation will be omitted by using the same reference numbers.

By disposing the stress-alleviating layers, while narrowing the band gap by forming mixed crystals of ZnO with Cd and allowing emission of blue light, a semiconductor layer having a larger band gap in correspondence with the lattice constant of the active layer is obtained by forming mixed crystals of ZnO with Mg, so that the semiconductor layer (stress-alleviating layer) having the same lattice constant as the active layer and having a larger band gap can be laminated to be in direct contact with the active layer. Therefore, the stress accompanying the lattice mismatch of the cladding layers and the like is absorbed by the stress-alleviating layer, so that a stress accompanying the lattice mismatch is not imposed directly on the active layer, thereby preventing generation of a piezoelectric field. As a result, the threshold voltage can be reduced, and the element can be operated at a low threshold voltage even if it is not doped with an impurity. If a light emitting device can be formed without being doped with an impurity, it is possible to avoid generation of a non-light emitting recombination center. This restrains the generation of heat in the element and produces a tremendous effect on the improvement of life, which raises the largest problem in semiconductor lasers, particularly in the improvement of life at the time of producing a high output.

The previously described example, is directed to an LD. However, even in the case of an LED, if it is a high-output LED in which the active layer is sandwiched between cladding layers, the threshold voltage can be lowered in the same manner by interposing the stress-alleviating layers, thereby manufacturing a LED of high output with low-voltage driving.

According to the invention in which the stress-alleviating layer is disposed, the stress accompanying the lattice mismatch is not imposed on the active layer in a semiconductor light emitting device having a double heterojunction structure in which the active layer is sandwiched between the cladding layers, so that the threshold voltage can be lowered without doping the active layer. As a result, even in the case of constructing a semiconductor laser of high output in particular, the heat generation can be restrained to achieve a long life, thereby greatly improving the reliability of a blue compound semiconductor light emitting device.

Figure 9:
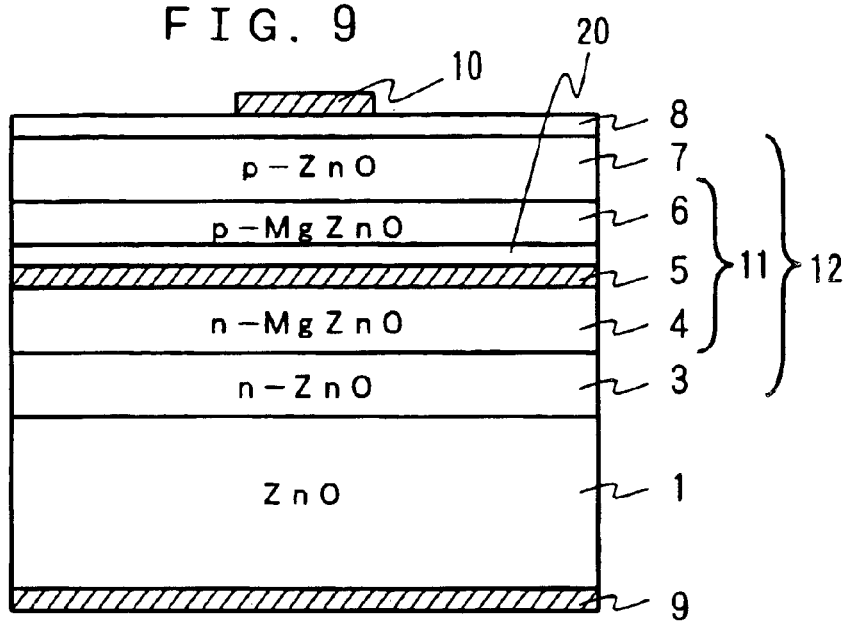
FIG. 9 is a cross-sectional explanatory view of a LED chip which is still another embodiment according to the present invention.

FIG. 9 is a cross-sectional view of a LED chip as still another embodiment. This example solves the problem that, in growing a cladding layer or the like containing ZnO or Mg at a high temperature after growing the active layer, Cd in the active layer is evaporated and escapes., due to the temperature rise, before the semiconductor layer such as ZnO is grown.

Figure 11:
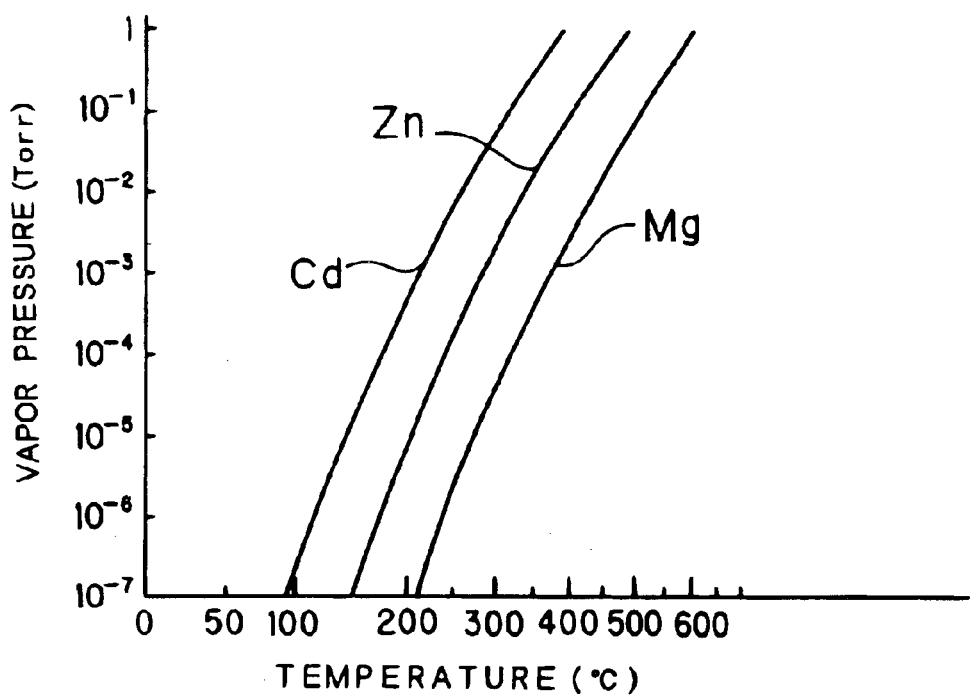
FIG. 11 shows curves indicating the vapor pressure of Cd, Zn, and Mg against the temperature.

In other words, referring to the vapor pressure curves of. Cd, Zn, and Mg shown in FIG. 11, the vapor pressures of these metals at the same temperature satisfy the relationship: Cd>Zn>Mg. This means that the temperatures for obtaining the same vapor pressure satisfy Mg>Zn>Cd. For example, in growth by the ordinary MBE method, the evaporation temperature of the metal as a material is generally adjusted so that the vapor pressure thereof will be about $10^{-3}$ to $10^{-4}$ Torr. In such a case, the evaporation temperatures of Cd, Zn, and Mg will be adjusted to be about 200 to 250° C., 250 to 300° C., and 400 to 450° C., respectively. In this case, in view of the effect of migration (movement of different kinds of atoms contacting with each other on the substrate surface to fill the crystal defects of each other) after the evaporated atoms have reached the substrate, the substrate temperature also is generally adjusted in proportion to the evaporation temperature. In other words, in trying to grow an active layer made, for example, of $Cd_xZn_{1-x}O$ and then to grow an optical wave guide layer or a cladding layer made of ZnO or $Mg_yZn_{1-y}O$ by the MBE method or the like, the growth temperature thereof must be raised to be higher than the temperature of growing the active layer.

For this reason, the band gap energy does not lower and it is not possible to increase the light-emission wavelength and, in trying to grow the active layer at a large crystal mixing ratio of Cd, only the evaporated amount of Cd in a later step will be large, and the light-emission wavelength cannot be increased and, on the contrary, the site from which Cd has escaped will be a lattice defect, thereby decreasing the light-emission characteristics. The example shown in FIG. 9 gives a ZnO-based compound semiconductor light emitting device having improved crystallinity and excellent light-emission characteristics with restrained evaporation of Cd and being capable of emitting light from blue to green, and a method for manufacturing the same.

The inventors of the present invention have repeatedly made eager studies in order to narrow the band gap energy and to allow emission of light from blue to green in a ZnO-based compound semiconductor light emitting device having an active layer made of $Cd_xZn_{1-x}O$, and have found out that, by disposing an evaporation-preventing layer made of ZnO on the surface of the active layer at a low temperature of the same degree as the growth temperature of the active layer so as to prevent evaporation of Cd in the active layer made of mixed crystal $Cd_xZn_{1-x}O$ in the subsequent step of growing ZnO or MgZnO, the crystal mixing ratio of Cd can be sufficiently increased to enable emission of blue light having a wavelength of about 410 nm with Cd contained at about 30% (x=0.3), and also the crystallinity of the active layer will be improved by prevention of the evaporation of Cd thereby to produce a znO-based compound semiconductor light emitting device having excellent light-emission characteristics.

The ZnO-based compound semiconductor light emitting device according to this example includes a light emitting layer forming portion 11 in which an active layer 5 made of $Cd_xZn_{1-x}O$ (0≦x<1) is sandwiched between a lower cladding layer 4 and an upper cladding layer 6 made of ZnO-based compound semiconductor, as illustrated in FIG. 9 showing a cross-sectional explanatory view of a LED chip. Further, it is characterized in that a low temperature ZnO layer (Cd evaporation preventing layer) 20 is disposed at least on the active layer 5 side between the active layer 5 and the upper cladding layer 6.

The low temperature ZnO layer 20 is formed as follows. After the active layer 5 containing Cd is grown, the Cd source is closed to grow ZnO successively without raising the temperature. In other words, since the vapor pressure of Cd is high, the active layer 5 containing Cd is grown at a low temperature of about 200 to 250° C. as described before, and $Mg_yZn_{1-y}O$ grown thereon as the cladding layer 6 is usually grown at a high temperature of about 400 to 450° C. because the vapor pressure of Mg is low. However, as described before, the inventors of the present invention have found out that, when the active layer 5 is grown and then the temperature of the substrate is raised to grow a next semiconductor layer, Cd of the active layer 5 is evaporated to produce crystal defects, and also the crystal mixing ratio of Cd lowers. The low temperature ZnO layer 20 is disposed in order to prevent this evaporation of Cd.

The inventors of the present invention have confirmed that, since the low temperature ZnO layer 20 serves to prevent evaporation of Cd, it is sufficient if the low temperature ZnO layer 20 is disposed to cover the surface of the active layer 20, and the evaporation of Cd can be sufficiently prevented if it is disposed to have a thickness of about 100 to 1000 Å. Further, in order to prevent the evaporation of Cd, the growth temperature is preferably as low as possible. However, if the growth temperature is too low, the growth of ZnO itself does not proceed, so that the evaporation of Cd is liable to occur. Therefore, the growth temperature is about 200 to 300° C., and more preferably about the growth temperature of the active layer 5, which temperature has been found to be the most effective.

In the example shown in FIG. 9, the light emitting layer forming portion 11 has a structure such that an active layer 5 made of $Cd_xZn_{1-x}O$ (0≦x<1, for example, x=0.3) is sandwiched between lower (n-type) and upper (p-type) cladding layers 4, 6 made of $Mg_yZn_{1-y}O$ (0≦y<1, for example, y=0.15). In this example, a low temperature ZnO layer (evaporation preventing layer) 20 is disposed on the upper surface of the active layer 5, as previously described. This low temperature ZnO layer 20 also has a larger band gap energy than the active layer 5, and also produces an effect of enclosing the carriers. However, the low temperature ZnO layer 20 has an extremely small thickness of 100 to 1000 Å as described before, so that the upper cladding layer 6 has an effect of enclosing the carriers with little influence from the low temperature ZnO layer 20.

The active layer 5 is a layer that emits light by recombination of carriers, and its band gap energy determines the wavelength of the emitted light, so that a material having a band gap energy corresponding to the wavelength of the light to be emitted is used to form, for example, a single active layer having a thickness of about 0.1 µm. The band gap energy of $Cd_xZn_{1-x}O$ decreases according as the value of x increases. For example, in order to emit light having a wavelength of about 430 nm, the value of x is preferably about 0.32. In the prior art, it was not possible to obtain $Cd_xZn_{1-x}O$ having such a large crystal mixing ratio of Cd.

The present invention prevents evaporation of Cd to produce $Cd_xZn_{1-x}O$ in which the crystal mixing ratio of Cd is about 32%. The active layer 5 is preferably non-doped in order to avoid formation of a non-light emitting recombination center.

In this example, the substrate 1 is an n-type ZnO substrate. However, it is not limited to this alone, and may be one of the various previously-described substrates such as sapphire, GaN, GaP, and SiC. The n-type and p-type cladding layers 4, 6 and others may be as described in the previous examples, so that their explanation will be omitted by referring to like parts with like reference numbers.

As previously described, in this example, a low temperature ZnO layer is disposed on the $Cd_xZn_{1-x}O$ active layer, so that the evaporation of Cd in the active layer is inhibited even if the subsequent cladding layers made of $Mg_yZn_{1-y}O$ are grown at a high temperature of about 400° C. or more. Further, while the low temperature ZnO layer is grown, Cd does not evaporate so much because the growth temperature thereof is a low temperature of the same degree as the temperature for growing the active layer. Therefore, Cd introduced into mixed crystals in growing the active layer can be maintained almost as it is. As a result, crystal defects caused by evaporation of Cd from the active layer or the decrease in the crystal mixing ratio caused by the evaporation of Cd do not occur, whereby an active layer having a desired band gap energy and being excellent in crystallinity is obtained to produce a semiconductor light emitting device from blue to slightly green with excellent light-emission efficiency.

Next, the method of manufacturing the LED will be described. For example, a substrate 1 made of ZnO or the like is set in an MBE (molecular beam epitaxy) apparatus; the temperature of the substrate 1 is set at about 300 to 350° C.; the substrate 1 is placed under a condition of radiating plasma oxygen; the shutter of a source (cell) of Zn is opened to radiate Zn; and also the shutter of an n-type dopant Al is opened thereby to grow an n-type contact layer 3 made of n-type ZnO to a thickness of about 0.5 μm. Then, the shutter of a source (cell) of Mg is also opened, and the temperature of the substrate 1 is set at about 400 to 450° C. to grow an n-type lower cladding layer 4 made of $Mg_{0.15}Zn_{0.85}O$ to a thickness of about 1 μm.

Next, in order to grow an active layer 5, the substrate temperature is lowered to about 200 to 250° C., and the cell for Mg and the cell of the dopant Al are closed, and the shutter of a cell which is the source metal of Cd is opened to radiate Cd thereby to grow $Cd_{0.32}Zn_{0.68}O$ to a thickness of about 0.1 μm. Then, the shutter of the cell of Cd is closed, and an evaporation preventing layer 20 made of ZnO is grown to a thickness of about 0.05 μm at the same temperature.

Further, the substrate temperature is set at about 400 to 450° C., and a p-type cladding layer 6 and a p-type contact layer 7 are grown in the same manner to thicknesses of about 1 μm and about 0.5 μm, respectively, thereby to grow a semiconductor laminate section 12. Here, if the layers were to have p-type, they were formed by the later-mentioned simultaneous doping process using plasma-excited $N_2$ and Al.

Thereafter, the epitaxially grown wafer is taken out from the MBE apparatus, and put into a sputtering apparatus to form a transparent electrically conductive film ITO to a thickness of about 0.2 μm as a transparent electrode 8. Then, the rear surface of the substrate 1 is ground to a thickness of about 100 μm in the same manner as in the previously described example; and an n-side electrode 9 made of Ti/Al or the like is formed over the entire rear surface of the substrate 1, and a p-side electrode 10 made of Ni/Al or the like is formed on the transparent electrode 8, each to a thickness of about 0.2 μm by vacuum vapor deposition using the lift-off method, for example. Thereafter, the wafer is made into chips to produce the LED chip shown in FIG. 9.

If a ZnO-based compound semiconductor layer is grown by such a method, evaporation of Cd having a large vapor pressure can be prevented, whereby the band gap energy of the active layer can be sufficiently lowered to allow emission of light having a long wavelength, and also the crystallinity of the active layer can be improved to produce a ZnO-based compound semiconductor light emitting device having excellent light-emission characteristics with a color from blue to slightly green.

The previously described example was an example of an LED. However, the same applies in the case of an LD as well. In this case, the light emitting layer forming portion 11 is a little different. For example, the active layer 15 is preferably formed to have a multiple quantum well structure in which barrier layers and well layers made of non-doped $Cd_{0.03}Zn_{0.97}O/Cd_{0.2}Zn_{0.8}O$ are alternately laminated at 50 Å and 40 Å, respectively, each for 2 to 5 layers. Further, if the active layer 15 is thin and cannot sufficiently enclose the light within the active layer 15, the optical wave guide layers 14, 16 made, for example, of ZnO are disposed on both sides of the active layer 15. However, a Cd-evaporation-preventing layer 20 made of low temperature ZnO is disposed between the active layer 15 and the optical wave guide layers 14, 16 in this case as well. Further, the transparent electrode made of ITO is unnecessary, and the semiconductor laminate section is formed to have a structure in which the electric current injection region is defined by directly forming a p-side electrode 10 in patterned stripes, by etching an upper portion of the semiconductor layer in a mesa-type shape, or by burying an electric current constriction layer. An example of a structure in which the electric current constriction layer is formed will be shown in FIG. 10.

Figure 10:
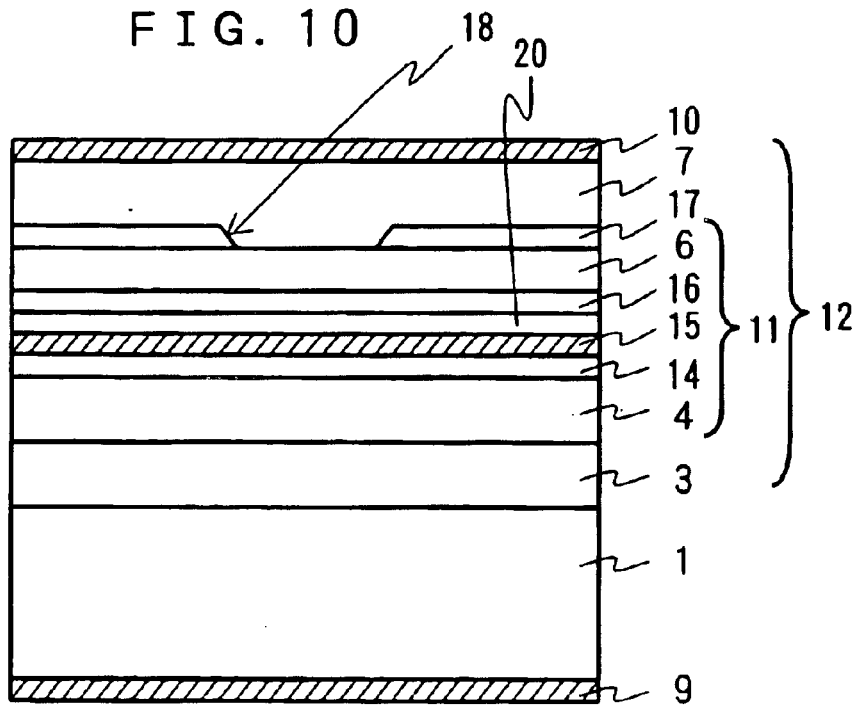
FIG. 10 is a cross-sectional explanatory view of a LED chip which is still another embodiment according to the present invention.

In order to produce an LD chip having an SAS-type structure shown in FIG. 10, an n-type contact layer 3, an n-type cladding layer 4, an n-type optical wave guide layer 14 made of n-type ZnO and having a thickness of about 0.05 μm are successively grown on a substrate 1 at the aforesaid high temperature in the same manner as described before. Subsequently, the active layer 15 of the aforesaid multiple quantum well structure is grown at a temperature of about 200 to 250° C., and then an evaporation preventing layer 20, which is a low temperature ZnO layer, is grown to a thickness of about 0.05 μm at the same temperature. After a p-type optical wave guide layer 16 made of p-type ZnO and having a thickness of about 0.05 μm and a p-type cladding layer 6 are successively laminated thereon at the aforesaid high temperature, an electric current constriction layer 17 made, for example, of n-type $Mg_{0.2}Zn_{0.8}O$ is grown to a thickness of about 0.4 μm. Then, the wafer is taken out from the crystal growth apparatus; a resist film is disposed on the front surface thereof and patterned into stripes; and the electric current constriction layer 17 is etched into stripes with the use of an alkali solution such as NaOH to form a stripe groove 18. Thereafter, the wafer is returned into the MBE apparatus to grow a p-type contact layer 7 made of p-type ZnO in the same manner as in the previously described example. Then, a p-side electrode 10 and an n-side electrode 9 are formed in the same manner as in each of the previous examples and made into chips to produce an LD chip having a structure shown in FIG. 10. Here, the two cladding layers 4, 6, the optical wave guide layers 14, 16, and the active layer 15 constitute the light emitting layer forming portion 11.

According to this example, evaporation of Cd that reduces the band gap energy of the ZnO-based compound semiconductor layer used particularly in a blue semiconductor light emitting device can be restrained to sufficiently increase the crystal mixing ratio and to grow a CdZnO-based active layer having an excellent crystallinity, whereby a ZnO-based compound semiconductor light emitting device that emits light from blue to green can be obtained with high light-emission efficiency. As a result, light-emission characteristics such as light-emission efficiency particularly of a currently desired semiconductor light emitting device such as a blue LED or LD can be improved with a new material.

Figure 12:
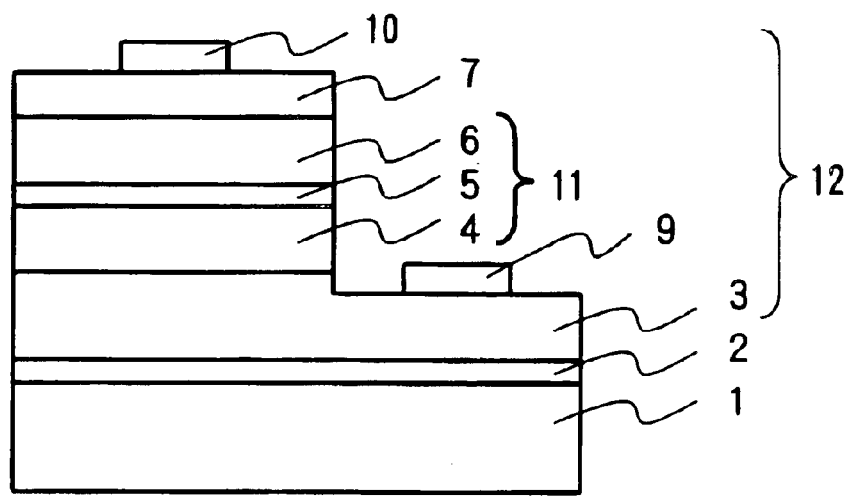
FIG. 12 is a cross-sectional explanatory view of still another embodiment according to the present invention.
Figure 13:
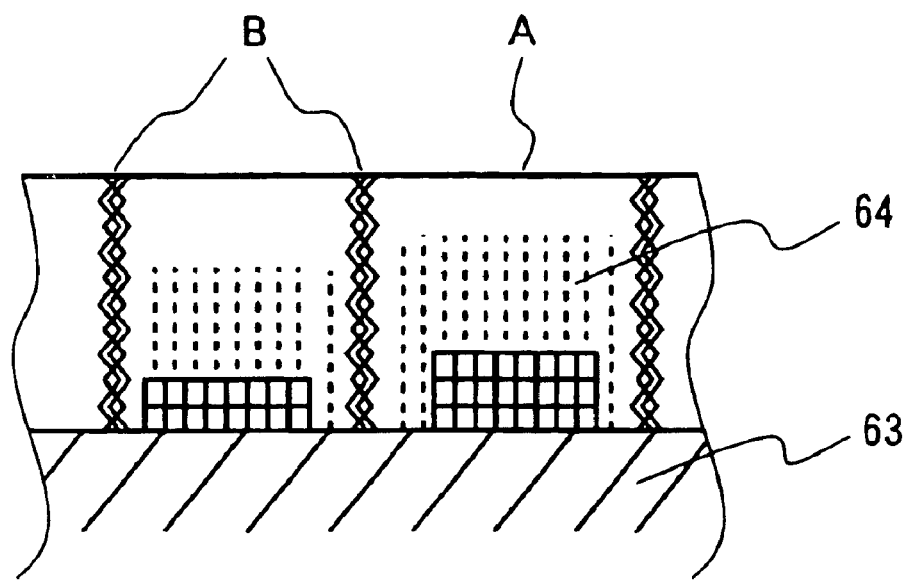
FIG. 13 is a view for explaining the problems occurring when a ZnO-based compound semiconductor layer grows.
Figure 13:
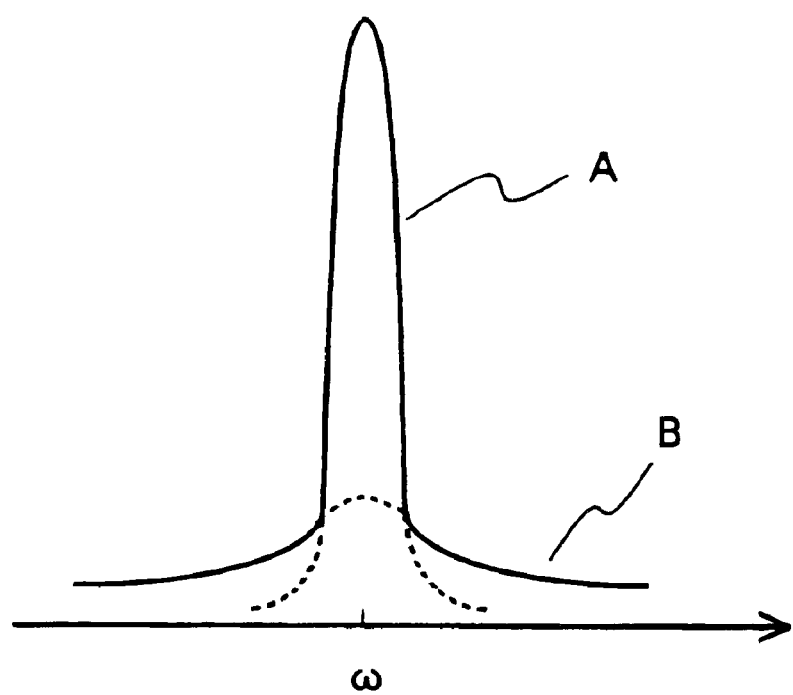

FIG. 12 shows an example in which a ZnO-based oxide semiconductor layer is grown with good crystallinity to improve the light-emission characteristics. Namely, unlike the GaN-based compound semiconductor, the ZnO-based compound semiconductor grows smoothly in the longitudinal direction but grows little in the lateral direction. In other words, although growth in the c-axis direction is rapid, growth in the a-axis direction is slow as compared with this. Therefore, as schematically shown in FIG. 13($a$) illustrating the state of crystal growth, a crystal layer 64 is formed by rapid growth to form a layer A having an extremely good crystallinity at a site where a nucleus that starts the initial crystal growth is present on a substrate 63, whereas the growth is slow at a site B and a crystal grain boundary is formed to give an extremely poor crystallinity where the nucleus is absent on the surface of the substrate 63. On examination of this state by X-ray diffraction, the site B where the crystal grain boundary is present has a spectrum with a wide foot relative to the rotation angle ω of the substrate 63, as shown in FIG. 13($b$). Thus, as compared with GaN-based compound semiconductor, it is even more difficult to obtain good crystallinity of ZnO-based compound semiconductor, because not only the lattice mismatch but also the crystal grain boundary are liable to be generated.

The inventors of the present invention have repeatedly made eager studies in order to grow the ZnO-based compound semiconductor with good crystallinity and found out that, at a site where the crystal grain boundary is generated as previously described, the initial nucleus is absent on the substrate and the crystal growth is slow on the substrate surface with no lateral growth, so that the crystal growth thereon does not proceed smoothly. By further repeated studies, the inventors have found out that, by intervening an $Al_2O_3$ film on a sapphire substrate, ZnO-based compound semiconductor that grows thereon grows with good crystallinity.

As shown in FIG. 12 illustrating a cross-sectional explanatory view of a LED chip, a semiconductor light emitting device according to this example includes a buffer layer 2 made of $Al_2O_3$ on a sapphire substrate 1. Further, on the buffer layer 2, a light emitting layer forming portion 11 is disposed which is made of ZnO-based compound semiconductor and which includes at least an n-type layer (n-type cladding layer 4) and a p-type layer (p-type cladding layer 6) to form a light emitting layer (active layer 5).

The buffer layer 2 is made of an $Al_2O_3$ film formed to a thickness of about 500 to 2000 Å, preferably about 1000 Å, by a sputtering apparatus, vacuum vapor deposition, or the MBE method. Use of an MBE apparatus is especially preferable because it can be grown successively with the use of the same apparatus as the apparatus for crystal growth of a subsequent ZnO-based compound semiconductor layer. Preferably, the $Al_2O_3$ film is formed first at a low temperature of about 100 to 200° C., and then an annealing treatment is carried out at a high temperature of about 800° C. for about 20 to 40 minutes, for example, by an MBE apparatus for crystallization, because then a uniform $Al_2O_3$ film can be formed and the initial nucleus can be easily generated irrespective of the surface state of the sapphire substrate 1. This buffer layer 2 may be non-doped or of other conductivity as long as the substrate 1 is an insulating substrate such as a sapphire substrate.

The construction of the light emitting layer forming portion 11, the electrodes, and others is the same as in the LED chip of each of the previously described examples and is not illustrated in the drawings. However, as previously described, a transparent electrode such as made of ITO may be disposed on the surface. The same parts as in the previously described examples will be denoted with the same reference numerals and their explanation will be omitted.

In order to produce this LED, a sapphire substrate 1 is set, for example, in a sputtering apparatus, and a sputtering process is carried out with the substrate temperature of about 100 to 200° C. to form an $Al_2O_3$ film of about 1000 Å. The $Al_2O_3$ film may be formed by introducing a plasma-excited oxygen gas while sputtering Al from an Al cell with the use of an MBE apparatus. Thereafter, the sapphire substrate 1 is put, for example, into an MBE apparatus, and the substrate temperature is raised to about 800° C. to perform an annealing treatment for about 20 to 40 minutes. Then, each semiconductor layer is laminated successively with the use of the MBE apparatus, and electrodes and others are formed in the same manner as previously described to produce a LED chip shown in FIG. 12.

The previously described example is an example of LED. However, the same applies in the case of an LD. An LD chip having each of the aforesaid structures can be produced by disposing a buffer layer made of $Al_2O_3$ film on a sapphire substrate.

By growing a ZnO-based compound semiconductor after a buffer layer made of $Al_2O_3$ film is formed with the use of a sapphire substrate, an initial crystal nucleus is formed uniformly over the entire surface of the $Al_2O_3$ film unlike the surface of a mechanically ground sapphire substrate. Since the semiconductor layer that grows thereon grows with the initial crystal nucleus serving as a seed, the crystal grain boundary is not formed, and the ZnO-based compound semiconductor layer grows uniformly over the entire surface. As a result, it is possible to grow a ZnO-based compound semiconductor layer having an extremely excellent crystallinity, thereby manufacturing an LED or LD having excellent light-emission characteristics.

Here, an excellent crystal layer can be formed if the $Al_2O_3$ film is first formed at a low temperature such that the $Al_2O_3$ film is not turned into a single crystal and thereafter the temperature is raised to a temperature for crystal growth (an annealing treatment is carried out), as compared with the growth of $Al_2O_3$ film into a single crystal at a high temperature from the beginning. In other words, if the $Al_2O_3$ film is formed at a low temperature, the film is formed in an amorphous state instead of a single crystal state. Therefore, even if the surface of the sapphire substrate is not a complete crystal surface by mechanical grinding and chemical etching, the film can be formed easily. Thereafter, at least the front surface side of the amorphous $Al_2O_3$ film turns into a single crystal by the high temperature process, so that an initial nucleus is formed over the entire surface, and a uniform crystal layer easily grows over the entire surface. However, a single crystal $Al_2O_3$ film, if grown as a buffer layer, has the same crystal structure as the sapphire substrate, so that a buffer layer with far fewer crystal defects can be produced as compared with the case of directly growing a different semiconductor layer such as ZnO.

According to this example, in the case of growing a ZnO-based compound semiconductor layer, which does not easily grow particularly in the lateral direction, on a sapphire substrate, an $Al_2O_3$ film is formed as a buffer layer and a crystal nucleus of initial growth is formed, so that the crystal nucleus is formed uniformly over the entire surface of the buffer layer, thereby making it possible to grow a ZnO-based compound semiconductor layer having excellent crystallinity. As a result, a semiconductor layer having excellent crystallinity is produced, and a semiconductor light emitting device such as an LED or LD having excellent light-emission characteristics such as light-emission efficiency is produced.

The inventors of the present invention have made further eager studies in order to grow an oxide semiconductor layer with good crystallinity. As previously described, each of the conventional blue semiconductor light emitting devices uses a sapphire substrate as the substrate, and it cannot be easily handled with in view of the cleavage property in manufacturing an LD. Even in the case of GaN-based compound semiconductor that is actually put into practical use most, eager studies are being made to fabricate a GaN substrate using 6H-SiC or ELOG (epitaxially lateral over growth) having a cleavage property. For this reason, it is desired to grow an oxide compound semiconductor such as ZnO-based compound semiconductor as a semiconductor layer with good crystallinity, and to epitaxially grow the oxide compound semiconductor without being affected by the characteristics of the substrate.

As a result of eager studies, the inventors of the present invention have found out that, at the site where a grain boundary is generated in the crystals, the initial crystal nucleus is absent on the substrate, and the crystal growth on the substrate surface is slow with no lateral growth in the a-axis direction, so that the crystal growth thereon does not proceed smoothly, as previously described. As a result of repeated further studies, the inventors have found out that, by forming a non-crystalline or polycrystalline oxide film containing Zn on a substrate at a low temperature of about 100 to 300° C. and then raising the substrate temperature to the epitaxial growth temperature, a crystal nucleus is generated uniformly over the entire surface of the ZnO-based oxide film to alleviate the restraint of the substrate to some extent and, with the crystal nucleus serving as a seed, a ZnO-based oxide compound semiconductor layer having excellent crystallinity can be epitaxially grown.

Namely, though structurally being the same as the structure shown in FIG. 1, a semiconductor laminate section 12 made of oxide compound semiconductor layer such as ZnO and including a light emitting layer forming portion 11 is disposed on a substrate 1, and an oxide thin film containing Zn is disposed as a buffer layer 2 on the front surface of the substrate 1 at a low temperature than the temperature for growing the semiconductor layers of the semiconductor laminate section 12 and is interposed between the semiconductor laminate section 12 and the substrate 1.

The example shown in FIG. 1 is an example of a blue LED chip having a ZnO-based compound semiconductor laminated on a sapphire substrate 1. In this example, however, the substrate 1 is not limited to a sapphire substrate alone, and may be GaN, GaP, SiC, or the like.

The buffer layer 2 may be made of an oxide containing Zn, such as ZnO. The buffer layer 2 is preferably an oxide semiconductor layer having the same composition as the first epitaxially grown semiconductor layer of the semiconductor laminate section grown thereon, because then a homojunction is formed to give a good lattice matching. The film of the buffer layer 2 is formed at a low temperature in an apparatus for growing the semiconductor laminate section 12, and is formed, for example, by putting the sapphire substrate 1 into an MBE apparatus and raising the substrate temperature to about 300° C. to form the film to a thickness of about 0.05 μm. At this growth temperature, the buffer layer 2 does not turn into a single crystal. However, by raising the temperature up to about 650° C. while radiating an oxygen plasma in subsequently growing ZnO, a fine crystal nucleus is formed uniformly on the surface thereof in correspondence with each crystal of the ZnO-based oxide. The ZnO layer that grows thereon starts growing with the help of the crystal nucleus serving as a seed, so that the ZnO layer starts growing uniformly on the buffer layer 2. In other words, by disposing the buffer layer 2 made of an oxide film containing Zn disposed at a low temperature, it is possible to grow an oxide compound semiconductor crystal layer having few crystal defects with the help of the crystal nucleus serving as a seed formed on the surface of the buffer layer without being restrained by the crystal structure of the substrate so much.

Thus, the buffer layer 2 must be disposed so that the initial nucleus is generated uniformly on the substrate surface. For that purpose, the film of the buffer layer 2 must be formed to a thickness of about 20 to 200 nm, more preferably 50 to 100 nm, at a low temperature of about 100 to 300° C. by the MBE method, the MOCVD method, or the plasma CVD method. If the buffer layer 2 is too thick, crystallization of the buffer layer does not take place easily, so that it is difficult for the initial nucleus to be generated on the surface, whereas if it is too thin, the initial nucleus is not generated uniformly. The buffer layer of ZnO can be formed by using Zn and O plasma as sources in forming the film with the MBE method, by using dimethylzinc (DMZn) and tetrahydrofuran as reaction gases in forming the film with the MOCVD method, and using DMZn and O plasma as reaction gases in forming the film with the plasma CVD method.

The other constituents such as the light emitting layer forming portion 11 and the electrodes can be selected from a variety of constituents in the previously described examples.

In order to produce this LED, a sapphire substrate 1 is set, for example, in an MBE apparatus and, with the temperature of about 300° C., Zn and oxygen are radiated to form a film of non-crystalline ZnO layer 2 to a thickness of about 0.05 μm. Then, while continuing the oxygen radiation, the temperature is raised so that the substrate temperature will be about 650° C. By this temperature raising, the surface of the buffer layer 2 is crystallized to generate a crystal nucleus uniformly. When the substrate temperature reaches 650° C., the shutter of a source (cell) of Zn is opened and, while radiating Zn again, the shutter of an n-type dopant Al is also opened to grow an n-type contact layer 3 made of n-type ZnO to a thickness of about 1.5 μm. Subsequently, while sputtering the constituent elements, such as Zn, Mg, and Cd, of each semiconductor layer of the semiconductor laminate section 12 such as the light emitting layer forming portion 11 from cells, the semiconductor layers are successively grown to the aforesaid thicknesses each with the aforesaid composition. Here, if an n-type semiconductor layer was to be formed, it was formed by doping through sputtering Al, whereas if a p-type semiconductor layer was to be formed, it was formed by simultaneous doping with a later-mentioned plasma-excited $N_2$ and Al serving as a buffering agent.

Thereafter, the epitaxially grown wafer was taken out from the MBE apparatus, and the electrodes 9, 10 were formed in the same manner as described before.

According to the present invention in which the buffer layer of a low temperature ZnO-based compound is disposed, a film of an oxide compound containing Zn is formed in a non-crystalline or polycrystalline structure on a substrate at a low temperature, and an oxide compound semiconductor layer is formed thereon at a high temperature of about 650° C., so that a crystal nucleus which is a small single crystal portion of the oxide semiconductor layer is uniformly generated on the surface of the buffer layer, which is uniformly formed on the surface of the substrate, by raising the temperature for growing the oxide semiconductor layer. Further, since the oxide semiconductor layer is grown thereon, the crystal starts to grow with the help of the crystal nucleus serving as a seed and, since the buffer layer and the grown semiconductor layer are the same kind of material, homoepitaxy is achieved, whereby the restraint of the substrate is alleviated, and a crystal layer with fewer crystal defects grows by freely selecting a substrate to some extent. In particular, in the case where the grown semiconductor layer is an oxide compound semiconductor such as ZnO, the growth in the a-axis direction is slow as previously described, and the crystals will not proceed and a grain boundary is liable to be generated at a site where the nucleus for initial crystal growth is absent. However, according to the present invention, the initial crystal nucleus is generated uniformly on the surface, so that a semiconductor layer having an extremely good crystallinity is produced.

In the previously described example, the buffer layer 2 was grown to be non-crystalline or polycrystalline at a low temperature in a growth apparatus for growing a compound semiconductor layer. However, if a non-crystalline or polycrystalline buffer layer is formed by the film forming method using an apparatus such as sputtering, vacuum vapor deposition, or laser ablation different from the epitaxial growth, then the film quality will be extremely dense, and all the more it will not be restricted at all by the crystal structure of the substrate. In other words, since the buffer layer is dense, the property of the crystal structure of the substrate is shutoff by the buffer layer. As a result, the material can be freely selected as long as it is a material capable of withstanding the growth temperature of the semiconductor layer to be grown thereafter. In this case, oxygen (O) deletion is liable to be generated in the method using vacuum vapor deposition, so that sputter laser ablation allowing oxygen (O) to be contained in the atmosphere is preferable. With reference to FIG. 4, an example will be explained in which the buffer layer 2 is formed by this method, and a semiconductor laser having a structure with an electric current constriction layer (the same as the structure of FIG. 4) is produced.

In order to produce an LD chip having an SAS structure shown in FIG. 4, a substrate 1 made, for example, of GaP is first put into an ECR (electron cyclotron resonance) sputter apparatus and a ZnO film is grown to a thickness of about 20 to 200 nm in an atmosphere of $(Ar+O_2)$ plasma by using ZnO or Zn as a target. Thereafter, the substrate 1 is put into an MBE apparatus and, with the temperature raised to about 650° C. under an oxygen radiation condition, subsequent semiconductor layers are successively grown by sputtering the constituent elements of the layers, for example, Zn, Mg, Cd, and others from cells, in the same manner as in the previously described examples. Thereafter, the same processes as in the previously described examples will complete an LD chip having a structure shown in FIG. 4.

According to this method, the film of buffer layer can be formed by sputtering or the like, so that an extremely dense film can be formed unlike the ordinary MOCVD method of the like. Moreover, since it is formed in a non-crystalline or polycrystalline state, the film can be formed without generation of deletion or the like over the entire surface. As a result, the initial crystal nucleus is generated uniformly on the surface by the high temperature of growing the oxide compound semiconductor layers and, with the crystal nucleus serving as a seed, a good crystal layer is obtained. Therefore, on the basis of the denseness of the buffer layer, the semiconductor layers can be grown without being affected by the crystal structure of the substrate, and oxide semiconductor layers having an extremely good crystal structure can be grown while, as in the previously described examples, using an easily cleavable material or a material that can be easily handled with, such as a GaP substrate, a GaAs substrate, or a Si substrate, without being restrained by the material of the substrate. As a result, ZnO-based compound semiconductor layers having an extremely excellent crystallinity can be grown to produce an LED or LD having excellent light-emission characteristics with a cleavage property.

According to the invention of forming a buffer layer containing Zn at a low temperature, oxide compound semiconductor layers can be grown to have an extremely good crystallinity without being affected by the crystal structure of the substrate so much. Therefore, an inexpensive blue semiconductor light emitting device having extremely high characteristics can be produced even without the use of an expensive sapphire substrate that cannot be easily handled with or the like in manufacturing a blue LED or LD.

Furthermore, selection of a substrate having an excellent cleavage property produces a large effect particularly on an LD or the like, and also the production process is simplified to realize production with low costs.

The inventors of the present invention have repeatedly made eager studies in order to provide better crystallinity of the semiconductor laminate section made of compound semiconductor that form a light emitting layer laminated on the substrate. Namely, besides the fact that the previously described ZnO-based compound grows slowly in the lateral direction, no substrate can be found which has a crystal structure coincident with semiconductor having a wurtzite structure such as a GaN-based compound semiconductor or a ZnO-based compound semiconductor, so that they are formed by growing semiconductor layers on a substrate having a different lattice constant, such as a sapphire substrate. However, the degree of lattice mismatch between ZnO and sapphire is 18.3%. For this reason, cracks caused by the lattice mismatch or the like are liable to enter the semiconductor grown layers, so that decrease in the light-emission efficiency or rise in the threshold voltage caused by problems in the crystal structure are liable to take place. Therefore, it is desired to grow good semiconductor layers without generating lattice defects in the semiconductor layers which are liable to cause lattice mismatch with a substrate.

The inventors of the present invention have repeatedly made eager studies in order to grow ZnO-based compound semiconductor or GaN-based compound semiconductor with good crystallinity, and found out that the cause of cracks in the crystals of the semiconductor layers lies in the fact that cracks enter the portion of the crystal grain boundary in lowing a temperature after the epitaxial growth of the semiconductor layers at a high temperature, and the presence of the cracks further promotes the cracks to proceed. As a result of further repeated eager studies, the inventors have found out that the generation of cracks in lowering the temperature is caused by the difference in the contraction speed at the time of lowering the temperature on the basis of the difference in the thermal expansion coefficient between the substrate and the compound semiconductor layers to be laminated. Also, they have found out that crystal defects such as cracks can be greatly reduced by interposing, as a buffer layer, a material having an intermediate thermal expansion coefficient between the substrate and the semiconductor layers to be grown.

This example also has the same structure as the one shown in FIG. 1, and a semiconductor laminate section 12 including a light emitting layer forming portion 11 made of compound semiconductor and having an n-type layer (n-type cladding layer 4) and a p-type layer (p-type cladding layer 6) to form a light emitting layer (active layer 5) is disposed on a substrate 1. Further, a buffer layer 2 made of a material having a thermal expansion coefficient larger than the thermal expansion coefficient of the lowermost epitaxial growth layer (n-type contact layer 3) in the semiconductor laminate section 12 and smaller than the thermal expansion coefficient of the substrate 1 is disposed between the substrate 1 and the semiconductor laminate section 12. Here, the structure that forms the light emitting layer is not limited to the structure in which the active layer is sandwiched between the n-type and p-type cladding layers, but includes other structures such as a pn-junction.

The example shown in FIG. 1 is an example of a blue LED chip in which ZnO-based compound semiconductor is laminated on a sapphire substrate 1. The substrate is not limited to a sapphire substrate alone, and may be GaAs (thermal expansion coefficient; $6.63 \times 10^{-6}$/K) or the like. However, if GaAs is used as the substrate, the buffer layer will be made of AlGaN to AlN having a smaller thermal expansion coefficient than GaAs because the thermal expansion coefficient lies between GaN (thermal expansion coefficient; $7.7 \times 10^{-6}$/K) and AlN (thermal expansion coefficient; $5.3 \times 10^{-6}$/K). Further, GaAs will have a cubic crystal structure.

The film of the buffer layer 2 is formed, for example, of GaN to a thickness of about 0.1 μm. The buffer layer 2 is formed as an amorphous layer or a polycrystalline layer, for example, at a low temperature of about 600° C. The inventors of the present invention have found out that, by using a material which has an intermediate thermal expansion coefficient lying between the thermal expansion coefficients of the substrate 1 and the first epitaxial growth layer to be successively grown and which has the same crystal structure as the first epitaxial growth layer, the semiconductor laminate section grown thereon will have a good crystal structure without cracks or the like. In other words, since the thermal expansion coefficient (in the a-axis direction, the same applies hereinafter) of sapphire is $7.5 \times 10^{-6}$/K and the first epitaxial growth layer 3 is ZnO with its thermal expansion coefficient of $2.9 \times 10^{-6}$/K in the example shown in FIG. 1, the thermal expansion coefficient $5.59 \times 10^{-6}$/K of GaN is an intermediate value between these two and also, since GaN has a wurtzite structure in the same manner as ZnO, the above-described conditions are satisfied. AlN likewise has a wurtzite structure and has the thermal expansion coefficient of $5.3 \times 10^{-6}$/K, so that the conditions are likewise satisfied. Therefore, it goes without saying that the buffer layer 2 may be made of $Al_pGa_{1-p}N$ ($0 \leq p < 1$), a mixed crystal of GaN and AlN. The buffer layer 2 may be non-doped or of another conductivity as long as the substrate 1 is an insulating substrate such as sapphire. Besides this, the buffer layer 2 may be made of SiC (thermal expansion coefficient; $4.9 \times 10^{-6}$/K) or the like.

The other constituents such as the light emitting layer forming portion 11 and the electrodes can be selected from a variety of constituents in the previously described examples. Further, although this example is an LED, an LD can likewise be made into each of the previously described construction examples. Here, in this example also, if an n-type semiconductor layer was to be formed, it was formed by doping through sputtering Al, whereas if a p-type semiconductor layer was to be formed, it was formed by simultaneous doping with a later-mentioned plasma-excited $N_2$ and Al serving as a buffering agent.

In order to form this buffer layer 2, a sapphire substrate 1 is set, for example, in an MOCVD (metal organic chemical vapor deposition) apparatus, and the front surface is thermally treated at about 1050° C. for about 20 minutes in an $H_2$ atmosphere. Subsequently, with the substrate temperature raised to about 600° C., a GaN layer is grown to a thickness of about 0.1 μm by the MOCVD method to form a film of the buffer layer 2. Thereafter, the substrate 1 is taken out and put into an MBE (molecular beam epitaxy) apparatus and, with the temperature of the substrate 1 raised to about 600° C. and under an oxygen radiation condition, semiconductor layers constituting the semiconductor laminate section 12 are successively grown each with the aforesaid composition in the same manner as previously described, while sputtering the constituent elements of the semiconductor layers to be grown, for example, $Zn$, $Mg$, $Cd$, and others, from cells. The subsequent steps are also the same as in the previously described examples.

According to the invention of disposing a buffer layer having an intermediate thermal expansion coefficient, even if the wafer is cooled for taking it out after epitaxial growth of the semiconductor layers, the contraction caused by the temperature fall does not change to an extreme extent between the substrate and the laminated semiconductor layers, but the buffer layer with an intermediate contraction degree absorbs the rapid change between the two, since a layer having an intermediate thermal expansion coefficient between the thermal expansion coefficients of sapphire and ZnO, which is the first epitaxial growth layer of the semiconductor laminate section, is disposed on a sapphire substrate. As a result, cracks do not easily enter among crystals due to the temperature change in cooling. Once cracks enter, the cracks grow further due to the presence of the cracks. However, since there is no generation of cracks that causes it, an extremely good crystal structure is produced. As a result, a ZnO-based compound semiconductor layer having an extremely excellent crystallinity can be grown to produce an LED or LD having excellent light-emission characteristics.

Here, the previously described example is an example in which a semiconductor laminate section made of ZnO-based compound semiconductor is formed on a sapphire substrate. However, with another source material system, semiconductor layers having an excellent crystallinity can likewise be grown to produce a semiconductor light emitting device having excellent light-emission characteristics, by epitaxially growing the semiconductor laminate section after forming a film of the buffer layer made of a material having an intermediate thermal expansion coefficient between the thermal expansion coefficient of the substrate and the thermal expansion coefficient of the first epitaxial layer in the semiconductor laminate section.

According to this example, a compound semiconductor layer, in which crystal defects accompanying the lattice mismatch of a ZnO-based compound semiconductor layer or the like used in a blue semiconductor light emitting device are liable to be generated, can be produced as a semiconductor crystal layer with few crystal defects, thereby leading to an improvement of light-emission efficiency and an improvement of the light-emission characteristics such as reduction in the threshold voltage of a currently desired semiconductor light emitting device such as a blue LED or LD.

Figure 14:
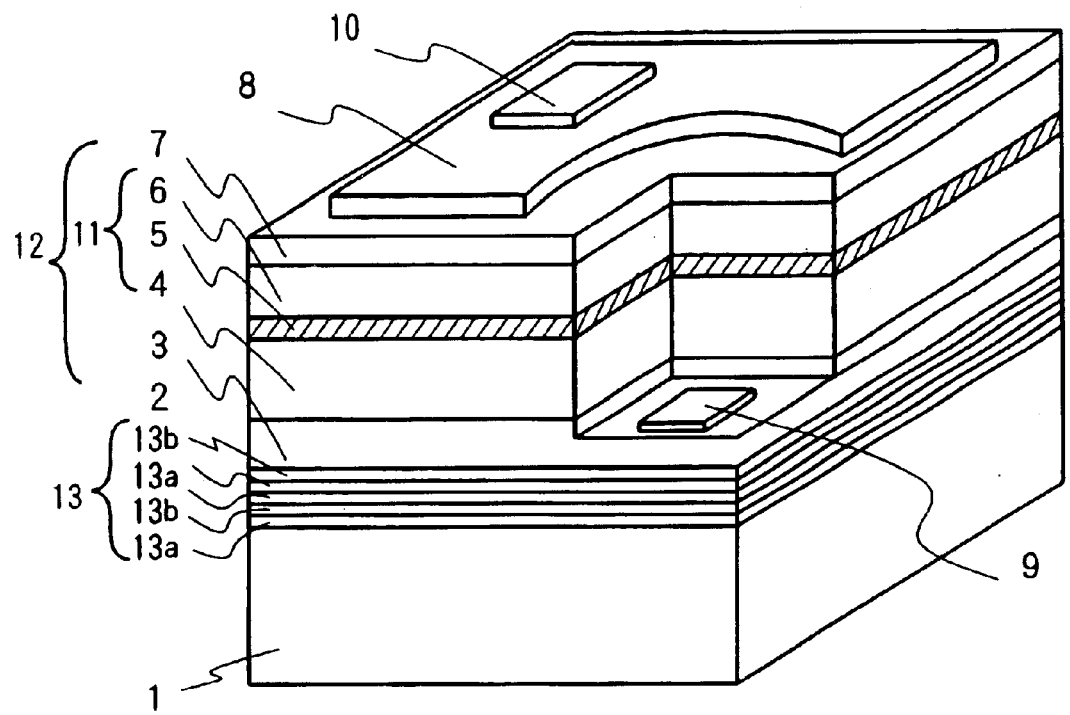
FIG. 14 is a perspective explanatory view of a LED chip which is still another embodiment according to the present invention.

The example shown in FIG. 14 is an example of obtaining a semiconductor light emitting device capable of being used also as a buffer layer, and having a structure such that light can be effectively taken out to the outside even if the substrate is made of a light-absorbing material. In other words, the light emitted from the light emitting layer is radiated almost uniformly to all directions from left to right and from upwards to downwards, but a light emitting device is formed typically by bonding a LED chip to the tip end of a lead wire or onto the substrate so that the light radiated only in one direction on the front surface side of the LED chip will be utilized.

Further, in a red LED chip or the like in which GaAs is used as a substrate, most of the light radiated to the substrate side is absorbed and the light can be taken out only in an amount of about half of the light emitted to the front surface side, since GaAs of the substrate is a material that absorbs emitted red light. Further, in a blue LED chip using a transparent material such as a sapphire substrate as the substrate and using a GaN-based compound semiconductor, the light radiated to the rear surface side cannot be sufficiently utilized because it is absorbed by a bonding agent or the like used in bonding the rear surface of the substrate or irregularly reflected although the light is not absorbed by the substrate. For this reason, a structure in which a reflective film is disposed on the rear surface side of a sapphire substrate or the like is disclosed, for example, in Japanese Laid-open Patent Publication No. 02-39578/1990.

Thus, for example, in a LED in which the light is taken out only in one direction on the front surface side of the LED chip, the light proceeding to the substrate side of the LED chip cannot be fully utilized, and the external differential quantum efficiency cannot be improved. Further, even with a structure in which a reflective film is disposed on the rear surface of a transparent substrate such as a sapphire substrate as described before, the light radiated from sides of the substrate cannot be effectively-utilized because of the thickness of the substrate.

Further, an LD has a structure such that light is enclosed within an active layer for oscillation by sandwiching the active layer with materials having a smaller refractive index than the active layer. However, if the enclosing effect is not sufficient, the light cannot be enclosed completely, and the oscillation efficiency decreases. The example shown in FIG. 4 is directed to a structure in which such a waste of light is reduced, and the emitted light can be taken out to the outside as effectively as possible, thus improving the external differential quantum efficiency.

In other words, the inventors of the present invention have made repeated eager studies to grow an oxide compound semiconductor such as a ZnO-based one with good crystallinity, and have found out that, by forming a film of a ZnO-based oxide in a non-crystalline or polycrystalline state at a low temperature of about 100 to 300° C. and then raising the substrate temperature to the epitaxial growth temperature, a crystal nucleus is generated uniformly on the surface of the ZnO-based oxide film and, with the crystal nucleus serving as a seed, a ZnO-based oxide compound semiconductor layer having an excellent crystallinity can be grown irrespective of the crystal structure of the substrate. Based on this knowledge, the inventors have found out that, by forming a film of a low temperature ZnO-based oxide buffer layer after a dielectric film is formed to form a reflective film before forming the buffer layer of ZnO-based oxide, it is possible to produce a semiconductor light emitting device having a reflective film on the substrate side of a semiconductor laminate section that forms a light emitting layer with improved efficiency of taking out the light to the outside.

In FIG. 14, it has a substrate 1, a reflective film 13 formed to reflect light coming from the front surface side of the substrate 1 by lamination of an even number of dielectric films 13a, 13b or semiconductor films having different refractive indices to a thickness of $\lambda/(4n)$ (n is a refractive index of the dielectric film or the semiconductor film, and $\lambda$ is the wavelength of emitted light) on the substrate 1 so that a layer having a smaller refractive index and a layer having a larger refractive index are alternately laminated in this order on the substrate 1 (a pair is formed by the layer having a smaller refractive index and the layer having a larger refractive index), and a semiconductor laminate section 12 having semiconductor layers 3 to 7 laminated to form a light emitting layer (active layer 5) on the reflective film 13.

In the example shown in FIG. 14, the substrate 1 is a silicon substrate. However, it is not limited to Si alone, and may be one of a variety of substrates such as GaAs, GaP, and sapphire.

The reflective film 13 is formed in a laminate structure of dielectric films or semiconductor films having different refractive indices so that the film having a smaller refractive index is positioned on the lower side. In the example shown in FIG. 14, five pairs are laminated by alternate lamination of a $SiO_2$ film 13a having a smaller refractive index and a $TiO_2$ film 13b having a larger refractive index, for example, by the magnetron sputtering method. Each layer is formed to have a thickness of $\lambda/(4n)$, where $\lambda$ is the wavelength of emitted light, and n is the refractive index of the dielectric layer or the semiconductor film. Namely, in the case of emitting light having a wavelength of 450 nm, the $SiO_2$ film 13a is formed to have a thickness of 0.28 μm because the refractive index thereof is 1.4, and the $TiO_2$ film 13b is formed to have a thickness of 0.04 μm because the refractive index thereof is 2.6. By this laminate structure, a reflectivity of about 75% is obtained, for example, even with one pair, and a fully satisfactory reflectivity is obtained depending on the object. The more the number of laminated pairs is, the higher the reflectivity will be, so that the reflective layer can be formed to have a desired reflectivity by adjusting the number of laminated layers or changing the dielectric films in accordance with the object. In the aforesaid example, a reflectivity of 85 to 95% has been obtained. Here, as other examples of the dielectric film or the semiconductor film, $Al_2O_3$, $Si_3N_4$, AlN, or the like can be used as a film having a smaller dielectric constant, and a(amorphous)-Si or the like can be used as a layer having a larger dielectric constant.

As a method for forming the reflective film, in the case of using a magnetron sputtering method as in the aforesaid examples, the reflective film 13 can be formed by successively laminating five pairs of $SiO_2$ film 13a and $TiO_2$ film 13b in a $(Ar+O_2)$ plasma atmosphere using $SiO_2$ and $TiO_2$ as targets or using Si and Ti as targets. Subsequently, the buffer layer 2 can be formed by forming a ZnO film to a thickness of about 20 to 200 nm in a $(Ar+O_2)$ plasma atmosphere using ZnO or Zn as targets in the same apparatus. However, the method to be used is not limited to this example, and may be the ECR sputtering method, the vapor deposition method, the laser ablation method, or the like.

As described before, the buffer layer 2 is made, for example, of an oxide containing Zn, such as ZnO. The buffer layer 2 is preferably an oxide semiconductor layer having the same composition as the first epitaxially grown semiconductor layer of the semiconductor laminate section grown thereon, because then a homojunction will be formed to provide good lattice matching. The film of the buffer layer 2 is formed to have a non-crystalline or polycrystalline structure at a low temperature. This allows a crystal nucleus to be generated on the front surface when the temperature is raised later to the growth temperature as described before and, with the crystal nucleus serving as a seed, semiconductor layers grow. The subsequent growth of the semiconductor laminate section 12, the electrodes, and the like can be formed in various structures in the same manner as in the previously described examples. The same parts in the aforesaid examples will be denoted with the same reference numerals, and their explanation will be omitted. Here, if an n-type semiconductor layer was to be formed, it was doped by sputtering Al, whereas if a p-type semiconductor layer was to be formed, it was formed by simultaneous doping with a later-mentioned plasma-excited $N_2$ and Al as a buffering agent.

An LED having a structure in which the reflective film 13 was disposed and a LED having a conventional structure in which the reflective film was not disposed were formed within the same wafer, and the brightnesses of the two were compared and examined in two kinds of lots. As shown in Table 1, the result showed a great improvement. Further, on examining the change in external differential quantum efficiency, it was 2.8% in the conventional structure, whereas it was 4.6% in the present invention, thereby showing an improvement.

TABLE 1

Brightness with Reflective Film

| Lot | with reflective film | without reflective film |
|---|---|---|
| ① | 1031 mcd | 648 mcd |
| ② | 1611 mcd | 1017 mcd |

According to this example, a reflective film is disposed by a laminate structure of dielectric films on a substrate. Therefore, among the light emitted from the i light emitting layer of the LED chip and radiated to all directions, the light proceeding to the substrate side of the chip on the side opposite to the light-outlet surface, which surface is located on the front surface side of the LED chip, is also reflected by the reflective film to be taken out from the outlet surface side. As a result, even with the same light-emission efficiency, the external differential quantum efficiency, which is the ratio of light taken out to one front surface side as a needed light, is greatly improved to produce a LED having a large brightness. On the other hand, even if a crystal substrate is used as the substrate, it is not possible to grow crystals of semiconductor layers that are lattice-matched with the crystal of the substrate, since a dielectric film serving as a reflective film is formed on the substrate. However, since a low temperature buffer layer made of a ZnO-based oxide compound is formed, a crystal nucleus is generated uniformly on the surface thereof by raising the temperature to the temperature for crystal growth and, with the crystal nucleus serving as a seed, ZnO-based oxide compound semiconductor layers grow epitaxially, so that the semiconductor layers forming a light emitting layer can be grown without being restrained by the crystal structure of the substrate so much.

This example was an example in which a ZnO-based compound semiconductor layer is grown on a buffer layer. However, it is not limited to a ZnO-based compound semiconductor layer alone, so that another semiconductor layer can be grown on the buffer layer made of a ZnO-based compound as long as it is a compound semiconductor layer having a crystal structure that matches with the crystal structure of the ZnO-based compound of the buffer layer.

Further, even if the element is an LD instead of a LED, it can be formed to have a structure of each of the aforesaid examples.

Figure 15:
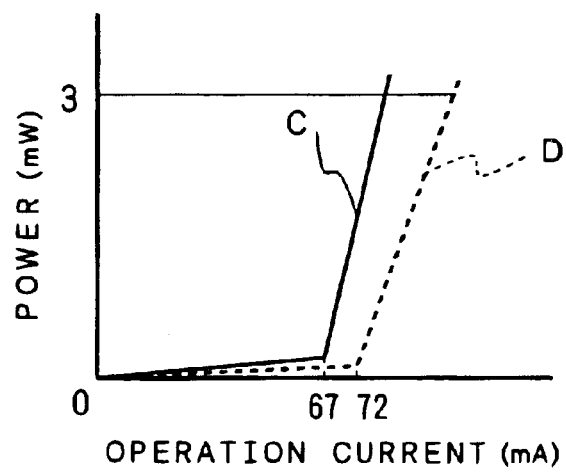
FIG. 15 is a view showing the light-emission characteristics of an LD in which a reflective film is provided in the structure of FIG. 2, as contrasted with an LD having a conventional structure.

The aforesaid reflective film 13 was formed in an LD chip having a structure shown in FIG. 2 for production. On examining the relationship between the electric current and the output of an LD having a structure in which this reflective film is disposed and an LD having a conventional structure produced under the same condition but without a reflective film, it has been found out that the threshold current is improved from 72 mA to 67 mA and the oscillation efficiency η is improved from 21% to 28%, as indicated by the curve C showing characteristics thereof and the curve D of the conventional structure in FIG. 15.

By adopting this structure, since the reflective film 13 has a high reflectivity to the light-emission wavelength emitted by the active layer 5, the light exuding from the active layer 5 is reflected by the reflective film and returns into the active layer 5 again. In other words, the light does not exude from the active layer easily, thereby improving the efficiency of enclosing the light. As a result, reduction of the threshold voltage and improvement in the quantum efficiency can be achieved to produce an LD having an extremely high output with an extremely low electric power.

According to this example, since the reflective film is disposed on the substrate side in the immediate vicinity of the light emitting layer, the emitted light that proceeds to the substrate side can be effectively utilized without being wasted, thereby greatly improving the differential quantum efficiency of the LED and manufacturing a light emitting device having an extremely large brightness with the same input. Further, even in the LD, the leaking light is shut off, so that the threshold voltage can be greatly reduced and its oscillation efficiency can be improved to produce a semiconductor light emitting device having an extremely high efficiency.

FIGS. 16 to 20 are views for explaining still another embodiment, in which the ohmic contact between the n-type layer of a ZnO-based compound semiconductor layer and the n-side electrode is improved to reduce the operation voltage. Namely, since ZnO has approximately the same band gap energy as GaN, it is considered that it can be formed of an electrode material similar to GaN even with the use of a ZnO-based compound semiconductor. Further, in an n-type GaN compound semiconductor, an Al—Ti alloy is considered to give a good ohmic contact, so that a laminate of Al/Ti or Al/Ti/Ni or an alloy thereof is used.

Figure 20:
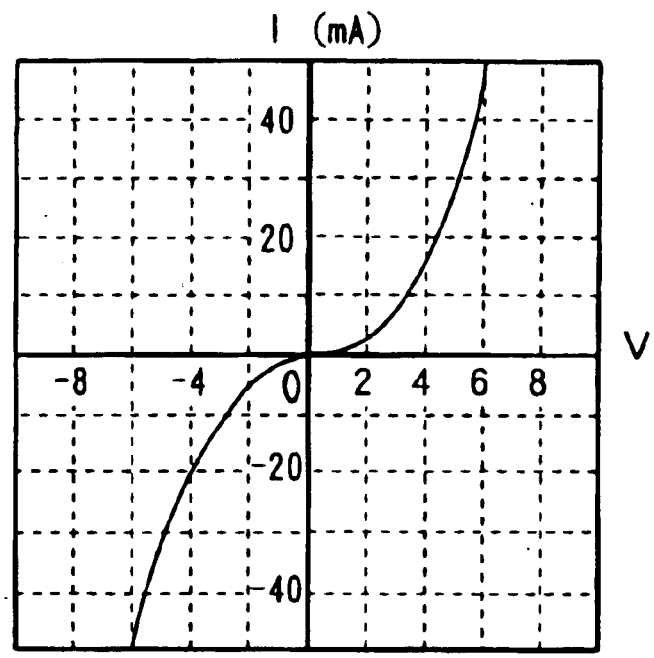
FIG. 20 is a view showing voltage-current characteristics when an electrode of Al/Ti/Ni is disposed on n-type ZnO.
Figure 20:
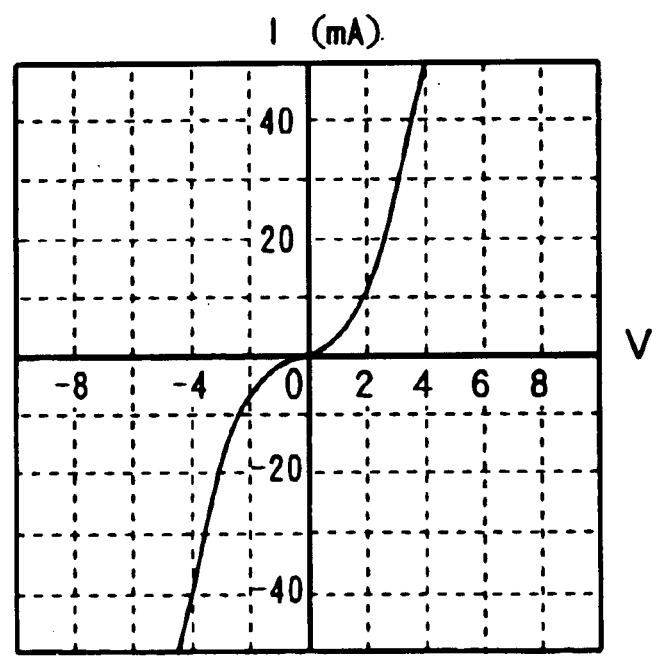

However, when an n-side electrode was formed by lamination of Al/Ti/Ni on n-type ZnO for measurement of the current-voltage characteristics, a linear relationship was not obtained, as shown in FIG. 20(a). The characteristic figure of the one in which an annealing treatment was performed at about 450° C. for about 10 minutes in this lamination state shows some improvement as shown in FIG. 20(b), but it was not a completely linear curve. Here, in FIG. 20, the lateral axis represents the voltage with one unit being 2V, and the vertical axis represents the electric current with one unit being 10 mA. Thus, with the use of a ZnO-based compound semiconductor, it is not possible to obtain a complete ohmic contact even if an attempt is made to use a similar material as the electrode material in analogy with a GaN-based compound semiconductor having approximately the same band gap energy.

In order to obtain a semiconductor light emitting device having an ohmic contact with n-type ZnO-based compound semiconductor and operating at a low operation voltage, the inventors of the present invention have repeatedly made eager studies and have found out that, by disposing Ti or Cr as the first layer to be in contact with the n-type ZnO-based compound semiconductor so as to avoid contact between the ZnO-based compound semiconductor and Al, an ohmic contact between the n-side electrode and the n-type ZnO-based compound semiconductor is obtained to produce a semiconductor light emitting device that emits light of high output at a low operation voltage.

Figure 16:
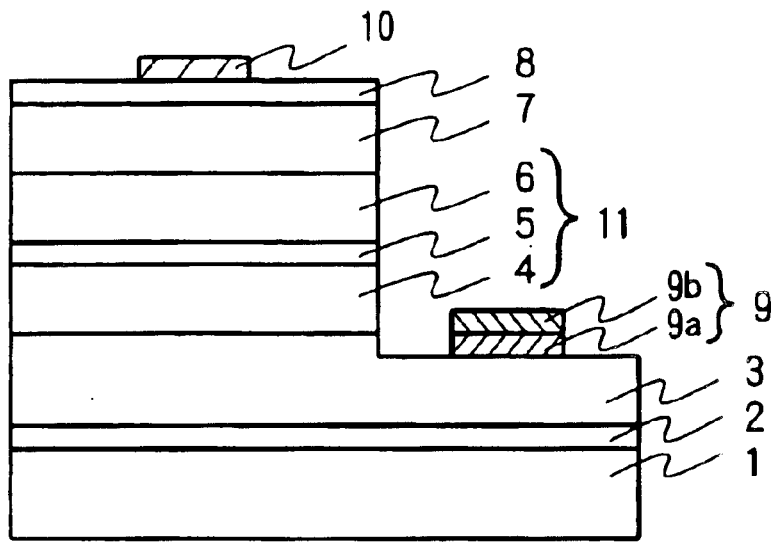
FIG. 16 is a cross-sectional explanatory view of a LED chip which is still another embodiment according to the present invention.

As illustrated in FIG. 16 showing a cross-sectional explanatory view of an LED chip, in a ZnO-based compound semiconductor light emitting device according to this example, a light emitting layer forming portion 11 that forms a light emitting layer by lamination of ZnO-based compound semiconductor including at least n-type layers 4, 3 is disposed on a substrate 1. An n-side electrode 9 disposed to be in contact with the n-type layer 3 of the ZnO-based compound semiconductor is characterized in that the portion which is in contact with the n-type layer 3 is formed of the first layer 9a made of Ti or Cr that does not contain Al.

The n-side electrode 9 is formed by vacuum vapor deposition and patterning or the lift-off method or the like on the n-type contact layer 3 which is exposed by removing a portion of the laminated semiconductor layers 3 to 7 by etching. In this example, the n-side electrode 9 is constructed with the first layer 9a and the second layer 9b, where the first layer 9a is made of a layer, for example, of Ti that does not contain Al as described above, to a thickness of about 0.05 μm, and the second layer 9b made of $Ti_{1-r}Al_r$ (0<r≦0.99) is successively disposed thereon.

The first layer 9a of the n-side electrode 9 is disposed so that Al in the second layer 9b will not be diffused into the n-type layer 3 made of ZnO by an annealing treatment performed after forming the second layer 9b. Although it depends on the temperature and the time of the annealing treatment, diffusion of Al can be prevented against a general annealing treatment at about 450° C. for about 10 minutes if the first layer 9a is disposed to have a thickness as described above. The Ti film can be formed by vacuum vapor deposition or the sputtering method or the like such as radiation with an electron beam gun. Even if the first layer 9a is too thick, it does not raise a problem. However, since it is far more expensive than Al, too much thickness is not preferable in view of the costs. The inventors have found out that, if Al is contained in the first layer 9a, it is diffused into the ZnO-based compound semiconductor layer, as previously described, to give extremely reduced ohmic characteristics. It has been found out that, when a Ti layer or a later-mentioned Cr layer that does not contain Al is formed on the ZnO-based compound semiconductor layer, the diffusion of Al can be prevented to give a good ohmic contact.

Figure 17:
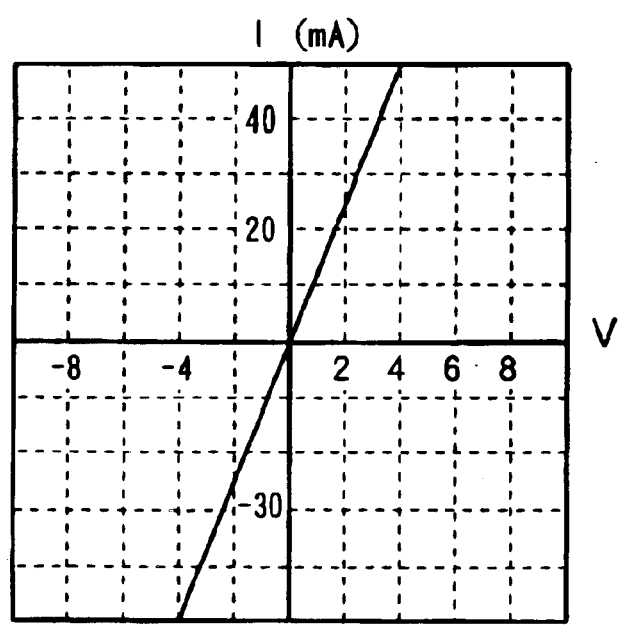
FIG. 17 is a view showing voltage-current characteristics of an n-side electrode of the example of FIG. 16.

Generally, the second layer 9b of the n-side electrode 9 is made of Al in view of its facility in connection and costs for facilitating wire-bonding for connection with an external lead wire or soldering with the lead wire. However, on examination, the inventors have found out that the contact resistance between the first layer 9a and the second layer 9b rises if the second layer 9b is made of Al alone, and that a good ohmic contact is obtained if the second layer 9b is made of $Ti_{1-r}Al_r$ containing Ti at 1% or more. Even if the ratio of contained Ti is too much, it does not raise any problem in characteristics; however, it raises the costs, so that the ratio is preferably from 1% to 10%. In order to obtain this $Ti_{1-r}Al_r$, the film is formed as an alloy by simultaneously radiating Ti and Al (controlling the radiated amount in accordance with the mixing ratio) with a vapor deposition apparatus such as an electron beam gun. Even in this state, the ohmic contact characteristics are improved. However, a complete alloy is not obtained simply by simultaneous radiation of Al and Ti. Therefore, an annealing treatment was carried out at about 400 to 1200° C., preferably at about 400 to 800° C., more preferably at about 450° C., for 10 minutes to obtain an extremely good ohmic contact. If the annealing temperature exceeds 1200° C., ZnO itself begins to be thermally decomposed, so that it is not preferable, whereas if the annealing temperature is lower than 400° C., the effect of the annealing does not appear. The voltage-current characteristics of the n-side electrode in the LD illustrated in FIG. 16 are shown in FIG. 17 with the lateral axis representing the voltage (V) and the vertical axis representing the electric current (mA). As will be apparent from FIG. 17, the obtained voltage-current characteristics showed a complete linear relationship.

The light emitting layer forming portion 11, the substrate 1, the p-side electrode 10, and others are the same as in the example shown in FIG. 1, and these structures can be those of the previously described examples including an LD structure. The same parts will be denoted with the same reference numerals, and their explanation will be omitted. Also, the production method is the same as in the previously described examples. Here, if an n-type semiconductor layer was to be formed, it was doped by sputtering Al, whereas if a p-type semiconductor layer was to be formed, it was formed by simultaneous doping with a later-mentioned plasma-excited $N_2$ and Al as a buffering agent.

In this example, the second layer 9b of the n-side electrode 9 was formed with an alloy of Ti—Al; however, it is sufficient if the second layer 9b conforms to Ti or Cr in the first layer, so that the second layer 9b can be formed of a laminate structure of Ti/Au or of another material. However, in view of costs, the aforesaid alloy having an Al content of about 99% is the most inexpensive one and advantageously has a good electric contact.

Figure 18:
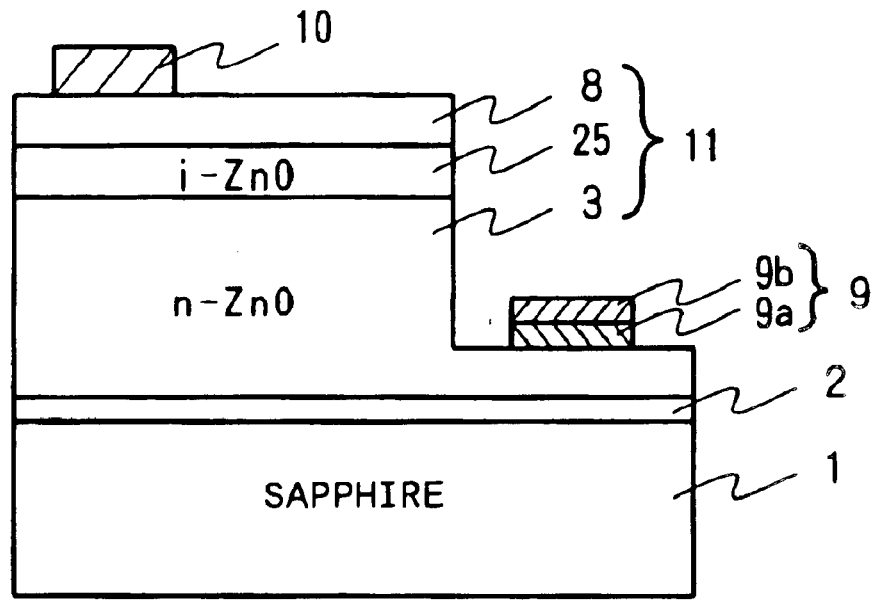
FIG. 18 is a cross-sectional explanatory view of a LED chip which is still another embodiment according to the present invention.

The example shown in FIG. 18 is an example of an LED having a MIS structure. In this example, the first layer 9a of the n-side electrode 9 that is in contact with the n-type contact layer 3 made of n-type ZnO is made of Cr. Namely, a film of Cr is formed to a thickness of about 0.05 μm by vacuum vapor deposition in the same manner as described before, on the surface of the n-type contact layer 3 which is exposed by removing a portion of the laminated semiconductor laminate section by etching. Further, the second layer 9b made of $Ti_{1-r}Al_r$ is formed to a thickness of about 0.15 μm thereon. Here, in this example, the ratio r of Ti in the second layer 9b was set to be 5% (0.05).

The light emitting layer forming portion 11 is constructed with an n-type layer 3 made of an n-type ZnO-based compound semiconductor, an i-layer 25 made of a semiinsulating ZnO-based compound semiconductor, and an ITO film 8 constituting an electrically conductive layer. The i-side electrode 10 disposed thereon is the same as the aforesaid p-side electrode and is formed by vacuum vapor deposition of Ni/Au using the lift-off method.

Figure 19:
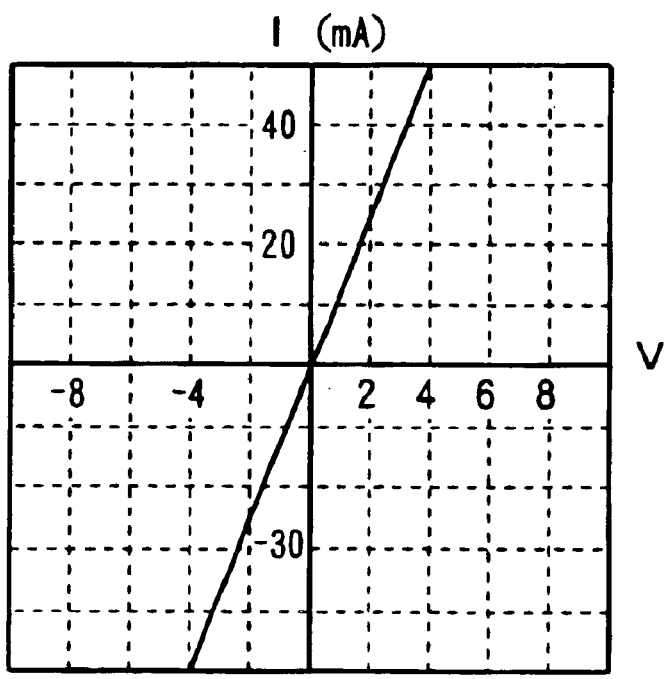
FIG. 19 is a view showing voltage-current characteristics of an n-side electrode of the example of FIG. 18.

The voltage-current characteristics of the n-side electrode 9 having this structure are shown in FIG. 19. Even with this structure, the relationship between the voltage and the electric current is linear as in the previously described examples, thereby providing a complete ohmic contact.

According to this example, by disposing the first layer of Ti or Cr and then disposing the second layer of Ti—Au alloy without allowing Al to be contained in the material of the electrode disposed on the n-type layer of the ZnO-based compound semiconductor, the ohmic contact characteristics are greatly improved, and the series resistance decreases, so that the element can be operated at a low operation voltage.

By constructing the n-side electrode in this manner, an n-side electrode is obtained which has an excellent ohmic contact characteristics with an n-type ZnO-based compound semiconductor layer used particularly in a blue semiconductor light emitting device, so that a semiconductor light emitting device that can be driven at a low voltage can be obtained even by using a ZnO-based compound semiconductor. As a result, the light-emission characteristics such as the light-emission efficiency of a currently desired semiconductor light emitting device such as a blue LED or LD can be improved with the use of a new material.

FIGS. 21 to 24 are explanatory views showing an example of growing a p-type layer so that the carrier concentration of the p-type layer in a ZnO-based compound semiconductor will be high. Namely, for making a ZnO-based compound semiconductor into p-type, studies are made by using nitrogen as a dopant in the same manner as a GaN-based compound; however, it is not possible to obtain a p-type layer having a small resistance, so that a semiconductor light emitting device that can be driven at a low voltage has not been obtained. In other words, in the case of doping ZnO with nitrogen, it is assumed to replace O (oxygen) to become an acceptor. Actually, however, even if ZnO is doped with nitrogen at a high concentration of $10^{19}$ cm$^{-3}$, it becomes insulating and does not turn into a p-type. This is assumed to be due to the following reasons.

Referring to FIG. 23(a) showing an explanatory view of a crystal structure of a ZnSe compound semiconductor, the ionization degree of Zn (black circle) and Se (white circle) are small, so that the bonding electrons of Zn and Se have a large probability of existence at a central portion of the bonding. Therefore, Se is stabilized not at a position right above Zn but in a twisted form, so that the crystal system will be cubic. However, since the ionization degree of ZnO is large, it will be near to $Zn^{+O}$ and $O^-$, whereby a Coulomb force acts between the two. Therefore, as illustrated in FIG. 23(b), O (white circle) is stabilized right above Zn (black circle) by action of the Coulomb force, so that the crystal system will be hexagonal (See, for example, Leading Device Material Handbook (edited by Electronic Data Communication Society, published by Ohm Co., Ltd., 1993), chapter 2, Fundamentals of Device Materials, pp. 29–30). Because of such a crystal structure, if a p-type dopant enters the position of a black circle, the dopant can easily enter if the compound semiconductor has a structure shown in FIG. 23(a), because the interatomic distance between the dopants is large due to the twisted relationship, whereas if the compound semiconductor has a structure shown in FIG. 23(b), the holes are localized at the position of N and do not spread over the entire crystal because the interatomic distance is small and the Coulomb attraction force is strong. Therefore, even if a p-type dopant is introduced, it does not function as a dopant. This seems to be the reason. Such a mechanism occurs in a ZnO-based compound semiconductor constituting a strongly ionic crystal, even if the dopant is not N.

Figure 24:
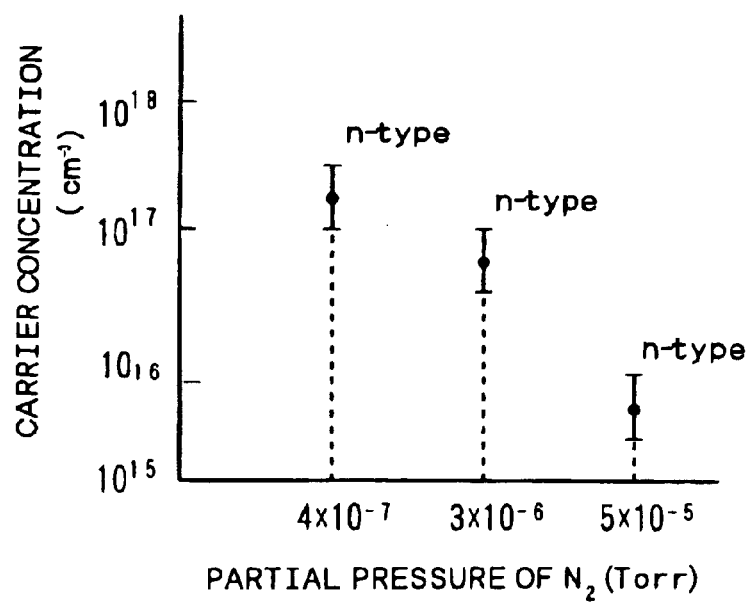
FIG. 24 is a view showing change in the carrier concentration against the doping amount when ZnO is doped with N for making it into p-type by an ordinary method.

FIG. 24 shows the result of examination of a carrier concentration when ZnO was doped with increased partial pressure of nitrogen in a plasma-excited nitrogen by increasing a nitrogen flux while actually growing ZnO in an MBE apparatus. Referring to FIG. 24, according as the partial pressure of nitrogen increases, the n-type carrier concentration decreases and ZnO becomes insulated, so that the measurement of holes was impossible. Here, on examining the grown semiconductor layer by SIMS (secondary ion mass spectroscopy) measurement, it has been confirmed that N has entered the semiconductor layer at an amount corresponding to the partial pressure.

As described above, unlike ZnSe, it is extremely difficult to make a ZnO-based compound semiconductor into p-type due to the interatomic attraction force based on its crystal structure, though ZnO is a Group II–VI compound semiconductor common to ZnSe. Therefore, even if a dopant is introduced, it does not function as a carrier, so that the ZnO-based compound semiconductor cannot be made into a p-type layer. For this reason, it is difficult to obtain a semiconductor light emitting device using a ZnO-based compound semiconductor, which can be handled with more easily than GaN or the like.

Figure 21:
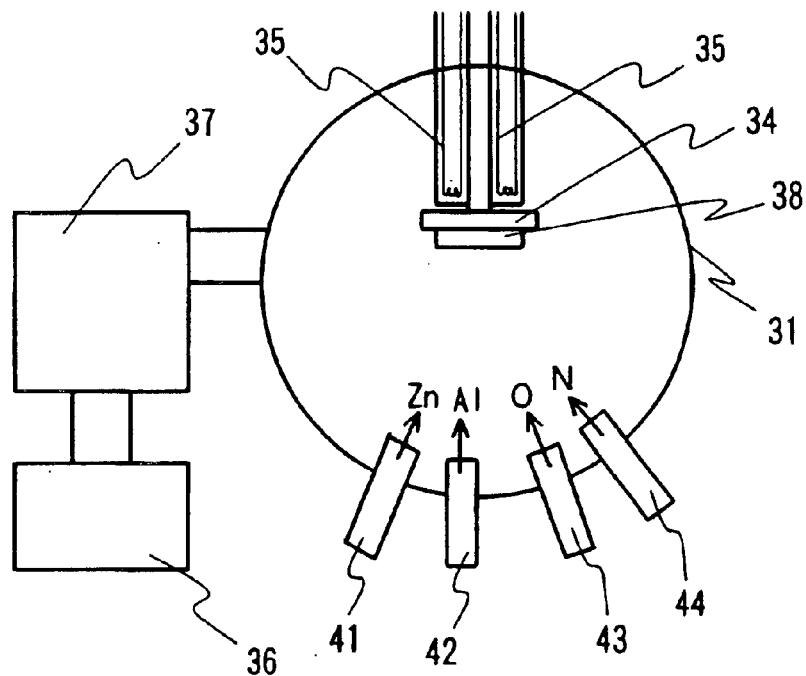
FIG. 21 is a schematic explanatory view of an MBE apparatus of an example for growing p-type ZnO.
Figure 21:
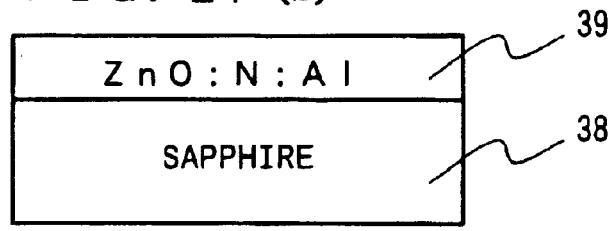

Referring to FIG. 21 showing a schematic view of an MBE apparatus according to an example of a crystal growth apparatus used for a growth method of the present invention, the method of growing a p-type ZnO-based compound semiconductor according to this example is characterized in that ZnO is epitaxially grown by radiating nitrogen, a Group VB element, as a p-type dopant from a plasma source 44 of excited nitrogen while radiating Al, a Group IIIB element, as a buffering agent from a source 42 of Al in epitaxially growing ZnO by radiating, for example, a source 41 of Zn and a plasma source 43 of excited oxygen towards a substrate 38 made of sapphire or the like.

In the apparatus shown in FIG. 21, the main chamber 31 is a chamber of an ordinary MBE apparatus, and is a tubular container capable of holding a super high vacuum, and it is connected to a gas-exhausting apparatus (not illustrated). A substrate holder 34 capable of holding a substrate 38 for growing a semiconductor layer is disposed in the inside thereof, and is adapted to heat the substrate 38 by means of a heater 35. Further, cell groups 41 to 44 including materials (sources) of the elements constituting the compound semiconductor to be grown and plasma sources as supplying sources of gases such as oxygen are disposed to oppose the substrate 38 held by the substrate holder 34. The main chamber 31 includes a load-locking chamber 36 for letting the substrate 38 in and out and a reserve chamber 37. The sources 41, 42 are made of crucibles similar to the conventional ones for supplying materials, and a heater (not illustrated) is disposed around the crucibles to allow evaporation of the sources of materials. Further, a shutter (not illustrated) is disposed and, by opening and closing the shutter, a desired material is supplied to the substrate 38 side. In the plasma sources 43, 44, an ECR (electron cyclotron resonance) that generated a plasma with a microwave is constructed so as to radiate the plasma-excited oxygen and nitrogen.

In this apparatus, while holding the substrate 38 made of sapphire in the substrate holder 34, a ZnO layer 39 (See FIG. 21(b)) is grown on the substrate 38 with the use of the source 41 of Zn and the plasma source 43 of excited oxygen. At this time, plasma-excited nitrogen is simultaneously radiated from the plasma-excited nitrogen source 44 as a p-type dopant, and Al is radiated from the source 42 of Al as a buffering agent for shielding against the Coulomb attraction force between ZnO and O or the dopant N so that the p-type dopant can be easily substituted for oxygen of ZnO and that the holes can move freely without being localized around the dopant after the p-type dopant is substituted. This grown state is shown in FIG. 21(b).

Figure 22:
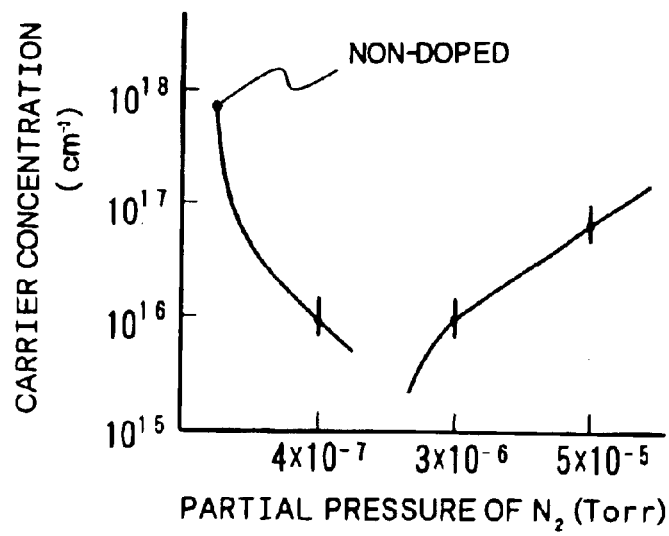
FIG. 22 is a view showing change in the carrier concentration against the dope amount of N in p-type ZnO grown by the p-type growth method of the present invention.
Figure 23:
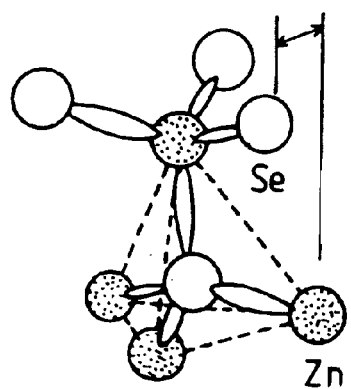
FIG. 23 is a view for explaining the reason why ZnO cannot be easily made into p-type.
Figure 23:
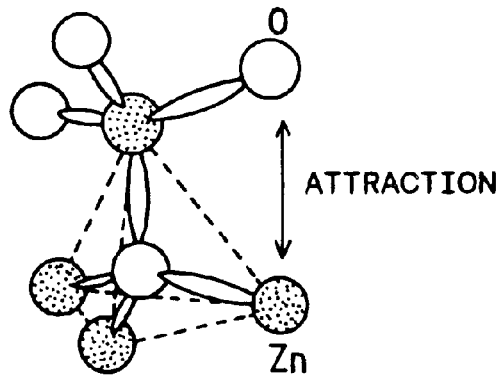

FIG. 22 shows a result of examination of the carrier concentration when the flux of nitrogen is changed. Here, in increasing the flux of nitrogen, the amount of evaporated Al was set to have a constant partial pressure of $5 \times 10^{-7}$ Torr. As will be apparent from FIG. 22, by using this method, the ZnO layer turned into p-type when the partial pressure of nitrogen was $3 \times 10^{-6}$ Torr, and a p-type having a carrier concentration around $10^{17}$ cm$^{-3}$ was obtained at a partial pressure of $5 \times 10^{-5}$ Torr.

The reason why the p-type ZnO is thus obtained seems to be as follows. Al acts to shield against the Coulomb attraction force between Zn and O to which the Coulomb attraction force acts on the basis of the hexagonal crystal structure, and N is substituted for O, whereby the holes are not localized at a position of the p-type dopant N due to the effect of shielding against the Coulomb potential. This allows the holes to overlap their wave functions with each other and to spread over the entire crystal.

In the previously described example, N was used as the p-type dopant; however, a Group VB element such as P, As, or Sb can be used in place of N. Further, Al was used as the buffering agent; however, a Group IIIB element such as B, Ga, In, or Tl can also be used in place of Al to turn ZnO into p-type.

Furthermore, the inventors of the present invention have grown ZnO using Na and K as p-type dopants and also introducing Cl as a buffering agent, yielding p-type ZnO having a carrier concentration of $2 \times 10^{17}$ cm$^{-3}$. Here, the partial pressures of Na and K were each $3 \times 10^{-5}$ Torr, and the partial pressure of Cl was $4 \times 10^{-6}$ Torr. Besides this, a Group IA element such as Li or Rb can likewise be used as the p-type dopant, and a Group VIIB element such as F, Br, or I can be used as the buffering agent in place of Cl. If such a Group IA element is used as the p-type dopant, it can be supplied as a solid source, thereby advantageously eliminating the need for a plasma source such as in the case of N.

The p-type layer of a blue (wavelength region from ultraviolet to yellow) LED chip using a ZnO-based compound semiconductor having a structure shown in FIG. 1 was formed by this method, and the other parts were formed in the same manner as in the previously described examples, yielding a LED with a low driving voltage. It is not limited to LED alone and an LD can likewise be produced in the same manner. This method can be applied to the p-type layer of each of the previously described structure examples.

According to this p-type growth method, since the series resistance of a p-type semiconductor layer can be reduced, the driving voltage can be lowered and also a LED having a high light-emission efficiency can be obtained. Further, in the case of an LD also, the threshold voltage can be lowered, and a semiconductor light emitting device with improved light-emission characteristics can be produced.

According to this example, a ZnO-based compound semiconductor can be turned into p-type, so that a semiconductor light emitting device such as a blue LED or LD having a short wavelength can be produced with a material that can be easily handled with, for example, a material that can be chemically processed.

Figure 25:
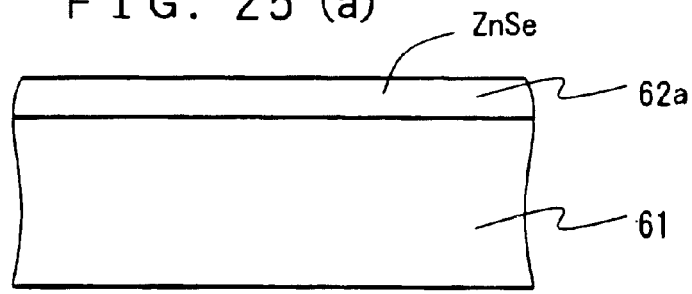
FIG. 25 is a cross-sectional view for explaining steps in growing p-type ZnSe on a substrate.
Figure 25:
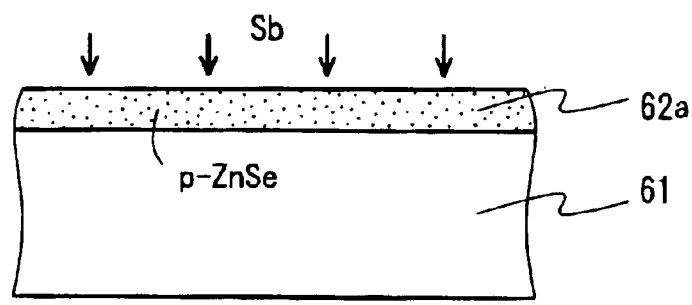
Figure 25:
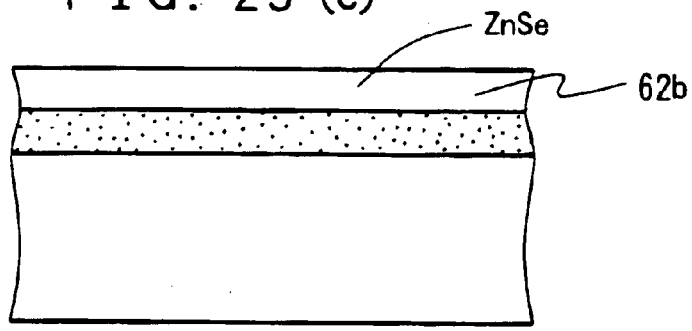
Figure 25:
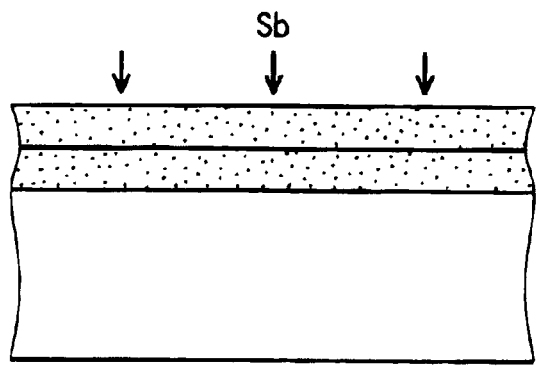
Figure 26:
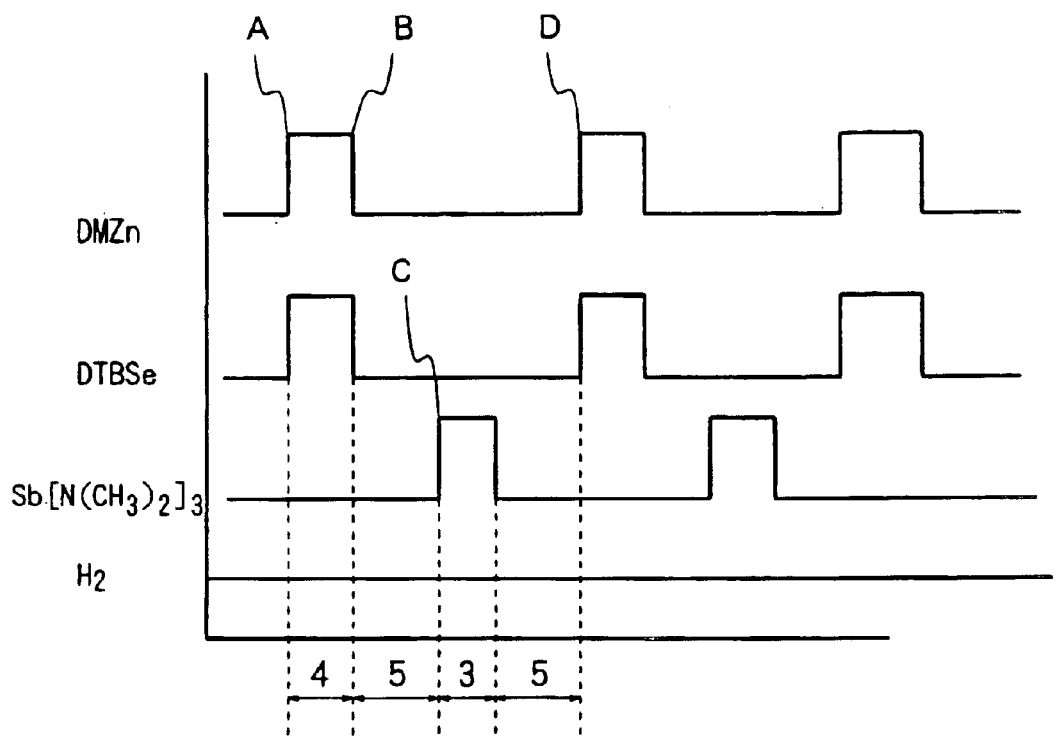
FIG. 26 is a view of a time chart for an introduced gas in growing a p-type semiconductor layer by the MOCVD method of the present invention.
Figure 27:
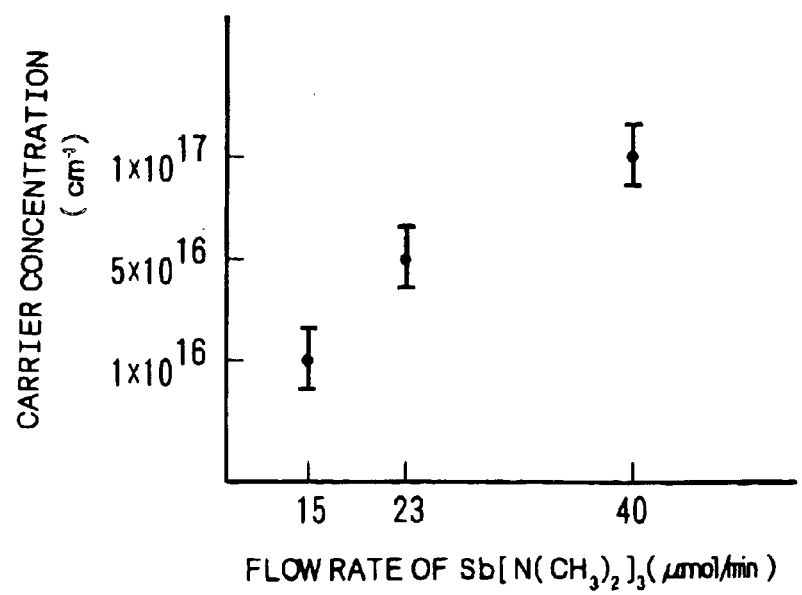
FIG. 27 is a view showing a relationship of the carrier concentration against the flow rate of a dopant gas in doping by the method of FIG. 25.

FIGS. 25 to 27 are explanatory views of another example in which a p-type layer is grown so that the carrier concentration of the p-type layer in a ZnO-based compound semiconductor will be high. Namely, as a gaseous-phase growth method of a semiconductor layer, the MOCVD method is used for production of a semiconductor light emitting device that requires mass production such as for CDs and DVDs and for communication due to the facts that the element can be grown to have a large area as compared with the MBE method and is excellent in uniformity, and the rise after maintenance is rapid. However, if one attempts to epitaxially grow a compound semiconductor such as described above by the MOCVD method, the p-type semiconductor layer cannot be grown to have a high carrier concentration. If the carrier concentration cannot be made high, the series resistance will be large, raising problems such as rise in the driving voltage, decrease in the light-emission efficiency, and heat generation caused by resistance. Therefore, it is requested to raise the carrier concentration of a p-type layer in view of reliability as well.

One of the reasons why the carrier concentration of a p-type layer cannot be raised with a GaN/AlGaN-based material, which is the aforesaid GaN-based compound semiconductor, is considered to be as follows. Namely, the hydrogen contained in a material gas seems to be combined with a p-type dopant to enter a semiconductor layer and the introduced material does not fully function as a dopant. For this reason, a production method is adopted in which, after the growth of a semiconductor layer, an annealing treatment is carried out to eliminate hydrogen combined with the dopant so as to maintain a function of the introduced material as a dopant.

However, a Group II-VI compound semiconductor such as a ZnSe/ZnMgSSe-based one or a ZnO-based one do not have a thermal stability such as in a GaN-based one, thereby raising a problem that, if an annealing treatment at 700° C. or more required in hydrogen elimination is conducted, the crystal structure will be broken, and also it is not possible to eliminate hydrogen later. On the other hand, according to the MBE method, since the reactor chamber is in high vacuum, a p-type semiconductor layer can be obtained with little influence of hydrogen. However, as described before, the MBE method has a problem that it is not suited for mass production.

The gaseous-phase growth method of a p-type compound semiconductor according to this example is characterized in that the p-type semiconductor layer is grown by alternately repeating a step of growing a thin film of the semiconductor layer by introducing a reaction gas for growing a compound semiconductor layer into a growth apparatus as shown in FIGS. 25(a) and (c), and a step of doping the semiconductor layer by introducing a dopant gas as shown in FIGS. 25(b) and (d) in epitaxially growing the p-type compound semiconductor layer by the MOCVD method. As a specific example, explanation will be given on an example of growing p-type ZnSe on a GaAs substrate.

First, a substrate 61 is set in an MOCVD apparatus, and the temperature within the apparatus is raised while allowing a carrier gas $H_2$ to flow at a flow rate of about 1500 to 2500 ml/min. Subsequently, when the substrate temperature has reached about 300 to 500° C., a buffer layer of GaAs is grown. Thereafter, the temperature is lowered to 250 to 450° C., and the first crystal layer 62a of ZnSe is grown by introducing dimethylzinc (DMZn) at a flow rate of 2 to 10 μmol/min as a reaction gas of Group II element Zn and introducing di-tertiary-butylselenium (DTBSe) at a flow rate of 30 to 120 μmol/min as a reaction gas of a Group VI element each for about 4 seconds for reaction, as shown in the timetable of FIG. 26 (See FIG. 25(a)). The thickness of the first crystal layer 62a grown in 4 seconds is about 5 to 20 nm. Thereafter, as shown by B in FIG. 26, the reaction gases are stopped and, while allowing only the carrier gas $H_2$ to flow, the layer is left to stand for 5 seconds, thereby to purge the reaction gases. During this period, the carrier gas $H_2$ is kept flowing.

Then, as shown by C in FIG. 26, the first crystal layer 62a is doped with a dopant Sb by introducing tridimethylaminoantimony $Sb[N(CH_3)_2]_3$ as a p-type dopant at a flow rate of 5 to 100/μmol/min and allowing it to flow for about 3 seconds (See FIG. 25(b)). The carrier concentration by doping at this time is such that the carrier concentration increases according as the flow rate increases, as shown by the relationship between the flow rate and the carrier concentration in FIG. 27. As a result, the p-type carrier concentration can be adjusted by adjusting the flow rate of the dopant gas. During this period, the carrier gas is constantly kept flowing at the same flow rate.

Then, the dopant gas is stopped and, after about five seconds have passed, the reaction gases DMZn and DTBSe are allowed to flow into the growth apparatus again at flow rates similar to the aforesaid ones, as shown by D in FIG. 26, to grow the second crystal layer 62b to a thickness of about 5 to 20 nm, as shown in FIG. 25(c). When the second crystal layer 62b is grown by allowing the reaction gases to flow for about 4 seconds, the reaction gases are stopped and, in the same manner as described before, the reaction gases are purged for about 5 seconds. Thereafter, the dopant gas $Sb[N(CH_3)_2]_3$ is introduced for about 5 seconds to dope the second crystal layer 52b with a p-type dopant Sb in a similar manner, as shown in FIG. 25(d).

By repeating the growth of the crystal layers and doping with the p-type dopant, the p-type ZnSe is grown to a desired thickness. As a result, the p-type semiconductor layer can be grown.

According to this method, since the p-type dopant is not introduced simultaneously with the reaction gases, there are fewer free floating hydrogen atoms generated by decomposition of the reaction gases, and the atoms of the dopant are hardly combined with hydrogen atoms, so that the semiconductor layer is doped with the dopant atoms in their atomic state. As a result, even if an annealing treatment for expelling the hydrogen atoms is not carried out after the growth of the semiconductor layer, the elements introduced into the semiconductor layer by doping can fully function as a dopant. As a result, the electric conductivity increases to reduce the series resistance.

The growth method of a p-type layer according to this example is characterized by doping the semiconductor in a state in which the dopant is not combined with hydrogen atoms. For this reason, in introducing the dopant gas, the dopant gas is introduced in a state in which the reaction gases are absent by stopping the reaction gases, as described above. However, there are cases in which the reaction gases cannot be completely eliminated in a short period of time by simply stopping the reaction gases. In such a case, the reaction gases can be positively expelled by introducing an inert gas simultaneously with stopping the reaction gases, whereby the reaction gases can be purged in a short period of time. It is inexpensive and convenient to use nitrogen gas as the inert gas; however, a rare gas of Group 0 such as Ar can be used as well. The reaction can be expelled with more certainty by introducing a gas having a molecular weight as large as possible.

In the case of purging by introducing an inert gas, the carrier gas can also be an inert gas simultaneously. This is preferable because the hydrogen atoms can be purged completely from the reaction apparatus with more certainty. However, being a molecule of $H_2$, hydrogen serving as the carrier gas does not easily combine with the elements of the dopant, so that there will not be a great problem even if the carrier gas is left as it is.

Free hydrogen atoms in the reaction apparatus are liable to be generated by separation if they are, for example, directly combined with the elements of the reaction gas. For this reason, the reaction gas to be used is preferably an organic metal material having a structure that does not combine with hydrogen atoms. Namely, in organic metal compounds, hydrogen atoms have stable bonding as hydrogen groups and, even if the reaction gas is decomposed to isolate metal elements, the other elements are present as hydrocarbon groups, so that hydrogen atoms do not become free alone. Therefore, even if the hydrocarbon groups become free, they are not easily combined with the elements of the dopant, so that there is little possibility of taking the hydrogen atoms in. If such a reaction gas is used, a p-type semiconductor layer having a sufficiently high carrier concentration can be obtained even if the reaction gas has not been completely purged. On the other hand, H,S or the like that combines directly with hydrogen atoms produce H+immediately after separation, so that it combines easily with the elements of the dopant. Such a reaction gas of a Group II or Group VI element that is not directly combined with hydrogen atoms may be, for example, diethyl sulfide, (DES), dimethyl sulfide (DMS), diethyl disulfide $DES_2$), dimethyl disulfide ($DMS_2$), diisopropyl sulfide (i-$C_3H_7$)$_2$S), or the like. Here, in the case of Se, a reaction gas in which the above S is substituted with Se can be used.

Further, from similar viewpoints, the p-type dopant also is preferably a material that is not directly combined with hydrogen. A Group Vb element is used as a p-type material of the compound semiconductor, and a material without having a structure in which the Group Vb element is directly combined with hydrogen may be, for example, tridimethylamino phosphide $P[(CH_3)_2N]_3$, tridimethyl-amino arsine $As[(CH_3)_2N]_3$, diethyl-amino-diethyl-arsine $(C_2H_5)_2As[N(C_2H_5)_2]$, bisdiethyl-amino phosphine chloride $[(CH_3)_2N]_2PCl$, plasma $N_2$, or the like besides the aforementioned $Sb[N(CH_3)_2]_3$.

The previously described example is directed to turning a Group II–VI compound semiconductor into p-type, and is especially effective because Group II–VI compounds cannot be subjected to an annealing treatment for expelling hydrogen because they cannot withstand a high temperature. However, even with other compound semiconductor, such as a GaN-based compound semiconductor, that combines with hydrogen atoms and cannot be turned into p-type, a p-type semiconductor layer having a larger concentration than those subjected to an annealing treatment can be obtained without performing an annealing process.

By the invention of this growth method, the carrier concentration of a p-type semiconductor layer can be increased by using the aforesaid method when each semiconductor layer is laminated by a step similar to an ordinary one to grow the p-type semiconductor layer in manufacturing a semiconductor light emitting device such as a light emitting diode or a laser diode with the use of a GaN-based or Group II–VI compound semiconductor, so that the operation voltage (threshold voltage) can be lowered and also the light-emission efficiency is improved.

According to this method, a sufficiently activated p-type semiconductor layer can be obtained even with the use of a compound semiconductor in which dopants combine with hydrogen atoms and cannot function fully as a p-type dopant when it is grown by the MOCVD method. As a result, a p-type semiconductor layer having a large carrier concentration and having a small series resistance can be produced in a large amount by the MOCVD method, so that a semiconductor light emitting device having a short wavelength such as blue can be made to emit light with a high light-emission efficiency and at a low operation voltage.

FIGS. 28 to 31 are views for explaining another crystal growth method of an oxide compound semiconductor. Namely, as a growth method of ZnO, the MOCVD method, the MBE method, the LA (laser ablation) method, or the like can be used. However, the MOCVD method is not preferable for forming a film of a light emitting device material because the surface state is extremely poor though it is used forming a transparent conductive film for a solar cell. Further, the LA method is a method of sublimating (ablating) a target material to form a film on a substrate by intermittently irradiating a sintered target with a high-output pulse laser (He-Kd laser or the like), and is used for oxide superconductors. However, if an attempt is made to form a film of ZnO for forming a light emitting device with this method, it is not preferable for the growth for a light emitting device, because of poor purity of the material due to the use of a target made of a sintered ZnO powder, necessity of preparing a number of targets corresponding to the composition of each layer, such as a cladding layer or an active layer, required in the light emitting device, and difficulty in controlling the composition due to separation of a metal component during the ablation, and others.

Further, according to the MBE method, if a gas source is to be used as a material source, it must be supplied after decomposing it into atoms. Therefore, a plasma source must be added. However, if oxygen is decomposed into oxygen atoms by a plasma, ions such as $O_2$ ions and O ions, and a large amount of charged particles such as electron beams are generated because the energy of plasma excitation is large. If these charged particles are radiated onto a substrate, they cause the surface of the substrate to be charged to inhibit the crystal growth or produce an adverse effect of etching the formed ZnO film, thereby generating crystal defects and failing to provide a semiconductor layer having a good crystallinity. For this reason, there is a problem that a ZnO-based compound semiconductor cannot be grown with good crystallinity by using any of these methods if one wishes to produce a semiconductor light emitting device using an oxide compound semiconductor such as a ZnO-based one. FIGS. 28 to 31 are directed to growth of oxide compound semiconductor such as a ZnO-based compound by solving such a problem.

Figure 28:
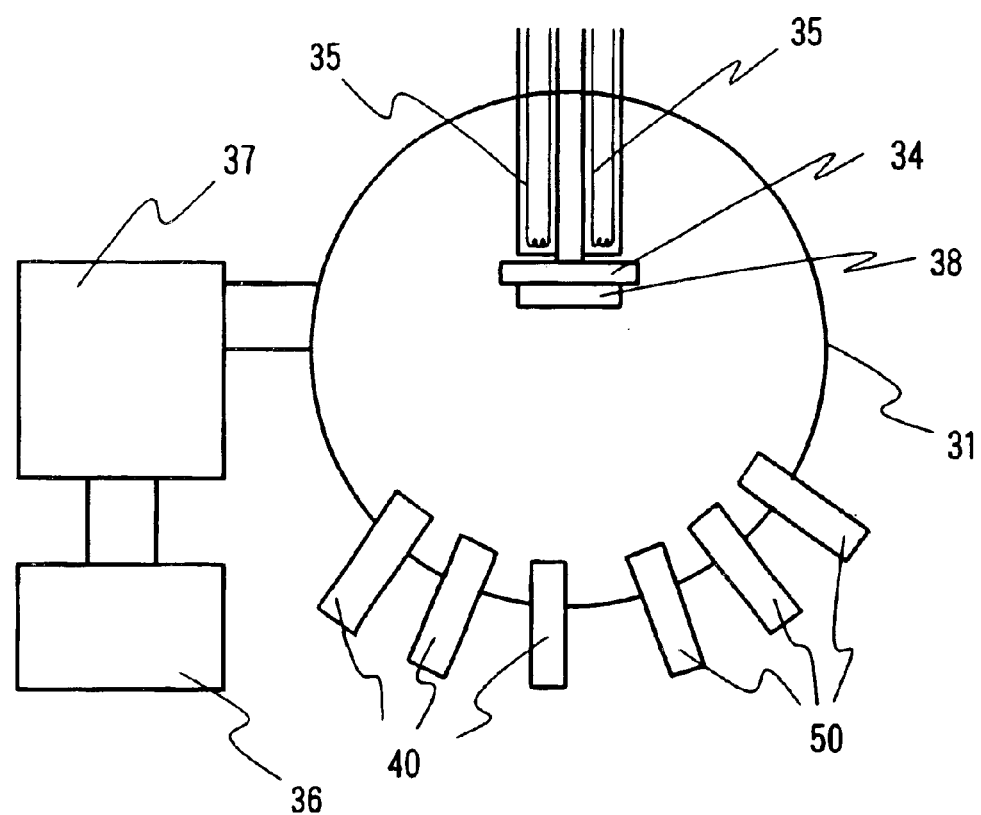
FIG. 28 is a schematic explanatory view of an example of a crystal growth apparatus according to the present invention.

Referring to FIG. 28 schematically illustrating an embodiment of a growth apparatus for growing ZnO, a crystal growth apparatus of oxide compound semiconductor according to this example includes a substrate holder 34 disposed in a main chamber 31, a cell group 40 disposed to be capable of radiating elements constituting the compound semiconductor towards the substrate 38 held by the substrate holder 34, and a plasma source 50 for radiating a plasma. Further, an electromagnetic field applying apparatus for applying an electric field and/or a magnetic field is disposed at least in the vicinity of an opening 55 (See FIG. 29) for radiating the plasma of the plasma source 50.

The main chamber 31 is a chamber of an ordinary MBE apparatus having the same structure as the previously described structure of FIG. 21, and is a tubular container capable of maintaining a super high vacuum and connected to a gas-exhausting apparatus (not illustrated). Further, the substrate holder 34 for holding the substrate 38 for growing the semiconductor layer is disposed in the inside thereof, and is adapted to heat the substrate 38 by means of a heater 35. Further, the cell group 40 containing materials (sources) of the elements constituting the compound semiconductor to be grown and the plasma source 50 serving as a source of supplying gases such as oxygen are disposed to oppose the substrate 38 held by the substrate holder 34. A load-locking chamber for letting the substrate in and out and a reserve chamber 37 are disposed in the main chamber 31.

The cell group 40 is a source composed of a crucible or the like that supplies materials similar to the conventional ones, and is adapted to evaporate the material sources by disposing a heater (not illustrated) around the crucible, and also a shutter (not illustrated) is disposed in the front so that the desired materials will be supplied to the substrate 38 side by opening and closing the shutter.

Figure 29:
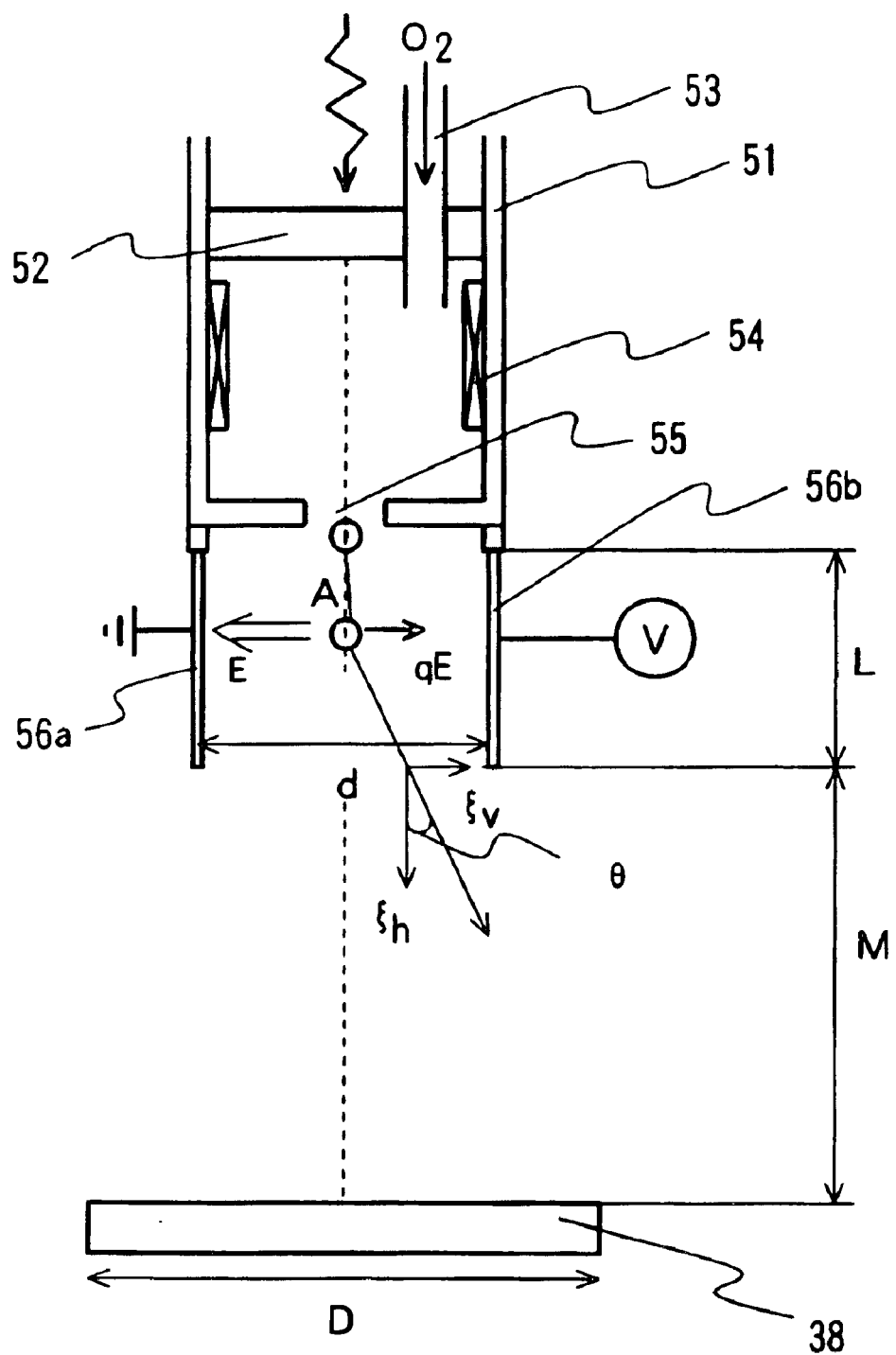
FIG. 29 is an enlarged explanatory view of a plasma generating source 50 in the growth apparatus of FIG. 28.

Referring to FIG. 29 showing an enlarged view of an ECR (electron cyclotron resonance) as an example of an oxygen plasma source, the plasma source 50 is constructed in such a manner that the front of a rectangular parallelopiped tube capable of propagating a microwave is partitioned by a quartz window 52 or the like for transmitting the microwave therethrough, whereby oxygen is introduced to the tip end portion of the tube 51 by means of an oxygen introducing tube 53. Further, magnets 54 for generating a magnetic field are disposed opposite to each other on the side wall of the tip end of the tube 51 to which oxygen is introduced, and is constructed in such a manner that the charged particles rotate around the magnetic field and the rotation movement is amplified by the microwave to generate an oxygen plasma. A small opening 55 is disposed on the tip of the tip end portion of the tube 51, whereby the generated oxygen plasma is discharged through the opening 55. The plasma source for supplying nitrogen and other sources are constructed in the same manner.

The plasma source 50 has the same construction as the construction of a conventional plasma source. However, the plasma source 50 of the present invention is characterized by being constructed in such a manner that, as shown in FIG. 29, a pair of parallel plate electrodes 56a and 56b are disposed on the outlet side of the opening 55 through which the plasma oxygen is discharged; a voltage, for example, of about 0.5V is applied to the electrodes 56a, 56b; and if any charged particles A are present, they are deviated to be warped so as not to reach the substrate 38 or are captured by the electrodes 56. When the length L and the interval d of the parallel plate electrodes 56 are determined, an applied voltage is determined as follows.

Referring to FIG. 29, the distance between the tip end of the electrodes 56 and the surface of the substrate 38 is assumed to be M; the diameter of the substrate 38 is assumed to be D; and the angle by which the charged particles A are bent by the voltage applied to the electrodes 56 is assumed to be θ.

In order to prevent the charged particles A from arriving in the substrate 38, the following must be satisfied, assuming that the opening 55 is very small as compared with the diameter of the substrate 38.

$$M \cdot \tan \theta > D/2 \quad (1)$$

Since the force acting on the charged particles A in the parallel plate electrodes 56 is represented by q·V/d (Newton), where the amount of electric charge of the charged particles A is q (Coulomb) and the applied voltage is V (Volt), the following relationship holds between the velocity $\xi_v$ in the vertical direction and the velocity $\xi_h$ in the horizontal direction at the outlet of the parallel plate electrodes 56, where the mass of the charged particles A is m.

$$\xi_v = q \cdot V \cdot L/(m \cdot \xi_h \cdot d) \quad (2)$$

$$\tan \theta = \xi_v/\xi_h = q \cdot V \cdot L/(m \cdot \xi_h^2 \cdot d) \quad (3)$$

By substituting the equation (3) for the inequality (1), $$V > D \cdot m \cdot \xi_h^2 \cdot d/(2q \cdot M \cdot L) \quad (4)$$

Assuming that the velocity distribution of the charged particles is a Boltzmann distribution, the average velocity $\xi_{ave}$ is represented as follows, where the Boltzmann constant is k and the absolute temperature is T.

$$\xi_{ave} = (2k \cdot T)^{1/2}/(\pi \cdot m) \quad (5)$$

Assuming that $\xi$ is approximately equal to $\xi_{ave}$, $$V > D \cdot d \cdot k \cdot T/(\pi \cdot q \cdot M \cdot L)$$

The energy of charged particles is generally held to be on the order of several eV in glow discharge or the like. Therefore, assuming that this applies also to the present case, the plasma temperature will be about ten thousand K. Assuming that the ion seed is O, and M=20 cm, L=1 cm, D=5 cm, and q=1.6×10$^{19}$ Coulomb, the following holds from the inequality (4).

$$V > 0.206 \text{ (Volt)}$$

Thus, an approximate value of the applied voltage can be determined. A truly suitable value can be determined by measuring the electric current value caused by ions flowing into the parallel plate electrodes. However, if an excessively large voltage is applied, there is a possibility that the electric discharge is generated between the electrodes 56, so that voltages of more than 900 to 1000 V/cm are not preferable, though it depends on the apparatus.

Figure 30:
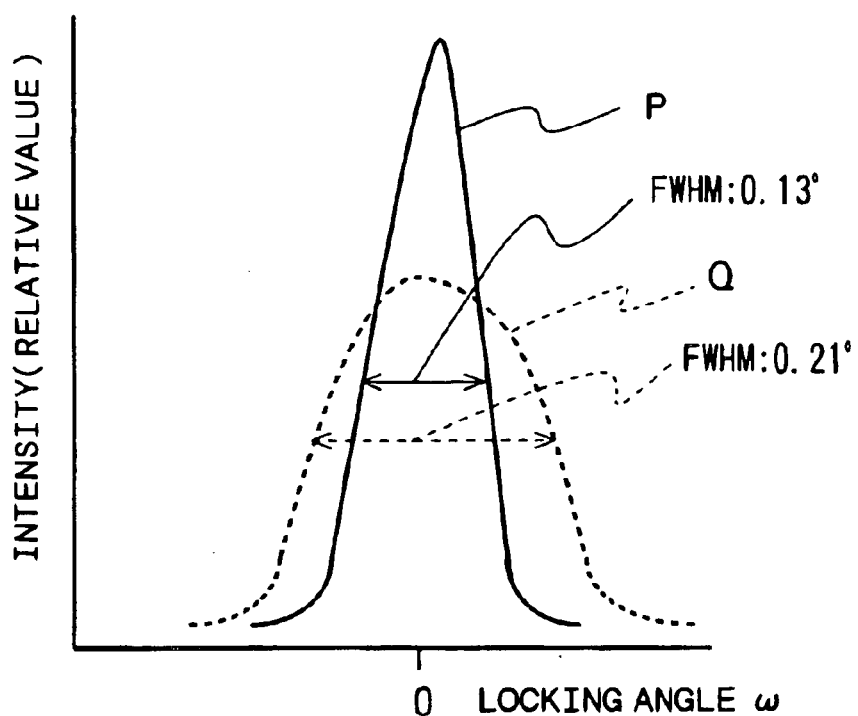
FIG. 30 is a view showing an X-ray locking curve of a semiconductor layer grown by the apparatus of FIG. 28, as compared with the layer grown by a conventional method.

FIG. 30 shows a result of measurement of X-ray locking curves when a voltage is applied and when a voltage is not applied. As will be apparent from FIG. 30, according to the method P of applying a voltage of the present invention, the half value width is narrowed from 0.21° to 0.13° as compared with the value of a conventional method Q, thereby showing an improvement in crystallinity.

Further, Table 2 shows the result of measurement of holes in non-doped ZnO. As will be apparent from Table 2, the carrier concentration is reduced to the order of $10^{17}$ cm$^{-3}$ by application of the voltage of the present invention, in contrast to the carrier concentration of about the latter half of the order of $10^{18}$ cm$^{-3}$ when a conventional growth was carried out without application of a voltage. In other words, the carrier concentration of non-doped ZnO is considered to be due to deletion of O and it is found out that, according to the method of the present invention, deletion of O is reduced to improve the crystallinity.

TABLE 2

| | Carrier Concentration | |
|---|---|---|
| Sample No. | Present invention | Conventional |
| 1 | 6.4 × 10$^{17}$ | 8.1 × 10$^{18}$ |
| 2 | 6.5 × 10$^{17}$ | 8.7 × 10$^{18}$ |
| 3 | 7.1 × 10$^{17}$ | 9.8 × 10$^{18}$ |
| 4 | 7.2 × 10$^{17}$ | 9.2 × 10$^{18}$ | unit: /cm$^3$
applied voltage: 200 V/cm$^3$

Figure 31:
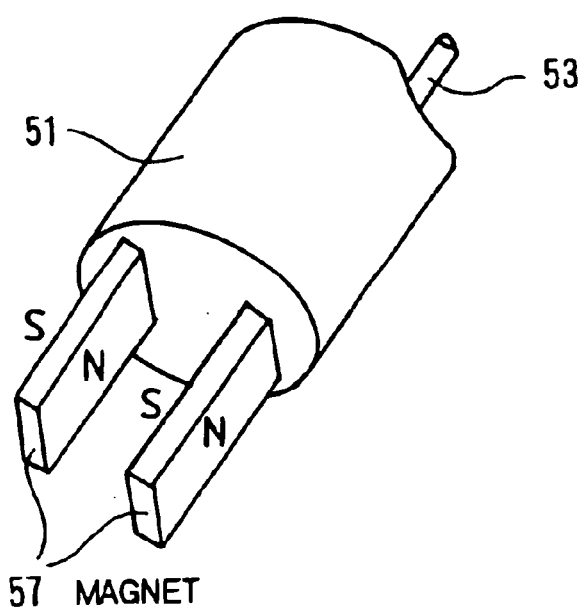
FIG. 31 is an explanatory view of a modified example of FIG. 29.

FIG. 31 shows another structure example of this growth method. This example is constructed in such a manner that a pair of magnets 57 are disposed in the vicinity of an opening through which plasma oxygen is discharged, and a magnetic field is applied instead of the aforesaid application of an electric field. When a magnetic field is applied to charged particles A, the charged particles A receive a Lorentz force in the direction perpendicular to their moving direction by the magnetic field, and are bent in the direction of rotation around the magnetic field. By this bending, the moving direction of the charged particles is deviated, thereby to prevent the charged particles from directly hitting the substrate. An X-ray locking curve and a carrier concentration of non-doped ZnO were measured also by this method. The result showed improvements in both, similar to those described before, and it has been confirmed that an improvement in crystallinity has been made.

Thus, in the growth method of an oxide compound semiconductor according to the present invention, an apparatus such as described above is used for introducing the constituent elements of the oxide compound semiconductor and oxygen in a plasma state, and crystals of the oxide compound semiconductor are grown while removing or deviating charged particles generated in a plasma by application of an electric field or a magnetic field to prevent the aforesaid charged particles from being radiated directly onto the aforesaid substrate. By doing so, even if charged particles are generated as described above, the charged particles are removed by being bent to a place where the substrate for growing the semiconductor crystals is absent. As a result, only non-charged radical oxygen reaches the substrate and, being a radical, the oxygen easily reacts and combines with other elements on the substrate to grow as oxide on the substrate. Further, since the charged particles do not enter directly onto the substrate, the surface of the semiconductor layer grown on the substrate surface will not be charged and defects due to the charged particles are not generated, whereby a semiconductor crystal having an extremely excellent crystallinity can be grown.

According to this example, the crystal growth of an oxide compound semiconductor such as ZnO, by which it is conventionally difficult to obtain a semiconductor layer having an excellent crystallinity, can be carried out with an extremely good crystallinity. As a result, a blue light emitting device having a short wavelength using an oxide compound semiconductor such as ZnO can be realized with a new material, thereby contributing to the development of blue semiconductor light emitting devices to a greater extent.

Figure 32:
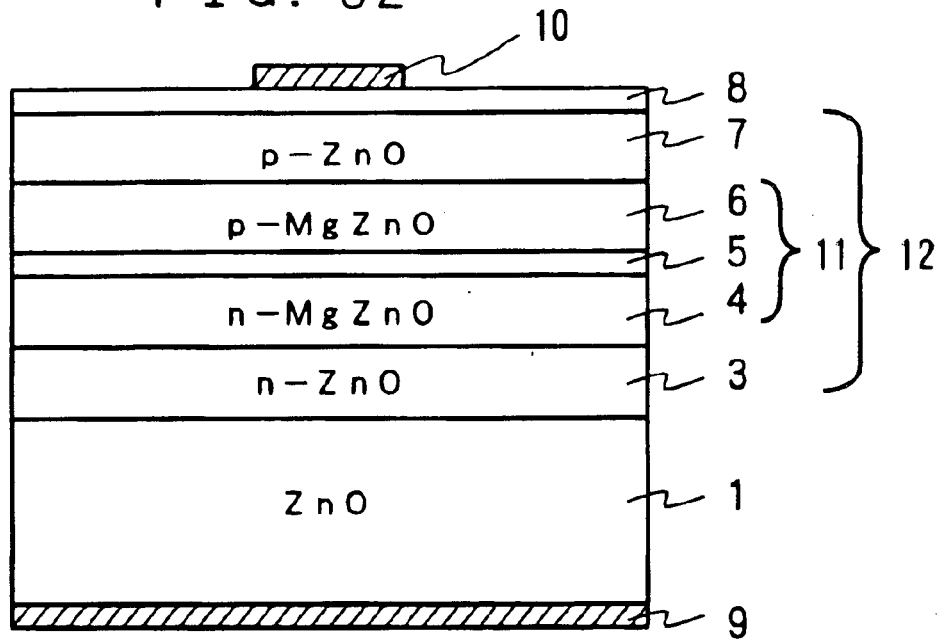
FIG. 32 is a cross-sectional explanatory view of still another embodiment according to the present invention.
Figure 33:
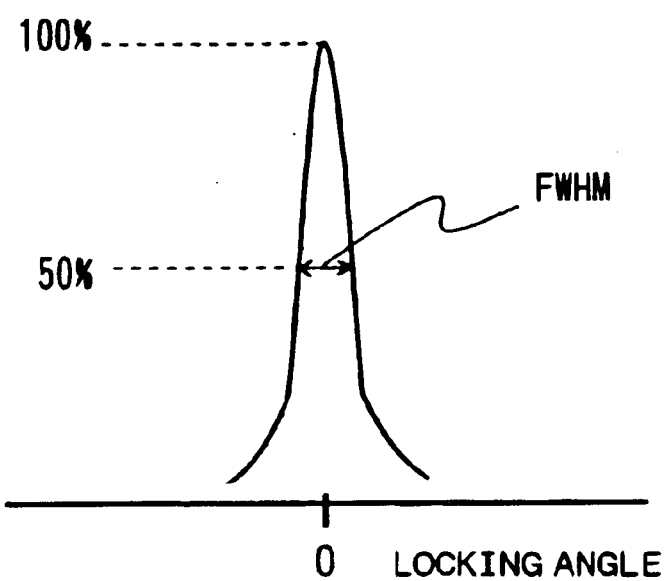
FIG. 33 is an explanatory view of an X-ray locking curve when a crystal state is examined by X-ray diffraction.

FIGS. 32 to 33 are explanatory views of another example for growing a ZnO-based compound semiconductor layer having a good crystallinity. Originally, the crystal growth of this compound semiconductor proceeds by physical or chemical reaction of two or more kinds of atoms or molecules in a certain temperature region. At this time, a movement (migration) is needed in which different kinds of atoms being in contact on a substrate surface move to fill the crystal defects of each other. Without this movement, crystals grow faster in the inherent direction in which the crystals are liable to grow, so that the crystal growth proceeds while the crystal defects are maintained. Construction of a light emitting device with such a semiconductor layer having crystal defects causes decrease in the light-emission efficiency or decrease in the reliability of the element.

Migration is prompted in a state in which a compound is neither molten nor solidified. Therefore, there is a close relationship between a temperature suitable for migration and a temperature of growing crystals. Table 3 summarizes, for example, a relationship between a melting temperature and a generally conducted growth temperature of a compound semiconductor used as a conventional semiconductor light emitting device.

TABLE 3

Melting Temperature and Growth Temperature of Compound Semiconductor

| Material | Melting Temperature (° C.) | Growth Temperature (° C.) | |
|---|---|---|---|
| | | MOCVD | MBE |
| GaAs | 1238 | ≈650 | 650 to 700 |
| GaP | 1465 | ≈650 | — |
| InP | 1070 | ≈650 | — |
| GaN | not less than 1700 | ≈1050 | 700 |
| ZnS | 1020 | 350 | 400 to 500 |
| ZnSe | 1100 | 350 | 400 to 500 |
| ZnO | not less than 1980 | ≈400 | 300 to 350 |
| CdO | not less than 1500 | ≈400 | 200 to 250 |
| MgO | 2826 | ≈400 | 400 to 450 |

As will be apparent also from Table 3, for conventional growth of compound semiconductor, a standard relationship of epitaxial growth temperature/melting temperature is empirically considered to be about ¾ to ⅘. The melting point of ZnO is considered to be more than about 1980° C., so that epitaxial growth of ZnO must be carried out ideally at about 1500° C., and it is preferable to grow ZnO at a temperature as high as possible.

However, if one wishes to epitaxially grow a ZnO-based compound semiconductor with an MBE apparatus as described before, it is not possible to raise the crystal growth temperature because the vapor pressure of Zn atoms is high. For this reason, it is grown at about 300 to 350° C., whereby the aforesaid migration does not occur and the crystal growth proceeds only in the longitudinal direction, so that a grain boundary is liable to be generated in crystals. This example is directed to an improvement on this point.

The inventors of the present invention have repeatedly made eager studies in order to grow a ZnO-based compound semiconductor with good crystallinity and found out that, since the bonding energy of Zn with hydrocarbon is high, the evaporation of Zn can be prevented even if the temperature of crystal growth is raised, and have found out that a ZnO-based compound semiconductor layer having an excellent crystallinity can be obtained by growing it at a high temperature of about 600 to 700° C.

In a ZnO-based compound semiconductor light emitting device according to this example, a light emitting layer forming portion 11 that forms a light emitting layer by lamination of ZnO-based compound semiconductor layers is disposed on a substrate 1, as illustrated in FIG. 32 showing a cross-sectional explanatory view of a LED chip as an examples thereof. Further, it is characterized in that a C (carbon) element is contained in the ZnO-based compound semiconductor layers.

Each of the semiconductor layers in the light emitting layer forming portion 11 is formed to have a composition similar to those of each of the previously described examples, and their explanation will be omitted by denoting like parts with like reference numerals. In this example, however, an organic metal compound of Zn is used in growing these semiconductor layers, so that the bond of Zn with C is strong, and C remains also in the semiconductor layers. Also, evaporation of Zn can be prevented by bonding of C and Zn during the epitaxial growth of the semiconductor layers at a high temperature, so that a semiconductor layer having a good crystallinity can be grown at a high temperature. Further, in the example shown in FIG. 32, an n-type ZnO substrate, for example, is used as the substrate 1. However, it is not limited to ZnO alone, and it is possible to use a substrate of sapphire, GaN, GaP, SiC, or the like. The other structures are the same as in each of the previously described examples. However, like the aforesaid ZnO-based compound semiconductor layers, an organic metal compound of Zn is used in growing n-type and p-type contact layers 3, 7, so that the bond of Zn with C is strong, and C remains also in the semiconductor layers. Also, evaporation of Zn can be prevented during the epitaxial growth of the semiconductor layers at a high temperature, so that a semiconductor layer having a good crystallinity can be grown at a high temperature.

Thus, this example is characterized in that the ZnO-based compound semiconductor layers are grown by using an organic metal compound of Zn as a material of Zn. In other words, in a conventional case of growing a ZnO-based compound semiconductor with the use of an MBE apparatus, it is grown on a substrate by supplying plasma oxygen to the substrate to attain a vapor pressure (partial pressure) of about $1 \times 10^{-6}$ to $1 \times 10^{-5}$ Torr while radiating Zn as a source metal onto the substrate so that its vapor pressure (partial pressure) will be about $1 \times 10^{-6}$ to $5 \times 10^{-8}$ Torr. However, owing to the high vapor pressure of Zn, if the growth temperature of the substrate is raised too much, the vapor pressure will be too high, and the ratio of the two will be unbalanced, so that ZnO does not grow. For this reason, the conventional growth of ZnO had to be carried out at a low temperature of about 300 to 350° C. However, in the present invention, since an organic metal compound such as dimethylzinc is used as a material of Zn, the temperature of separation between zinc and hydrocarbon will be as high as 450° C. or more, and ZnO can be grown at a high temperature. Moreover, when the organic metal compound is decomposed, the bond between Zn and C is not separated easily though hydrogen is separated because carbon and hydrogen in hydrocarbon are easily separated. Therefore, Zn and C in the bonded state combine with O to grow a ZnO-based compound semiconductor. As a result, ZnO containing C grows and, even in the case of high temperature growth, evaporation of Zn can be prevented on the basis of the bond between C and Zn.

Next, the production method of this LED will be explained. A substrate 1 made of ZnO or the like is set, for example, in an MBE apparatus; the temperature of the substrate 1 is set to be about 600 to 700° C.; and dimethylzinc ($Zn(CH_3)_2$) is radiated from a cell so as to attain a vapor pressure of about $1 \times 10^{-6}$ to $5 \times 10^{-8}$ Torr while radiating plasma oxygen. Through this process, dimethylzinc is decomposed by the temperature to become $Zn(CH_2)_2^{2+}$ by separation of hydrogen, and combines with $O^{2-}$. Then, H is further separated or C is further separated to grow ZnO containing C. Here, ZnO can be grown to a desired thickness by controlling the period of time for growth. Further, as an n-type dopant, trimethylaluminum (TMA) can be radiated to attain a vapor pressure of about $1\times10^{-9}$ Torr for doping.

Subsequently, in order to grow an n-type cladding layer 4, the shutter of a cell of cyclopentadimethylmagnesium $Cp_2Mg$ is further opened as a source of Mg to radiate an organic metal compound of Mg. By controlling the vapor pressure of $Cp_2Mg$, the crystal mixing ratio of Mg and Zn can be controlled. For example, by setting the vapor pressure to be about $5\times10^{-6}$ to $5\times10^{-8}$ Torr, $Mg_{0.15}Zn_{0.85}O$ can be grown.

Next, in order to grow the active layer 5, the cell of $Cp_2Mg$ and the cell of the dopant TMA are closed, and the shutter of dimethylcadmium (DMCd), which is a source of Cd, is opened to radiate DMCd to continue the growth in the same manner. Further, a p-type cladding layer 6 and a p-type contact layer 7 are grown in the same manner to grow a semiconductor laminate section 12. Here, in order to obtain p-type, they were formed by simultaneous doping with plasma-excited $N_2$ and TMA.

Thereafter, the wafer on which the epitaxial growth has been carried out is taken out from the MBE apparatus, and is put into a sputtering apparatus to form a transparent conductive film ITO to a thickness of about 0.15 μm to provide a transparent electrode 8. Then, the rear surface of the substrate 1 is ground to a thickness of about 100 μm; an n-side electrode 9 made of Ti/Au or the like is formed over the entire rear surface of the substrate 1 by vacuum vapor deposition or the like; and a p-side electrode 10 made of Ni/Al or the like is formed on the transparent electrode 8 by vacuum vapor deposition or the like using, for example, the lift-off method. Thereafter, the wafer is made into chips to produce a LED chip shown in FIG. 32.

When ZnO was grown by such a method, the degree of O defects decreased to about $8\times10^{16}$ cm$^{-3}$, in contrast to the carrier concentration of $5\times10^{18}$ cm$^{-3}$ when ZnO was grown without doping by a conventional method (In the case of ZnO, o defects are liable to be generated in growing crystals, so that non-doped ZnO will be n-type if the crystallinity is poor). Further, the state of the grown semiconductor crystals was examined by X-ray analysis using a locking curve plotted against the rotation angle ω of the substrate as shown in FIG. 33, from which it will be understood that, while the FWHM (full width at half maximum; full angle at half value, see FIG. 33) of ZnO grown at a low temperature by a conventional method was 0.015°, the FWHM of ZnO grown at a high temperature by the aforesaid method had an extremely small value of 0.003°, thereby showing an improvement in crystallinity.

In the previously described example, materials of metals other than Zn were also organic metal compound materials. However, for Mg having a low vapor pressure, a metal source similar to a conventional one may be used. Further, in the previously described example, dimethylzinc was used as an organic metal compound of Zn. However, besides this, diethylzinc or the like can be used. Further, in the previously described example, the light emitting layer forming portion 11 had a double heterojunction structure in which the active layer was sandwiched between cladding layers made of materials having a larger band gap energy than the active layer. However, it may be constructed with a pn-junction, a MIS structure (metal-insulating layer-semiconductor layer), or the like. Furthermore, although the previously described example was directed to a LED, an LD having a structure of any of the previously described examples may be produced.

According to this example, an organic metal compound of Zn, which has a low melting point, is used as a source material, so that a ZnO-based compound semiconductor having a good crystallinity can be grown without evaporation even if the growth temperature is raised above 600° C. As a result, a ZnO-based compound semiconductor layer having an extremely excellent crystallinity can be grown, thereby improving the reliability and manufacturing LEDs and LDS being excellent in light-emission characteristics.

As a result, the crystallinity of a ZnO-based compound semiconductor layer or the like used particularly in a blue semiconductor light emitting device can be improved, so that the light-emission characteristics such as the light-emission efficiency of a currently desired semiconductor light emitting device such as a blue LED or LD in particular can be improved with the use of a new material.

Figure 34:
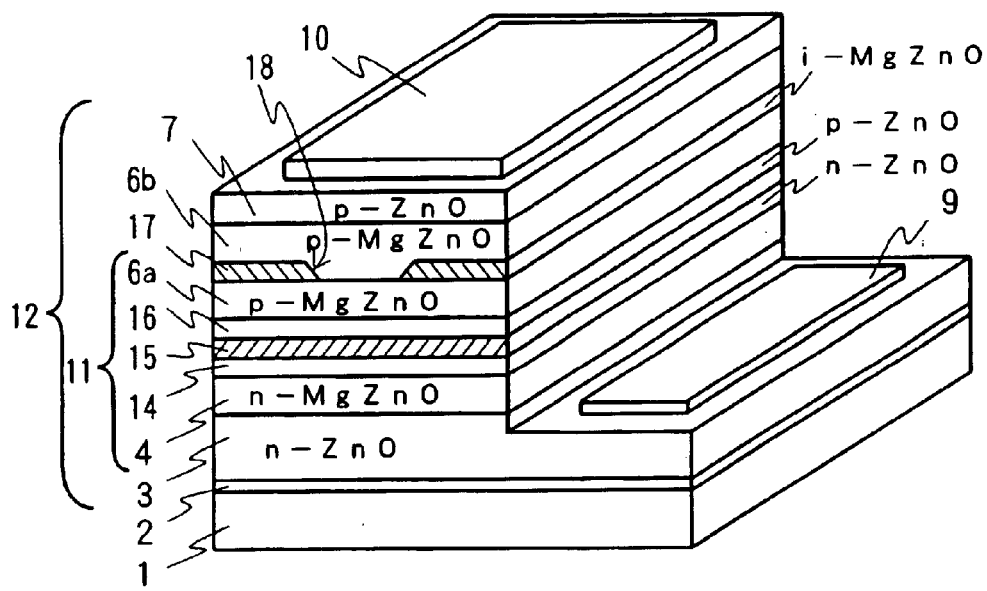
FIG. 34 is a cross-sectional explanatory view of an example of a semiconductor laser according to the present invention.
Figure 35:
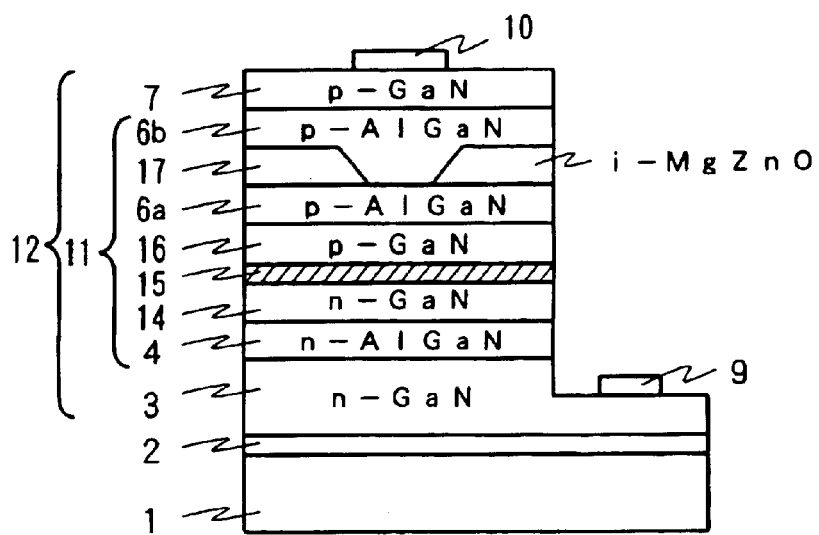
FIG. 35 is a cross-sectional explanatory view of an example of a semiconductor laser according to the present invention.

FIGS. 34 to 35 are directed to a structure example which utilizes a fact that a ZnO-based compound can be subjected to wet etching and in which the electric current can be narrowed with certainty in forming a semiconductor laser. Namely, a conventional GaN-based compound semiconductor can be etched only by physical dry etching, and it is not possible to build an electric current constriction layer near the active layer. Moreover, if it is etched by dry etching, the damage given to the semiconductor layer is large, and also it is not possible to perform regrowth of the semiconductor layer with good crystallinity because of adhesion of contamination or the like, so that an internal current constriction layer cannot be formed near the active layer.

Further, it is generally known in the art that the effect of inhibiting the electric current is large and effective if the electric current constriction layer is formed with an insulator instead of forming it with a conductivity different from the surrounding cladding layers. However, in order to form an electric current constriction layer with an insulator, a dielectric such as $SiO_2$ different from the semiconductor layers must be formed, so that it must be formed by transferring the substrate to a CVD apparatus or the like different from the one for forming the semiconductor layers. Also, since the dielectric is not a single crystal, continuity of crystals cannot be achieved in laminating the semiconductor layers. In the present example, which solves these problems, an electric current constriction layer is formed of an insulating layer made of a semiconductor crystal layer whose physical properties such as a lattice constant is near to those of a GaN-based or ZnO-based compound semiconductor or the like that emits blue light and, since it can be etched by wet etching, the electric current constriction layer is built near the active layer.

The inventors of the present invention have repeatedly made eager studies in order to obtain a semiconductor laser having a low threshold voltage and a high oscillation efficiency without waste of electric currents by building an electric current constriction layer near an active layer with the use of a material that can be subjected to wet etching, even with a blue semiconductor laser in particular. As a result, the inventors have found out the following. Namely, a ZnO-based compound semiconductor tends to become semiinsulated instead of becoming p-type even if it is doped with a p-type Group IA or Group VB dopant. Therefore, by using this semiinsulated ZnO-based compound semiconductor as an electric current constriction layer, the effect of blocking electric currents is far larger than forming an n-type electric current constriction layer in a p-type cladding layer. Further, since it can be etched by wet etching and also its physical properties such as a lattice constant are near to those of a GaN-based compound semiconductor, it can be laminated successively to a light emitting layer forming portion and can be formed at a place near the active layer, thereby manufacturing a semiconductor laser having high characteristics.

A semiconductor laser according to this example includes, for example, a first cladding layer 4 made of a first conductivity type (n-type) semiconductor and disposed on a sapphire substrate 1, an active layer 15 disposed on the first cladding layer, and a second cladding layer 6 (6a, 6b) made of a second conductivity type (p-type) semiconductor and disposed on the active layer 15; and an electric current constriction layer 17 is disposed in the inside of or in the vicinity of the second cladding layer 6, as illustrated in FIG. 34 showing a cross-sectional explanatory view of an example thereof. Further, the electric current constriction layer 17 is made of a ZnO-based compound semiconductor doped with a Group IA or Group VB element.

In the example shown in FIG. 34, the second cladding layer 6 is made of a p-type lower cladding layer 6a and a p-type upper cladding layer 6b, and the electric current constriction layer 17 is disposed therebetween. The p-type cladding layer 6 (6a, 6b) is made of $Mg_yZn_{1-y}O$ ($0 \leq y < 1$, for example, y=0.15), and the electric current constriction layer 17 is made of $Mg_zZn_{1-z}O$ ($0 \leq z < 1$, $y \leq z$, for example, z=0.2) doped with a Group IA or Group VB element and formed to a thickness of about 0.2 to 0.6 µm. The electric current constriction layer 17 is not limited to $Mg_zZn_{1-z}O$ as long as it is a ZnO-based compound semiconductor. However, if a mixed crystal with Mg is made, it is preferable because the band gap energy increases and the refractive index decreases, so that the electric current constriction layer does not absorb the light emitted by the active layer and can be disposed near the active layer, and also a real refractive index waveguide structure can be made. In the electric current constriction layer 17, a stripe groove 18 is formed, for example, by wet etching after growth to remove a portion where an electric current injection region is to be formed. If, like this example, the electric current constriction layer 17 is made of the same kind of material as the p-type cladding layer 6, the portion to form the electric current injection region can be etched with ease and certainty by disposing an etching stopping layer such as BeZnO at the boundary thereof, though not illustrated.

Further, this electric current constriction layer 17 made of a ZnO-based compound semiconductor is doped with a p-type dopant. This is based on the finding that a ZnO-based compound semiconductor is liable to generate oxygen defects and is liable to become n-type if grown as it is; however, by being doped with a p-type dopant, it becomes semiinsulated to increase the effect of inhibiting the electric current as compared with the case of forming it in n-type as described before. The reason why it becomes semiinsulated by being doped with a p-type dopant seems to be due to the property that the ionization degree of the ZnO-based compound is large. For example, it seems that the dopant nitrogen atoms strongly repel each other by a Coulomb repulsion force, whereby the holes are localized at the position of N without spreading over the whole and merely cancel the n-type generated by oxygen defects or the like. For this reason, by introducing a p-type dopant in epitaxially growing an ordinary ZnO-based compound semiconductor, a semiinsulating i-type ZnO-based compound semiconductor is obtained, and an electric current constriction layer 17 is obtained that produces a far larger electric current blocking effect than forming it into an n-type layer. Here, as the p-type dopant, Group IA elements such as Li, Na, and K, and Group VB elements such as N, P, As, and Sb, for example, are preferable because they can be easily handled with.

Each of the semiconductor layers in the light emitting layer forming portion 11 is made to have a composition similar to that of the previously described examples except that the p-type cladding layer is split into the first layer 6a and the second layer 6b, and the electric current constriction layer 17 is inserted therebetween, so that the explanation thereof will be omitted by denoting like parts with like reference numerals. Further, the substrate 1 and the buffer layer 2 can also be made of various materials in the same manner as in the previously described examples, and the electrodes and the other semiconductor layers are similar to those of the previously described examples.

The production method may be the MBE method or the like in the same manner as in the previously described examples. Here, if an n-type semiconductor layer was to be formed, it was doped by sputtering Al, whereas if a p-type semiconductor layer was to be formed, it was formed by simultaneous doping with plasma-excited $N_2$ and Al. By simultaneously doping with plasma-excited $N_2$ as a p-type dopant and Al as an n-type dopant, the n-type dopant acts as a buffering agent to produce a p-type layer. Further, in growing the electric current constriction layer, it is doped only with the plasma-excited $N_2$, whereby it becomes semiinsulating to produce a semiinsulating electric current constriction layer 17 instead of becoming p-type, as described previously. Here, the p-type dopant is not limited to plasma-excited $N_2$ alone, and the semiconductor layer will be a p-type layer in the same manner if it is doped with a Group IA element such as Li, Na, or K, or another Group V element such as P, As, or Sb together with an n-type dopant; and the semiconductor layer will be an insulating layer if it is doped with a p-type dopant alone.

According to this example, the electric current constriction layer 17 of a semiconductor laser is made of a semiinsulating ZnO-based compound semiconductor. This ZnO-based compound semiconductor has a property of becoming semiinsulating instead of becoming p-type even if it is doped with a p-type dopant, as described before. For this reason, a semiinsulating electric current constriction layer can be easily grown by stopping the n-type dopant, which is a dopant buffering agent, while forming a p-type cladding layer by simultaneously introducing the p-type dopant and the n-type dopant as a buffering agent. Therefore, an insulating layer can be laminated successively by the same growth apparatus for semiconductor layers and without the use of a special CVD apparatus or the like. Moreover, since a ZnO-based compound semiconductor can be etched with an acidic or alkaline etchant such as a sulfuric acid etchant, the electric current constriction layer can be built with good precision near the active layer. As a result, a high-output semiconductor laser having a large current-blocking effect and a low threshold current can be obtained. Moreover, the electric current constriction layer can be made of a material containing Mg as mixed crystals and having a large band gap energy and a small refractive index can be used. Therefore, even if the electric current constriction layer is disposed near the active layer, the loss caused by absorption of light is small, and a semiconductor layer having a real refractive index waveguide structure can be obtained.

The aforesaid example is an example in which the semiconductor laminate section was constructed entirely with ZnO-based compound semiconductor. However, even if other compound semiconductor such as GaN-based compound semiconductor are used, a semiinsulating electric current constriction layer can likewise be formed of a ZnO-based compound semiconductor. FIG. 35 is an explanatory view showing an example in which a blue semiconductor laser is constructed with a GaN-based compound semiconductor.

In this case, the substrate 1 is made of a sapphire substrate in the same manner as previously described; a GaN layer is formed as the buffer layer 2; an n-type GaN layer is formed as the n-type contact layer 3; $Al_aGa_{1-a}N$ ($0 \leq a < 0.3$, for example, a=0.15) is formed to a thickness of about 0.1 to 1 µm as the n-type cladding layer 4; the n-type and p-type optical wave guide layers 14, 16 are formed of n-type and p-type GaN, respectively, to a thickness of about 0.01 to 0.1 µm; and the active layer 15 is formed to have a multiple quantum well structure in which a barrier layer and a well layer made of $In_{0.06}Ga0.94N$ and $In_{0.1}Ga_{0.9}N$ are alternately laminated to thicknesses of 60 Å and 30 Å, respectively, each for two to five layers. The p-type cladding layer 6 has the same composition as the n-type cladding layer 4 and is formed, for example, by Zn doping. The p-type lower cladding layer 6a is formed to a thickness of about 0.05 to 0.5 µm; the electric current constriction layer 17 made of semiinsulating (i-type) $Mg_zZn_{1-z}O$ similar to the example of FIG. 34 is formed to a thickness of about 0.2 to 0.6 µm; and, in its stripe groove and on its upper surface, the p-type upper cladding layer 6b is formed to a thickness of about 0.5 to 2 µm. Further, the p-type contact layer 8 made of p-type GaN is formed to a thickness of 0.5 to 2 µm, and the n-side electrode 9 and the p-side electrode 10 are disposed in the same manner as described before. The wafer is then made into chips to produce an LD chip having a structure shown in FIG. 35.

In this case also, since the electric current constriction layer is made of a ZnO-based compound semiconductor, it can be etched with wet etching and further, since GaN-based compound semiconductor is extremely stable against etchants, an etching stopping layer is not needed, so that the electric current constriction layer can be formed near the active layer. Further, the ZnO-based compound semiconductor has physical properties such as a lattice constant similar to those of the GaN-based compound semiconductor, and can be grown successively as it is. As a result, the electric current constriction layer can be built near the active layer with the use of a ZnO-based compound semiconductor, though it was not conventionally possible to build an electric current constriction layer near the active layer in a semiconductor laser using a GaN-based compound semiconductor. Moreover, the electric current constriction layer can be built with an insulator as described above, all the more increasing the electric current blocking function as compared with building it with n-type.

In order to produce an LD chip having an SAS structure shown in FIG. 35, a substrate 1 made of sapphire is washed with an organic solvent such as acetone or ethanol, rinsed with pure water, then subjected to an acid treatment with a mixed liquid of phosphoric acid +sulfuric acid (mixing ratio=1:3) at 80° C., and then rinsed again with pure water. The sapphire substrate 1 thus subjected to these pretreatments is put into an MOCVD (metal organic chemical vapor deposition) apparatus, and the substrate temperature is raised to about 1050° C. in a $H_2$ atmosphere for thermal cleaning for about 10 minutes. Thereafter, the substrate temperature is lowered to about 600° C., and then trimethylgallium (TMG) and ammonia gas ($NH_3$), which are reaction gases, are introduced together with a carrier gas $H_2$ to form a film of a buffer layer 2 made of GaN to a thickness of about 0.01 to 0.2 µm. Then, with the substrate temperature raised to about 800° C., the reaction gases are successively changed to necessary ones to grow each semiconductor having a composition and a thickness as described before. Here, in growing an electric current constriction layer 17, it can be obtained by introducing and reacting plasma $N_2$ for N as a dopant with the use of dimethylzinc (DMZn) for Zn, plasma $O_2$ for O, and cyclopentadienyl magnesium $Cp_2Mg$ for Mg as reaction gases. After the growth, an electric current injection region such as a stripe groove is removed by etching in the same manner as in the previously described examples. Here, in this case, since the GaN-based compound is stable against etchants, an etching stopping layer is not needed. Further, electrodes 9, 10 are formed and the wafer is made into chips in the same manner as in the previously described examples to produce an LD chip having a structure shown in FIG. 35. Here, in this example, all the semiconductor layers are formed by the MOCVD method. However, the electric current constriction layer alone may be grown by the MBE method, or alternatively all the semiconductor layers may be grown by the MBE method.

Here, the example of the GaN-based semiconductor layer is merely an example, so that GaN may be used in place of AlGaN, and a material having a crystal mixing ratio to give a suitable band gap energy can be selected and used within the range of GaN-based semiconductor layers and ZnO-based compound semiconductor. Further, an insulated ZnO-based compound semiconductor can be used as an electric current diffusing layer for other semiconductor layers such as AlGaAs.

According to this example, since the electric current constriction layer of a semiconductor laser is made of a ZnO-based compound semiconductor doped with a Group IA or Group VB element, the insulating electric current constriction layer can be successively laminated near the active layer in the same growth apparatus for epitaxially growing the semiconductor layers. Moreover, since the electric current injection section can be formed by wet etching, no damages are given to the semiconductor layers. Further, since the electric current constriction layer can be made of a material having a large band gap energy, the electric current constriction layer can be built near the active layer. As a result, the waste of electric currents is prevented to produce a semiconductor laser having high characteristics with a low threshold current.

FIGS. 36 to 39 show an example in which the most suitable etching stopping layer is disposed when the aforesaid electric current constriction layer is made of MgZnO. Namely, a ZnO-based compound semiconductor can be easily etched with an acidic or alkaline etchant, whereby the electric current constriction layer can be built near the active layer. However, although the electric current injection region is determined by the width W of an etched portion of the electric current constriction layer 67 as shown in FIG. 39(c) and the width can be made constant by sufficiently performing side-etching, the width cannot be determined by the side etching because the etching proceeds isotropically and the cladding layer made of MgZnO is etched as well, as shown in FIG. 39(a). In order to determined the width, it is ideal to stop the etching at the cladding layer 66 and the width W is determined by side-etching, as shown in FIGS. 39(b) to (c). Here, in FIG. 39, the reference numeral 68 represents a resist film.

Thus, in constructing a blue semiconductor laser using a ZnO-based compound semiconductor, the electric current constriction layer can be easily built near the active layer, because ZnO-based compound semiconductor can be etched with an acidic or alkaline etchant. However, since the cladding layer is also etched, the side etching cannot be carried out, so that the width, for example, of the stripe groove serving as the electric current injection region cannot be made constant. For this reason, a layer having a smaller etching rate than the electric current constriction layer must be placed under the electric current constriction layer.

However, the cladding layer must have a large band gap energy. Therefore, among the ZnO-based compound semiconductor, only ZnO and MgZnO can be conceived of as a material for the cladding layer, like the electric current constriction layer. For this reason, it must be a material having a different etching rate from the electric current constriction layer and having a sufficient band gap energy so as not to absorb the light emitted by the active layer. However, a suitable etching stopping layer made of a ZnO-based compound semiconductor has not yet been found. Therefore, an etching stopping layer is demanded which has a suitable structure to form an electric current injection section with good precision in the electric current constriction layer.

The inventors of the present invention have repeatedly made eager studies to find a suitable etching stopping layer to be disposed under the electric current constriction layer so that only the electric current constriction layer can be etched without affecting the cladding layer in constructing a semiconductor laser using a ZnO-based compound semiconductor. As a result, the inventors have found out that, while ZnO-based and MgZnO-based compounds are dissolved in an alkaline etchant, a CdZnO-based compound has a smaller etching rate to the same alkaline etchant and, by setting its thickness to be smaller than about 0.1 μm, it can contribute sufficiently as an etching stopping layer without affecting the characteristics, and that a BeZnO-based compound obtained by forming mixed crystals of Be with ZnO is extremely stable against both acidic etchants and alkaline etchants, so that it can sufficiently contribute as an etching stopping layer even if it is formed to have a smaller thickness in the same manner.

Figure 36:
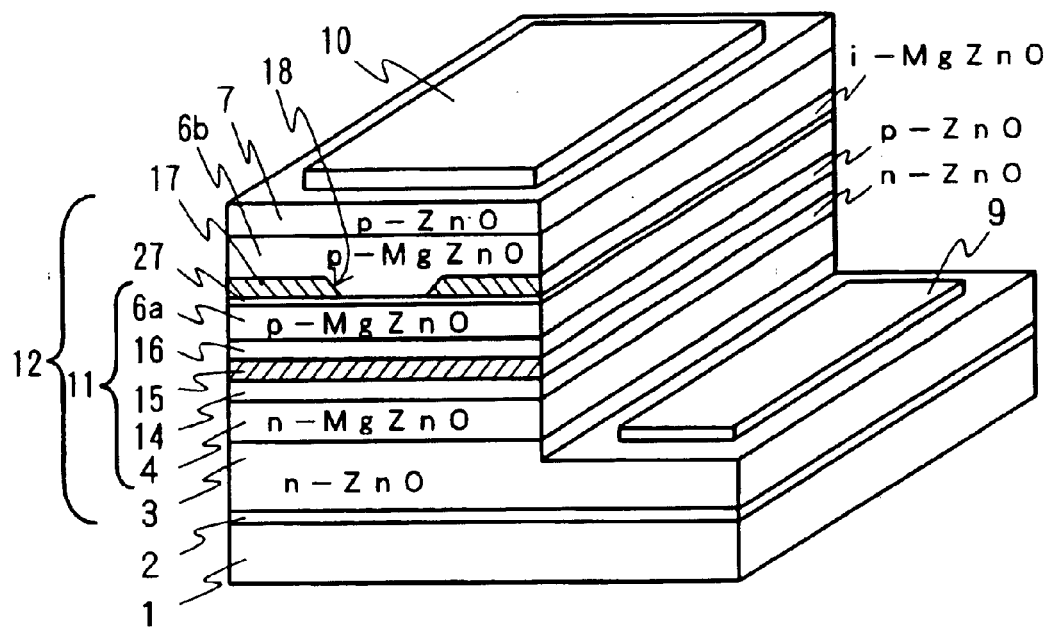
FIG. 36 is a cross-sectional explanatory view of an example of a semiconductor laser according to the present invention.

A semiconductor laser having this etching stopping layer disposed therein includes, for example, a first cladding layer 4 made of a first conductivity type (n-type) semiconductor and disposed on a sapphire substrate 1, an active layer 15 disposed on the first cladding layer, and a second cladding layer 6 (6a, 6b) made of a second conductivity type (p-type) semiconductor and disposed on the active layer 15; and an electric current constriction layer 17 made of $Mg_zZn_{1-z}O$ ($0 \leq z < 1$) is disposed in the inside of or in the vicinity of the second cladding layer 6, as illustrated in FIG. 36 showing a cross-sectional explanatory view of an example thereof. Further, this example is characterized in that an etching stopping layer 27 made of $Cd_sZn_{1-s}O$ ($0<s<1$) or $Be_tZn_{1-t}O$ ($0<t<1$) is disposed on the substrate 1 side of the electric current constriction layer 17.

In the example shown in FIG. 36, the second cladding layer 6 is made of a p-type lower cladding layer 6a and a p-type upper cladding layer 6b and, between them, an etching stopping layer 27 made of $Cd_sZn_{1-s}O$ ($0<s<1$) and having a thickness of several hundred Å and a semiinsulating $Mg_zZn_{1-z}O$ ($0 \leq z<1$, $y<z$, for example, $z=0.2$) doped with N or Li and having a thickness of about 0.2 to 0.6 μm are disposed. The electric current constriction layer is not limited to $Mg_zZn_{1-z}O$ alone, and may be any ZnO-based compound semiconductor. However, if mixed crystals with Mg are formed, it is preferable because the band gap energy increases and the refractive index decreases, so that the electric current constriction layer can be disposed near the active layer without absorbing the light emitted by the active layer, and also a real refractive index waveguide structure can be formed. In this electric current constriction layer 17, a stripe groove 18 is formed, for example, by wet etching to removing a portion which is to become an electric current injection region after growth. In this invention, an etching stopping layer 27 is disposed so as not to overetch the p-type lower cladding layer 6a in performing the wet etching. This etching stopping layer 27 will be described in detail.

Figure 39:
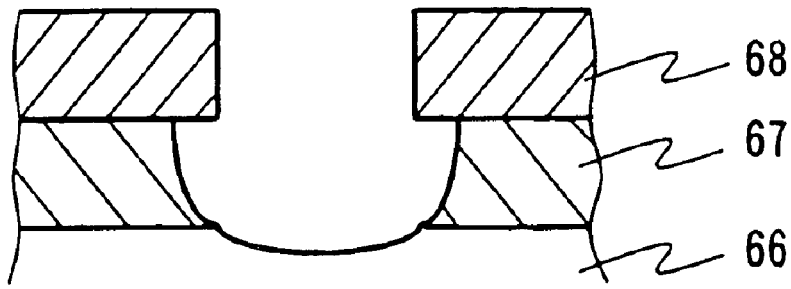
FIG. 39 is a view for explaining the progress of etching in forming a stripe groove by etching.
Figure 39:
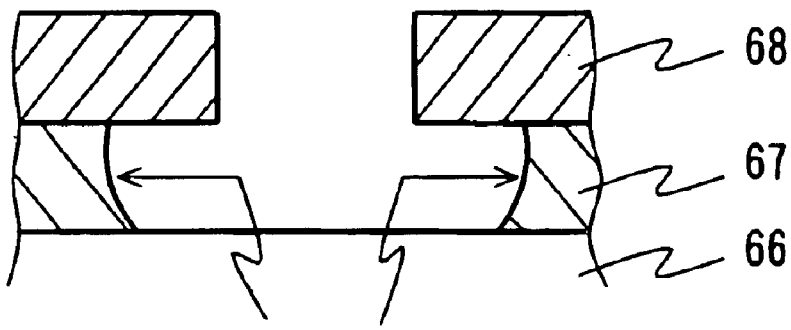
Figure 39:
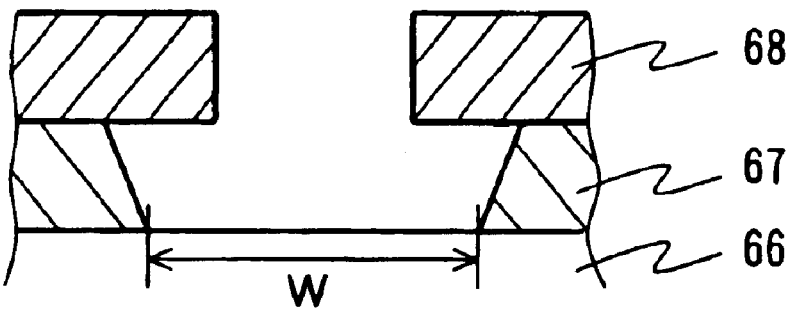

The inventors of the present invention have repeatedly made eager studies to construct a structure in which, for example, the stripe groove 18 serving as an electric current injection region is formed to have a constant width by etching while preventing the overetching of the p-type lower cladding layer 6a when the electric current constriction layer 17 is made of $Mg_zZn_{1-z}O$ with the use of a ZnO-based compound semiconductor as described before. First, in order to form the electric current injection portion such as the stripe to have a desired constant width, the inventors of the present invention have found out that, in a state shown in FIG. 39(*a*) where up to the lower surface of the electric current constriction layer 67 is etched (the corner portion is not completely etched), if a side-etching is carried out for a period of time of about 10 to 40% of the etching time up till then (See FIG. 39(*c*)), an electric current injection region having an almost constant width can be formed. For example, assuming that the period of time from the start of etching the electric current constriction layer 17 made of ZnO ($z=0$) and having a thickness of about 0.7 μm beginning with the upper surface with an 8% NaOH solution up till the time in which its bottom surface is etched (the state in which the corner portion still remains) as shown in FIG. 39(*a*), is about 5 minutes, then a stripe groove 18 having a desired stripe width (See FIG. 36) can be formed by further continuing the etching process for about 30 seconds to 2 minutes. Therefore, it is sufficient to form an etching stopping layer 27 having a thickness that is not etched to reach the p-type lower cladding layer 6a while the electric current constriction layer 17 is being subjected to the side-etching.

Figure 37:
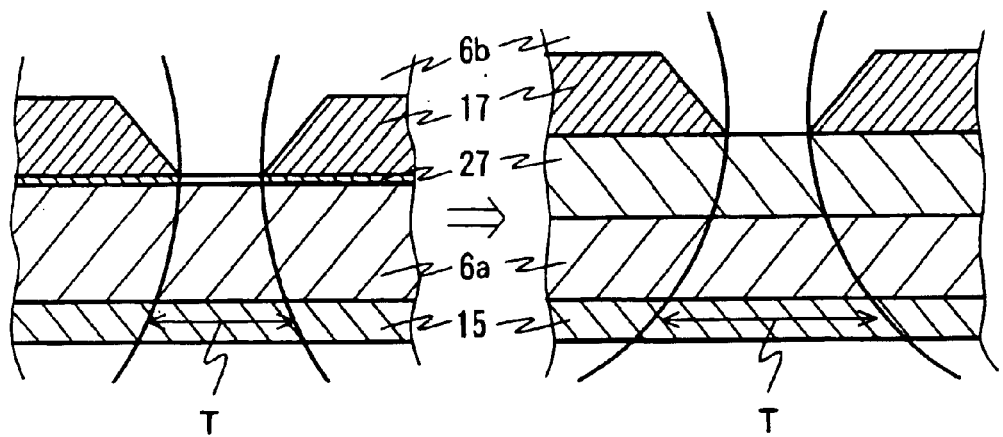
FIG. 37 is a view for explaining the influence on a semiconductor laser by the thickness or the material of an etching stopping layer.
Figure 37:
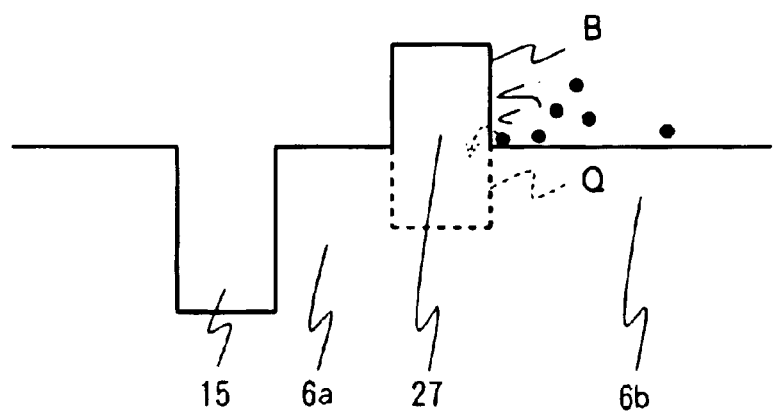

On the other hand, if the etching stopping layer 27 is too thick, the width T of the electric current injection region at the active layer 15 will be too broad, as shown in the right figure in FIG. 37(*a*), so that ineffective electric current disadvantageously increases. Further, since the etching stopping layer 27 is made of a material having a different composition from the cladding layer, the band gap energy is different. Therefore, as shown in FIG. 37(*b*) illustrating the relationship (conduction band side) of the band gap energy of each layer, a band gap barrier B or a well Q is formed to hinder the conduction of carriers irrespective of whether the band gap energy of the etching stopping layer 27 is larger or smaller. For this reason, the etching stopping layer must be formed to have a thickness such that these will not be a problem. Thus, the thickness of the etching stopping layer 27 must be less than about 0.1 μm, more preferably less than about several hundred Å. In other words, in the previously described example, the etching of the stripe width can be formed with precision without adversely affecting the characteristics and without overetching the cladding layer, by selecting a material having a crystal mixing ratio s of Cd which gives an etching rate such that the etched thickness will be less than 0.1 μm, more preferably less than about several hundred Å, i.e. less than about 100 to 1000 Å, for etching of about 30 seconds to 2 minutes.

Figure 38:
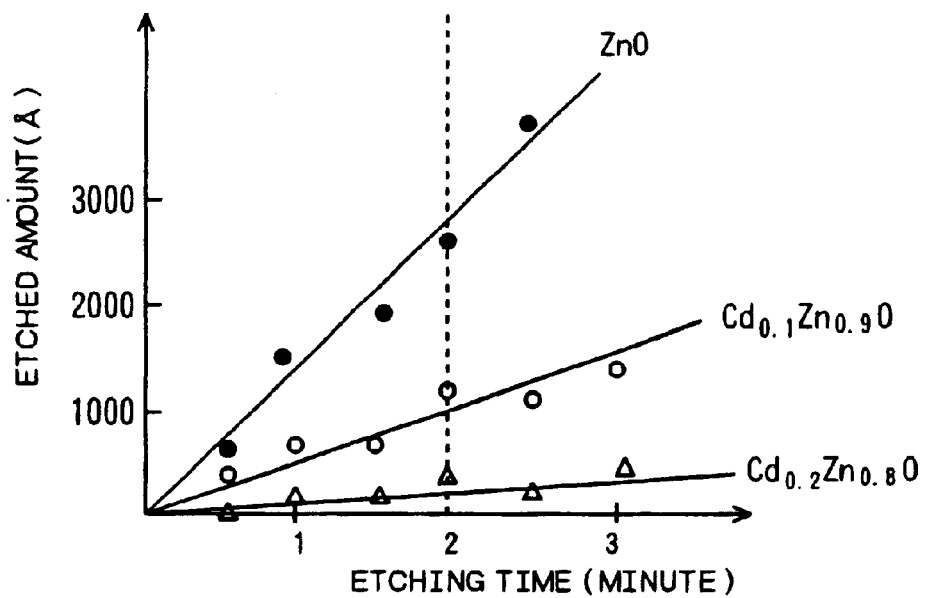
FIG. 38 is a view showing a relationship of the etched amount against the etching time of $Cd_xZn_{1-x}O$ and $Be_tZn_{1-t}O$ used as an etching stopping layer.
Figure 38:
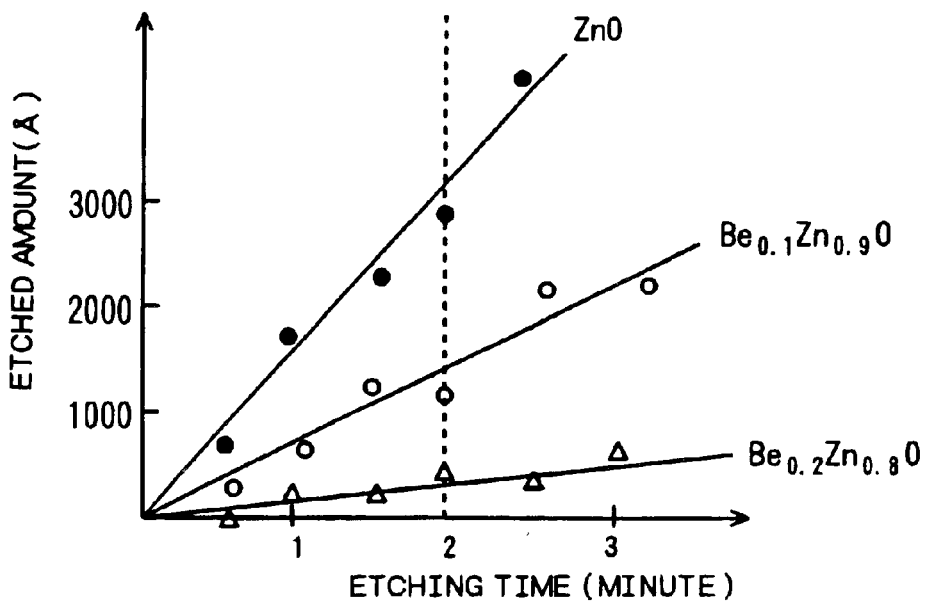

For example, the etched amounts of the aforesaid etching stopping layer 27 made of ZnO and $Cd_sZn_{1-s}O$ having a crystal mixing ratio s of Cd being 0.1 and 0.2 were examined relative to the etching time with the aforesaid 8 wt % NaOH solution. As a result, as shown in FIG. 38(*a*), the etching rate was about ⅓ as compared with ZnO when $s=0.1$, and the etching rate is further reduced to ⅓ (about ⅑ to ⅒ as compared with ZnO) when $s=0.2$. Therefore, it has been found out that, if $0.1 \leq s$, it can be used sufficiently as an etching stopping layer and, since the band gap energy increases to enable forming a larger thickness according as the value of s decreases, even $Cd_sZn_{1-s}O$ with s being smaller than 0.1 can sufficiently serve as an etching stopping layer in relation to the electric current constriction layer 17. Here, in view of the difference in the etching rate, the facility in forming a film, and others, the range of s is preferably $0<s \leq 0.5$, more preferably $0.1 \leq s \leq 0.3$.

After repeatedly making eager studies further, the inventors of the present invention have found out that, although $Cd_sZn_{1-s}O$ is etched at about the same rate as ZnO by an acidic etchant such as $H_2SO_4$ and is not used as an etching stopping layer, BeO is stable to both acidic and alkaline etchants and can be used sufficiently as an etching stopping layer whether the etchant is alkaline or acidic, by using $Be_tZn_{1-t}O$ obtained by forming mixed crystals of ZnO with Be as an etching stopping layer. FIG. 38(b) shows the relationship of the etched amounts of ZnO as previously described and $Be_tZn_{1-t}O$ when t=0.1 and 0.2, relative to the etching time with the use of a 6 wt % $H_2SO$, as an etchant. As will be apparent from FIG. 38(b), it has been found out that the etched amount of ZnO is about the same as in the case of NaOH, that the etched amount of $Be_tZn_{1-t}O$ is a little larger if the crystal mixing ratio is the same as the crystal mixing ratio of Cd in $Cd_sZn_{1-s}O$, and that the etched amount is almost the same as the etched amount of $Cd_sZn_{1-s}O$ by increasing the crystal mixing ratio of Be a little. In other words, in this case also, $Be_tZn_{1-t}O$ can be used as the etching stopping layer of the electric current constriction layer of a ZnO-based compound semiconductor, though it depends on the composition of the electric current constriction layer and the thickness of the etching stopping layer. Here, in view of the difference in the etching rate, the facility in forming a film, and others, the range of t is preferably $0<t \leq 0.5$, more preferably $0.1 \leq t \leq 0.3$. Here, similar effects have been produced with respect to 8 wt % NAOH solution.

The aforesaid electric current constriction layer 17 made of a ZnO-based compound semiconductor is made of $Mg_zZn_{1-z}O$ doped with a p-type dopant. This is based on the fact that, as previously described, a ZnO compound semiconductor is liable to generate oxygen defects and is liable to turn into n-type if grown as it is, but it becomes semiinsulated by being doped with a p-type dopant, thereby increasing the effect of inhibiting the electric current as compared with the case of forming it into n-type. The reason why the ZnO-based compound semiconductor becomes semiinsulated by being doped with a p-type dopant is due to the property that the ionization degree of the ZnO-based compound is large. For example, it seems that the dopant nitrogen atoms strongly repel each other by a Coulomb repulsion force, whereby the holes are localized at the position of N without spreading over the whole and merely cancel the n-type generated by oxygen defects or the like. For this reason, by introducing a p-type dopant in epitaxially growing an ordinary ZnO-based compound semiconductor, a semiinsulating i-type ZnO-based compound semiconductor is obtained, and an electric current constriction layer 17 is obtained that produces a far larger electric current blocking effect than forming it into an n-type layer. Here, as the p-type dopant, Group IA elements such as Li, Na, and K, and Group VB elements such as N, P, As, and Sb, for example, are preferable because they can be easily handled with.

Each of the semiconductor layers in the light emitting layer forming portion 11 is made to have a composition similar to that of the previously described examples except that the p-type cladding layer is split into the first layer 6a and the second layer 6b, and the electric current constriction layer 17 is inserted therebetween, so that the explanation thereof will be omitted by denoting like parts with like reference numerals. Further, the substrate 1 and the buffer layer 2 can also be made of various materials in the same manner as in the previously described examples, and the electrodes, the other semiconductor layers, and the production method are similar to those of the previously described examples. Here, by taking out the wafer from the MBE apparatus after the semiinsulating $Mg_zZn_{1-z}O$ is grown, forming a resist film or the like on the surface thereof, patterning the resist film by a photolithography technique, forming an opening in a shape of a desired electric current injection region, and performing an etching process using, for example, an etchant of NaOH with the resist film used as a mask, the electric current constriction layer 17 exposed at the opening portion of the aforesaid mask is etched to form, for example, a stripe groove 18.

According to this example, since an etching stopping layer made of $Cd_sZn_{1-s}O$ (0<s<1) or $Be_tZn_{1-t}O$ (0<t<1) having a smaller etching rate than a MgZnO-based one is disposed under the electric current constriction layer 17 of a semiconductor laser, an electric current injection region can be formed with precision in the electric current constriction layer without affecting the cladding layer and without affecting the electric characteristics such as oscillation efficiency by using an alkaline etchant in the case of $Cd_sZn_{1-s}O$ and by using an acidic or alkaline etchant in the case of $Be_tZn_{1-t}O$. As a result, a semiconductor laser having high characteristics can be produced with the use of a ZnO-based compound semiconductor.

According to this example, since an etching stopping layer is disposed, the side etching can be sufficiently carried out, so that the width of the electric current injection region such as a stripe groove disposed in the electric current constriction layer can be formed with good reproducibility and with high precision. As a result, a highly efficient blue semiconductor laser using a znO-based compound semiconductor can be obtained.

FIGS. 40 to 43 show an example in which the light emitting layer forming portion is formed to have a MIS structure that can be produced with high yield through a simple production process. In other words, as previously described, if one wishes to realize a light emitting device using a ZnO-based compound semiconductor, it is difficult to obtain a p-type layer thereof, and it is difficult to control the carrier concentration thereof to be a high concentration, and also the yield decreases, whereby the light-emission characteristics are liable to be reduced and an extremely expensive product is liable to be produced.

On the other hand, in the case of a ZnO-based compound semiconductor, the bonding energy (binding energy) of its exciton (a pair of an electron and a positive hole bound by a Coulomb force) has an extremely large value of 60 meV, which is larger than the heat energy 26 meV of room temperature. Therefore, excitons can exist stably even at room temperature. This exciton, once formed, easily generates a light quantum. Namely, the ZnO-based compound semiconductor emits light with good efficiency. For this reason, it is known in the art that the ZnO-based compound semiconductor emits light far more efficiently than the direct recombination light-emission in which a free electron and a free positive hole are directly recombined to emit light (for example, see "Fascination of Blue Light emitting Device" by Isamu Akazaki, pp. 50–60, (published by Kogyo Chosakai, May 1997)).

The inventors of the present invention have repeatedly made eager studies in order to obtain a light emitting device using a ZnO-based compound semiconductor that can utilize the aforesaid highly efficient light-emission of the excitons. As a result, the inventors have found out that a ZnO-based compound will be insulated with certainty on the basis of its crystal structure if it is doped with a p-type dopant by an ordinary method and that, by suitably selecting its thickness, a highly efficient light-emission can be obtained by the aforesaid light-emission of the excitons through a simple production process without a special step for turning it into p-type, so that a high-output emission of light can be obtained by a sufficiently small electric current even with a MIS (metal-insulating layer-semiconductor layer) structure.

Figure 43:
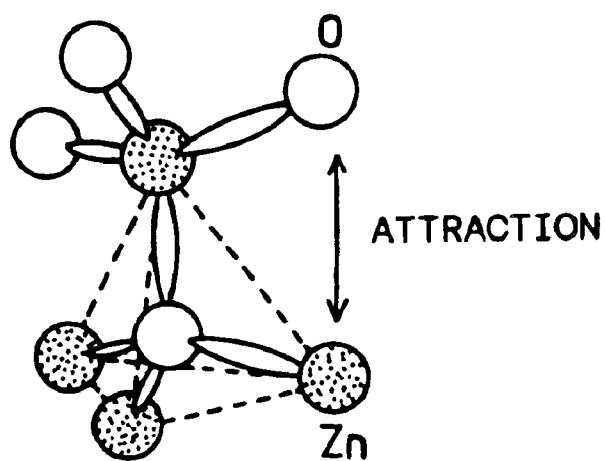
FIG. 43 is a view for explaining an atomic structure of ZnO.

In other words, since the ionization degree of ZnO is large, it will be near to $Zn^+$ and $O^-$. Therefore, as illustrated in FIG. 43, O (white circle) is stabilized right above Zn (black circle) by action of a Coulomb attraction force, so that the crystal structure is hexagonal (See, for example, Leading Device Material Handbook (edited by Electronic Data Communication Society, published by Ohm Co., Ltd., 1993), chapter 2, Fundamentals of Device Materials, pp. 29–30). Because of such a crystal structure, if Li of Group IA, for example, enters the position of a black circle, the holes are localized at the position of Li and do not spread over the entire crystal because the interatomic distance is small and Li atoms repel each other by a strong Coulomb repulsion force. Therefore, even if a p-type dopant is introduced, it does not function as a dopant. On the other hand, ZnO is liable to generate oxygen (O) defects during the crystal growth, so that it is liable to turn into n-type even if a dopant is not introduced. For this reason, even if ZnO is doped with a p-type dopant, it merely cancels the n-type caused by the oxygen-defects and, even if an excessive amount of a p-type dopant is introduced, it does not function as a p-type dopant, thereby providing an insulating layer. By this mechanism, ZnO can be insulated with certainty and also a highly efficient light emission can be obtained irrespective of a production method of whether in a hydrogen atmosphere or not, and irrespective of a production process such as a subsequent annealing treatment, unlike the case of GaN which does not easily turn into p-type because a p-type dopant such as Mg is liable to combine with hydrogen of a hydrocarbon group of an organic metal compound and does not function as a dopant.

Figure 40:
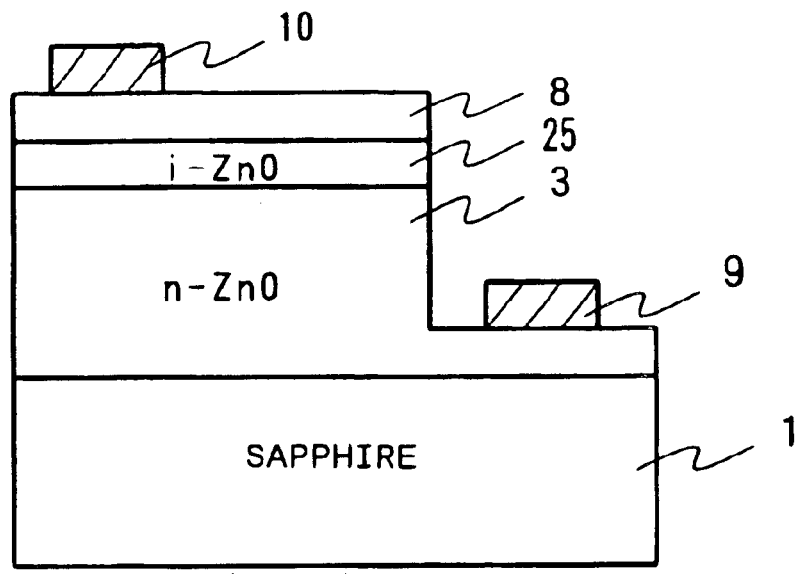
FIG. 40 is a cross-sectional explanatory view of a MIS-type LED chip according to the present invention.

An oxide compound semiconductor LED according to a so-called MIS type structure includes an n-type layer 3 made of an n-type ZnO-based compound semiconductor and disposed, for example, on a sapphire substrate 1, an i-layer 25 made of a semiinsulating ZnO-based compound semiconductor, and an electrically conductive layer 8 made, for example, of ITO and disposed on the surface of the i-layer 25, as illustrated in FIG. 40 showing a cross-sectional explanatory view of an example thereof.

The n-type layer 3 is formed to have a thickness of about 1 to 3 μm, and an n-type ZnO layer can be easily obtained, for example, by growing ZnO while introducing Al or the like as a dopant. Further, the i-layer 25 is formed to have a thickness of about 0.05 to 0.3 μm, and is obtained by growing ZnO while doping it with a p-type dopant such as Li. This is due to the following reason. If ZnO is grown without doping, it is liable to turn into n-type because of the aforesaid generation of oxygen (O) defects. Therefore, introduction of a p-type dopant cancels the n-type layer to form an insulating layer (i-layer). Even if ZnO is doped with a p-type dopant too much, it hardly functions as a p-type dopant and the insulating layer is maintained because of the special characteristics of the crystal structure caused by the attraction force between $Zn^+$ and $O^-$ due to the strong ionization degree of ZnO as described before. For this reason, the i-layer 25 can be obtained without paying too much attention to the doping amount.

As the n-type dopant, Group IIIB elements are preferable besides the aforesaid Al, in view of the stabilization of the crystallization. However, as described before, because of the property that ZnO-based compound semiconductor turn easily into n-type without being doped, it is possible to obtain an n-type layer of about $1 \times 10^{18}$ to $1 \times 10^{19}$ cm$^{-3}$ without doping, so that an n-type dopant need not be used. Further, any of the Group IA, Group IB, and Group VB elements can be used as the p-type dopant.

As the electrically conductive layer 8, an electric conductor such as a metal is preferable so as to be capable of supplying an electric current. However, for taking out light from the front surface, a material that transmits light therethrough is preferable. For example, a transparent conductive material such as ITO (indium tin oxide), indium oxide, or tin oxide is used.

A method of manufacturing this LED will be explained with reference to concrete examples. First, a substrate 1 made of sapphire is washed with an organic solvent such as acetone or ethanol, rinsed with pure water, then subjected to an acid treatment with a mixed liquid of phosphoric acid +sulfuric acid (mixing ratio=1:3) at 80° C., and then rinsed again with pure water. The sapphire substrate 1 thus subjected to these pretreatments is put into an MBE apparatus. Subsequently, a mixed plasma gas of $H_2$+ He is radiated onto the sapphire substrate 1 under a condition of 20 mTorr, and then the substrate temperature $T_s$ is raised to about 900° C. for thermal cleaning for about 10 minutes.

After these pretreatments are finished, the substrate temperature $T_s$ is lowered to about 400 to 600° C. During this time, an $O_2$ plasma is kept being radiated onto the substrate 1 so as to attain a partial pressure of $5 \times 10^{-8}$ to $1 \times 10^{-4}$ Torr. By keeping this $O_2$ plasma being radiated, the evaporation of O of the substrate 1 can be prevented.

Next, while keeping the $O_2$ plasma being radiated, the shutters of cells of Zn and Al are opened to grow an n-type layer 3 made of Al-doped ZnO to a thickness of about 1 to 3 μm. Subsequently, the cell of Al is closed and a Li cell is opened to grow an i-layer 25 to a thickness of about 0.05 to 0.3 μm, more preferably 0.08 to 0.1 μm. The i-layer 25 preferably has a thickness of this degree because too large a thickness increases the Joule heat due to its resistance when the element is energized for operation, whereas too small a thickness lets the n-type layer 3 and the i-side electrode 10 short-circuited.

Then, the wafer is taken out from the MBE apparatus, and a portion of the i-layer 25 is etched by forming a mask such as a photoresist to expose a portion of the n-type layer 3 for forming an n-side electrode. This etching can be carried out by dry etching such as RIE (reactive ion etching) or by wet etching using a sulfuric acid. Then, an ITO film 8 is formed to a thickness of about 0.05 to 0.2 μm on the surface of the i-layer 25 by sputtering or the like and, on the surface thereof, an i-side electrode 10 is formed to a thickness of about 0.05 to 0.2 μm by vacuum vapor deposition of Ni/Au using the lift-off method. Further, Ti/Au is formed to a thickness of about 0.1 to 0.2 μm to form an n-side electrode 9 in the same manner by vacuum vapor deposition on the surface of the n-type layer 3 exposed by etching.

Figure 42:
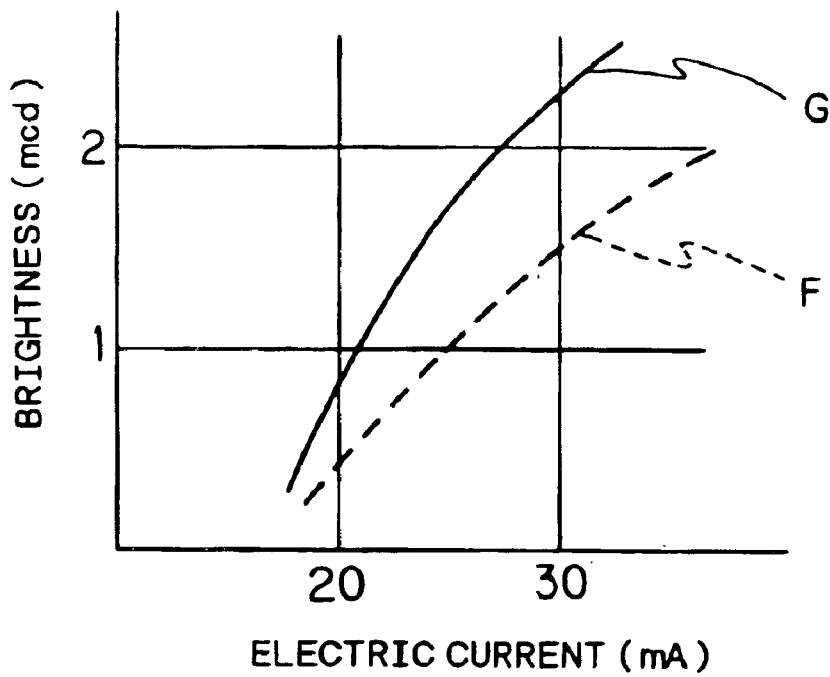
FIG. 42 is a view showing the light-emission characteristics of a LED according to the structure of FIG. 40, as compared with the light-emission characteristics of a LED according to a GaN-based MIS structure.

The result of examination of the light-emission characteristics of the LED thus produced will be shown in FIG. 42 in comparison with the LED produced with the MIS structure of GaN. In FIG. 42, the horizontal axis represents electric currents (mA), and the vertical axis represents brightness (millicandela). The broken line F shows an example of GaN, and the solid line G shows a LED having a MIS structure using a ZnO-based compound semiconductor having a structure shown in FIG. 40. As will be apparent from FIG. 42, the LED using the ZnO-based compound semiconductor produces an extremely high brightness with the same electric current value, and a brightness of about 10% is obtained as compared with the brightness of a LED having a double heterojunction structure in which an active layer is sandwiched between GaN-based p-type and n-type layers under the same condition, so that it has a sufficient practicability.

Figure 41:
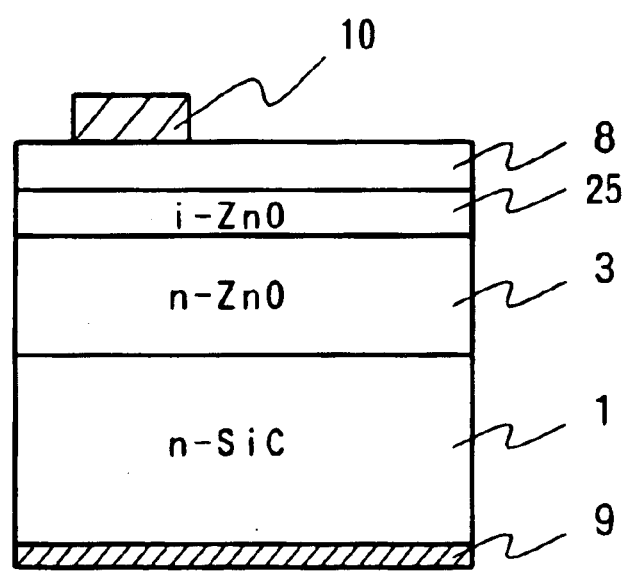
FIG. 41 is a cross-sectional explanatory view of another example of a MIS-type LED chip according to the present invention.

FIG. 41 is a view showing another example of a MIS-structure LED using a znO-based compound semiconductor. This example is an example in which SiC is used as the substrate 1, and the substrate 1 is pretreated by being washed with an organic solvent. This SiC substrate 1 is put into an MBE apparatus, and a thermal cleaning is carried out at about 900° C. for about 10 minutes under a mixed plasma gas of $H_2$+He in the same manner as in the previously described examples. If surface oxidation occurs in the SiC substrate 1, the subsequent growth of ZnO will be difficult. Therefore, after the thermal cleaning, a Zn flux is radiated till the temperature is lowered to about 400 to 600° C.

Thereafter, the shutters of a cell of $O_2$ plasma and a cell of Al are opened in the same manner as in the previously described examples to grow an n-type layer 3 made of n-type ZnO to a thickness of about 1 to 3 µm, and further an i-layer 25 is formed to a thickness of about 0.05 to 0.3 µm in the same manner as described before. Then, an ITO film 8 is formed on the surface thereof to a thickness of about 0.05 to 0.2 µm by sputtering or the like, and an n-side electrode 9 is formed by disposing Ti/Au to thicknesses of about 0.1 µm/0.2 µm, respectively, over the entire rear surface of the SiC substrate 1 by vacuum vapor deposition. Then, an i-side electrode 10 is formed by vacuum vapor deposition of Ni/Au to thicknesses of about 0.05 µm/0.2 µm, respectively, on the front surface of the ITO film 8 by the lift-off method, and the wafer is made into chips to produce a LED chip shown in FIG. 41.

In each of these examples, ZnO was used as the n-type layer 3 and the i-layer 25. However, mixed crystals with another Group IIA or Group IIB element such as Cd or Mg can also change the light-emission wavelength thereof and produces a similar MIS-type LED. Namely, by forming a mixed crystal, for example, with Cd, its band gap energy decreases to emit light of a longer wavelength, and by forming a mixed crystal with Mg, its band gap energy increases to emit light of a shorter wavelength.

Further, in each of these examples, the i-layer was formed by doping with a p-type dopant. However, even if it is turned into p-type by doping with a p-type dopant, it does not raise any particular problem because light is emitted at a pn-junction. Therefore, in short, it is sufficient if a layer is formed in which a ZnO-based compound semiconductor is doped with a p-type dopant.

According to this example, since a LED having a so-called MIS-type structure is formed by using a ZnO-based compound semiconductor that is particularly likely to generate excitons, a highly bright blue LED can be obtained through a simple production process in which the grown semiconductor layers are kept as they are, without the need for a special process for controlling the carrier concentration. As a result, blue LEDs which are now extremely strongly needed can be supplied at an extremely low price and in a large amount.

Further, the n-type layer can also be formed without doping, so that the control of the carrier concentration is easy and it can be produced without the use of a dopant, thereby further contributing to reduction in costs.

Figure 44:
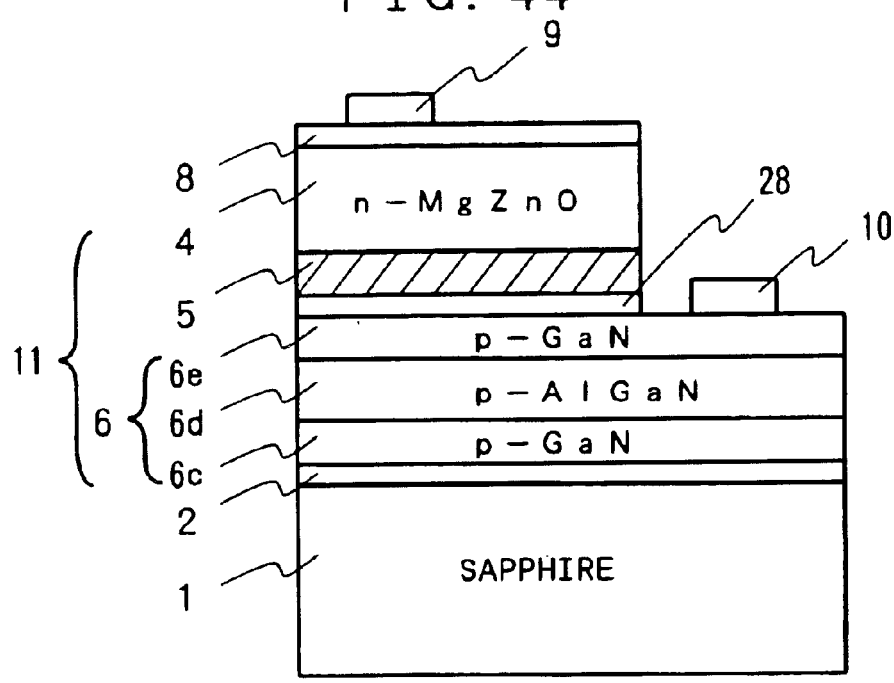
FIG. 44 is a cross-sectional explanatory view of a LED chip of a semiconductor light emitting device according to the present invention using a composite semiconductor of a ZnO-based compound and a GaN-based compound.
Figure 45:
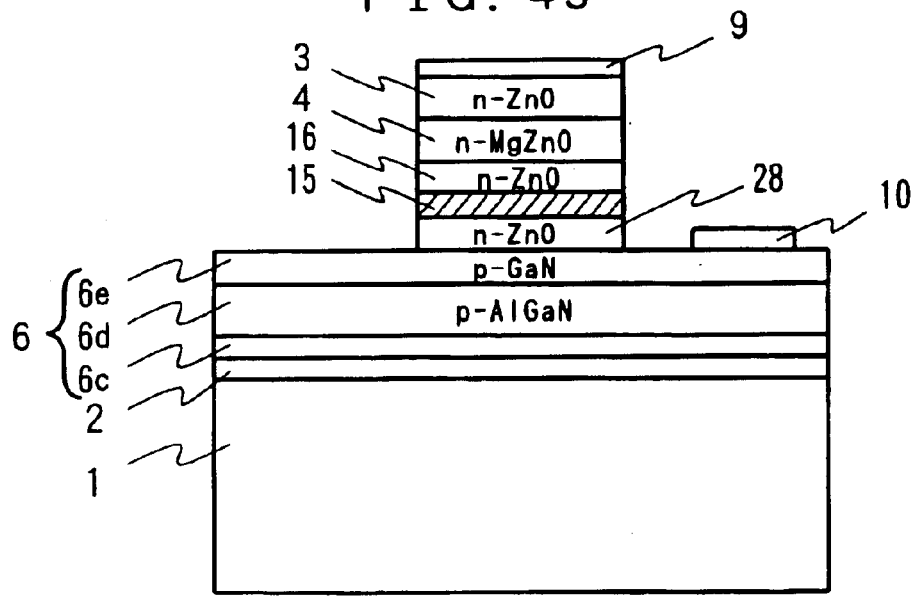
FIG. 45 is a cross-sectional explanatory view of a LD chip of a semiconductor light emitting device according to the present invention using a composite semiconductor of a ZnO-based compound and a GaN-based compound.
Figure 46:
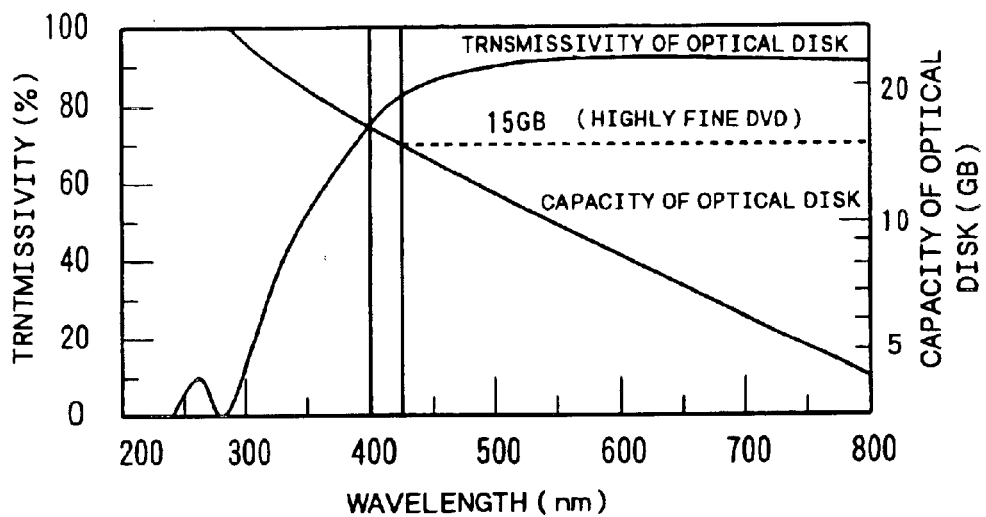
FIG. 46 is an explanatory view of a wavelength range of a blue LED needed in a highly fine DVD.
Figure 47:
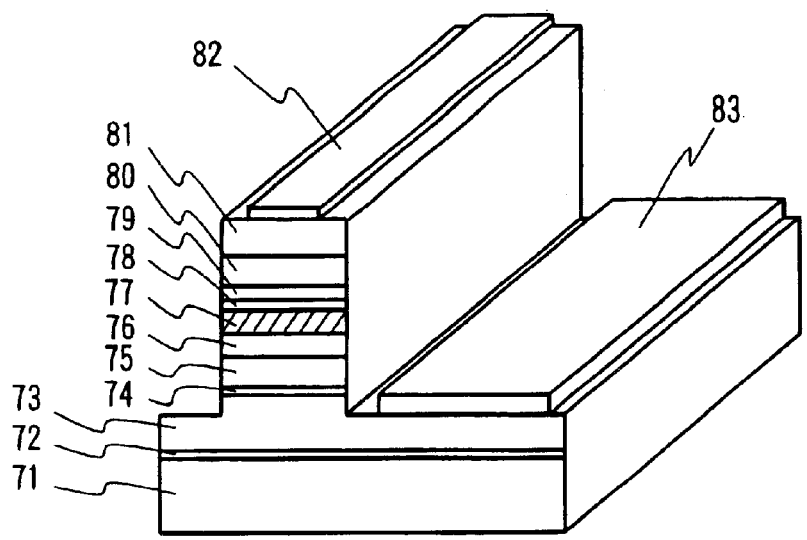
FIG. 47 is a cross-sectional explanatory view of an example of a blue semiconductor light emitting device in the prior art.

FIGS. 44 to 45 are cross-sectional explanatory views showing still another embodiment, where the p-type semiconductor layers are formed of GaN-based compounds, and the n-type layers are formed of ZnO-based compounds. Namely, as described before, it is difficult to obtain a p-type layer having a large carrier concentration with the use of a ZnO-based compound. On the other hand, since a GaN-based compound semiconductor is chemically extremely stable, it must be grown at a high temperature, and cannot be subjected to wet etching. For this reason, an electric current constriction layer for defining an electric current injection region in an LD cannot be formed by burying it near the active layer. Furthermore, since a sapphire substrate is used as a substrate suitable for a GaN-based compound semiconductor and one electrode cannot be taken out from the rear surface of the substrate, it is necessary to expose a lower semiconductor layer having a different conductivity by etching the laminated GaN-based compound semiconductor layers by dry etching for connecting one electrode.

Further, in the case of a ZnO-based compound semiconductor, the bonding energy (binding energy) of its exciton (a pair of an electron and a positive hole bound by a Coulomb force) has an extremely large value of 60 meV, which is larger than the heat energy 26 meV of room temperature, as described before. Therefore, excitons can exist stably even at room temperature. This exciton, once formed, easily generates a light quantum. Namely, the ZnO-based compound semiconductor emits light with good efficiency. For this reason, it is known in the art that the ZnO-based compound semiconductor emits light far more efficiently than the direct recombination light-emission in which a free electron and a free positive hole are directly recombined to emit light (for example, see "Fascination of Blue Light emitting Device" by Isamu Akazaki, pp. 50–60, (published by Kogyo Chosakai, May 1997)).

Furthermore, a GaN-based compound semiconductor and a ZnO-based compound semiconductor have physical properties such that their band gap energies Eg and their lattice constants along the a-axis and the c-axis are extremely similar to each other, as shown in Table 4. For this reason, a composite of a GaN-based compound semiconductor and a ZnO-based compound semiconductor is formed.

TABLE 4

Lattice Constant of ZnO and GaN

|  | Eg (eV) | a-axis (Å) | c-axis (Å) |
| --- | --- | --- | --- |
| ZnO | 3.37 | 3.2496 | 5.2065 |
| GaN | 3.39 | 3.160 | 5.125 |

A semiconductor light emitting device according to this example includes a light emitting layer forming portion 11 disposed, for example, on a sapphire substrate 1 and forming a light emitting layer by lamination of compound semiconductor layers having at least an n-type layer 4 and a p-type layer 6, as illustrated in FIG. 44 showing a cross-sectional view of an example thereof. Further, the n-type layer 4 is made of a ZnO-based compound semiconductor, and the p-type layer 6 is made of a GaN-based compound semiconductor.

In the example shown in FIG. 44, the light emitting layer forming portion 11 has a double heterojunction structure in which an active layer 5 made of $Cd_xZn_{1-x}O$ ($0 \leq x<1$, for example, x=0.08) is sandwiched between an n-type cladding layer 4 made of $Mg_yZn_{1-y}O$ ($0 \leq y < 1$, for example, y=0.15) and a p-type cladding layer 6d made of p-type $Al_aGa_{1-a}N$ ($0 \leq s \leq 0.3$, for example, a=0.15), but it may have a heterojunction structure in which the n-type layer and the p-type layer are directly joined. In the example shown in FIG. 44, the p-type layer 6 includes a first p-type GaN layer 6c having a thickness of about 0.1 to 0.3 µm, preferably about 0.1 µm, a cladding layer 6d made of p-type $Al_aGa_{1-a}N$ and having a thickness of about 0.1 to 1 µm, preferably about 0.5 µm, and a second p-type GaN layer 6e having a thickness of about 0.1 to 0.3 µm, preferably about 0.1 µm. The second p-type GaN layer 6e on the active layer 5 side is a layer for facilitating the formation of a later-mentioned p-side electrode 10 and, since this second layer 6e is thin, the $Al_aGa_{1-a}N$ layer 6d contributes to the effect of enclosing the carriers. Further, the first p-type GaN layer 6c is interposed because, if an AlGaN layer is grown directly on a low temperature buffer layer 2, its crystallinity will be poor. Therefore, the first p-type GaN layer 6c may be InGaN.

The active layer 5 is a layer that emits light by recombination of carriers, and its band gap energy determines the wavelength of the emitted light, so that a material having a band gap energy corresponding to the wavelength of the light to be emitted is used to form, for example, a single active layer having a thickness of about 0.1 µm. The band gap energy of $Cd_xZn_{1-x}O$ decreases according as the value of x increases. For example, in order to emit light having a wavelength of about 400 nm, the value of x is preferably about 0.08. The active layer 5 is preferably non-doped in order to avoid formation of a non-light emitting recombination center.

The n-type layer (n-type cladding layer) 4 as well as the p-type layer 6 (p-type cladding layer 6d) are formed to have a larger band gap energy than the active layer 5 and to produce an effect of enclosing the carriers within the active layer 5 effectively. In this example, the n-type (cladding) layer 4 is made of a ZnO-based compound, specifically $Mg_yZn_{1-y}O$ ($0 \leq y < 1$, for example, y=0.15), and is formed to a thickness of, for example, about 2 µm. The p-type cladding layer 6d is made of $Al_aGa_{1-a}N$ (for example, a=0.15).

In the example shown in FIG. 44, a buffer layer 28 made of n-type ZnO is formed as a thin layer having a thickness of about 100 to 1000 Å, preferably about 100 to 300 Å, between the p-type layer 6 (second p-type GaN layer 6e) and the active layer 5. This is due to the following reason. The p-type layer 6 is a GaN-based compound semiconductor and the active layer 5 is a ZnO-based compound semiconductor. Generally, it is known in the art that, if heterogeneous materials are joined, an interface level is generated to produce an adverse effect on the light emitting layer. For this reason, a buffer layer is disposed so as to avoid direct heterogeneous joining of the active layer, thereby to prevent the adverse effect on the light emitting layer. Therefore, the buffer layer may be made of a ZnO-based compound semiconductor which is homogeneous with the active layer 5 and which is a material having a larger band gap energy than the active layer 5, instead of ZnO.

The substrate 1 may be, for example, a sapphire substrate, and a low temperature buffer layer 2 made of GaN and formed at a low temperature is disposed thereon to a thickness of about 0.01 to 0.2 µm. The substrate 1 is not limited to sapphire alone, and may a substrate such as ZnO, GaN, or SiC. Referring to FIG. 44, if the substrate 1 is insulating, one electrode is disposed on a semiconductor layer exposed by etching a portion of the laminated semiconductor layers and having an opposite conductivity type to the front surface side. However, in the present invention, since the n-type layer 4 is a ZnO-based compound semiconductor layer, it can be etched by wet etching, and an electrode can be easily formed even if an insulating substrate is used.

Further, the low temperature buffer layer 2 is a layer for alleviating the mismatch based on the difference of the lattice constants or the like between the GaN-based compound semiconductor layer to be grown and the substrate 1 and, by being formed at a low temperature, it serves to grow the GaN-based compound semiconductor grown thereon with good crystallinity. This low temperature buffer layer 2 is not limited to GaN alone, and may be formed of AlN, AlGaN, ZnO, or the like at a low temperature. If the substrate 1 is an electrically conductive substrate and an electrode is taken out from its rear surface, it is necessary to form the buffer layer 2 to have the same conductivity type as the substrate 1. However, if the substrate 1 is insulating, the buffer layer 2 may be insulating like AlN, or may be of either conductivity type.

A transparent electrode 8 made, for example, of ITO is formed on the surface of the n-type layer 4, and an n-side electrode 9 made, for example, of Au is formed thereon by vacuum vapor deposition and patterning or the lift-off method. Further, a p-side electrode 10 made, for example, of a laminate structure of Ti/Ni is formed by vacuum vapor deposition and patterning or the lift-off method on the p-type layer (second GaN layer 6e) exposed by removing a portion of the laminated n-type layer 4, active layer 5, and buffer layer 28 by wet etching. The wafer is then made into chips to produce a LED chip such as shown in FIG. 44.

A production method of this LED will be explained with reference to concrete examples. First, a substrate 1 made of sapphire is washed with an organic solvent such as acetone or ethanol, rinsed with pure water, then subjected to an acid treatment with a mixed liquid of phosphoric acid+sulfuric acid (mixing ratio=1:3) at 80° C., and then rinsed again with pure water. The sapphire substrate 1 thus subjected to these pretreatments is put into an MOCVD (metal organic chemical vapor deposition) apparatus, and the substrate temperature $T_s$ is raised to about 1050° C. in a $H_2$ atmosphere for thermal cleaning for about 10 minutes.

After these pretreatments are finished, the substrate temperature $T_s$ is lowered to about 600° C., and then trimethylgallium (TMG) and ammonia gas ($NH_3$), which are reaction gases, are introduced together with a carrier gas $H_2$ to form a film of a buffer layer 2 made of p-type GaN to a thickness of about 0.01 to 0.2 µm. Then, cyclopentadienyl magnesium ($Cp_2Mg$), which is a p-type dopant gas, is introduced, and the substrate temperature is raised to about 1000° C. to form a first p-type GaN layer 6c doped with Mg, to a thickness of about 0.1 to 0.3 µm. Further, trimethylaluminum (TMA), which is a reaction gas, is introduced to form a p-type $Al_aGa_{1-a}N$ (for example, a=0.15) layer 6d to a thickness of about 0.1 to 1 µm, and further the reaction gas TMA is stopped to form a second p-type GaN layer 6e to a thickness of about 0.1 to 0.3 µm, thereby to form a p-type layer 6. Thereafter, the growth is stopped for a time, and an annealing treatment is carried out at about 600 to 800° C. under an $N_2$ atmosphere to activate the p-type dopant to turn the layers into p-type.

Next, the substrate 1 having the p-type layer 6 grown thereon is put into an MBE apparatus, and the substrate temperature is raised to about 700° C. for thermal cleaning. Then, the substrate temperature is lowered to about 300 to 600° C., and Zn and plasma oxygen are radiated from sources together with an n-type dopant Al to grow n-type ZnO to a thickness of about 100 to 1000 Å as a buffer layer 28. Then, the substrate temperature is raised to about 200 to 400° C., and a source of Cd is opened to grow an active layer 5 made of $Cd_xZn_{1-x}O$ (for example, x=0.08) to a thickness of about 0.1 µm. Further, the substrate temperature is set to be about 300 to 600° C., and a cell of Mg is opened instead of the cell of Cd to grow an n-type cladding layer 4 made of $Mg_yZn_{1-y}O$ (for example, y=0.15) to a thickness of about 0.5 µm.

Thereafter, a portion of the laminated ZnO-based compound semiconductor layers is etched with an $H_2SO_4$-based solution to expose the second p-type GaN layer 6e. During this etching, the second p-type GaN layer 6e is not etched at all, so that it is possible to selectively etch only the ZnO-based compound semiconductor layers. Then, an ITO electrode 8 is formed to a thickness of about 0.05 to 0.2 µm by vapor deposition or the like on the surface of the n-type layer 4. Further, an n-side electrode 9 is formed by patterning vapor deposition of Au by the lift-off method or the like on the surface of the ITO electrode 8. Furthermore, a p-side electrode 10 is formed by patterning vapor deposition of Ni/Ti in the same manner on the surface of the second p-type GaN layer 6e which is exposed by the aforesaid etching. Then, the wager is made into chips to produce a LED chip shown in FIG. 44.

According to this example, since the p-type layer is made of a GaN-based compound semiconductor and the active layer and the n-type layer are made of ZnO-based compound semiconductor, a p-type layer can be formed with a GaN-based compound semiconductor in lieu of a ZnO-based compound semiconductor that cannot be turned easily into a p-type layer. Therefore, a highly efficient light emission utilizing excitons can be obtained in a pn-junction electric current injection type. Further, even if semiconductor layers are laminated on an insulating substrate and one electrode is formed on a semiconductor layer exposed by etching a portion of the laminate, the etching process can be easily carried out by etching the ZnO-based compound semiconductor.

Furthermore, since an n-type ZnO-based compound semiconductor layer having a larger band gap energy than the active layer is interposed between the p-type GaN-based compound semiconductor layer and the active layer, it acts as a buffer layer, so that the active layer need not be directly joined with a heterogeneous material, thereby avoiding the influence of the interface level caused by the heterogeneous material on the light emitting layer. In this case, since the intervening buffer layer is extremely thin, the holes from the p-type GaN-based compound semiconductor pass through the buffer layer to be injected into the active layer and form a pn-junction even if the buffer layer is n-type.

In this example, the p-type GaN-based compound semiconductor was grown by the MOCVD apparatus, and the ZnO-based compound semiconductor was grown by the MBE apparatus. However, the ZnO-based compound semiconductor also can be grown successively by the MOCVD apparatus in the same manner. In this case, it is possible to use dimethylzinc (DMZn) as an organic metal compound of Zn, dimethylcadmium as a reaction gas of Cd, $Cp_2Mg$ as a reaction gas of Mg, TMA as an n-type dopant gas, and plasma oxygen as a reaction gas of oxygen. Further, the semiconductor layers may be grown by the MBE apparatus stating from the first GaN-based compound semiconductor. In this case, Ga and plasma nitrogen are used as sources.

Further, this example was directed to an example of LED. However, even in the case of an LD, by forming the p-type layer with the use of a GaN-based compound semiconductor and forming the active layer and the n-type layer with the use of ZnO-based compound semiconductor, the light-emission efficiency can be increased and the electric current injection region can be narrowed by a simple process of wet etching, in the same manner. In this case, the light emitting layer forming portion is a little different. For example, the active layer 15 is preferably formed to have a multiple quantum well structure obtained by alternate lamination of barrier layers and well layers made of non-doped $Cd_{0.03}Zn_{0.97}O/Cd_{0.2}Zn_{0.8}O$ to thicknesses of 50 Å and 40 Å, respectively, each in two to five layers. Further, if the active layer 15 is thin and the light cannot be sufficiently enclosed within the active layer 15, an optical wave guide layer made, for example, of ZnO is disposed on both sides of the active layer. Further, the transparent electrode made of ITO is not needed, and the light emitting device is formed to have a structure defining an electric current injection region by directly forming the p-side electrode 10 in patterned stripes, etching an upper portion of the semiconductor layers into a mesa-type shape, or burying an electric current constriction layer. In the present invention, by forming an upper portion of the semiconductor laminate section into ZnO-based compound semiconductor layers, they can be easily etched by wet etching. Therefore, the light emitting device can be formed into a mesa-type shape without giving an influence on the active layer, and also the electric current constriction layer can be formed of a ZnO-based compound semiconductor and built near the active layer. FIG. 45 shows an example in which an LD chip is formed by constructing a mesa-type shape.

In order to produce an LD chip having a mesa-type structure shown in FIG. 45, a low-temperature buffer layer 2 is grown on a substrate 1, and a first p-type GaN layer 6c, a cladding layer 6d made of an AlGaN-based compound, and a second p-type GaN layer 6e serving as an optical wave guide layer are successively grown to form a p-type layer 6, as described before, and an annealing treatment is carried out in the same manner as described before. Then, a buffer layer 28 made of n-type ZnO and an active layer 15 having the aforesaid multiple quantum well structure are grown in an MBE apparatus, and an n-type optical wave guide layer 16 made of p-type ZnO and having a thickness of about 0.05 µm and an n-type cladding layer 4 made of n-type $Mg_yZn_{1-y}O$ (for example, y=0.15) and having a thickness of about 0.5 µmare grown thereon. Then, a contact layer 3 made of n-type ZnO is grown to a thickness of about 0.3 to 0.5 µm. Thereafter, the substrate 1 is taken out from the MBE apparatus and, with a resist mask formed on the front surface, a portion of the laminated ZnO-based compound semiconductor layers is etched with an $H_2SO_4$-based solution to expose the second p-type GaN layer 6e. This etching is carried out for defining (narrowing) an electric current injection region, and the etching is carried up to the active layer 15 in accordance with the width of the electric current injection region to be formed in the active layer 15. However, as previously described, the etching stops selectively on the surface of the p-type layer 6 (second GaN layer 6e). Then, an n-side electrode 9 and a p-side electrode 10 are formed as in the previously described examples, and the wafer is made into chips to produce an LD chip having a structure shown in FIG. 45. Here, in forming chips, a better mirror edge surface is obtained if a light emitting surface is formed by dry etching. Here, if the substrate is made of GaN, SiC, or the like instead of sapphire, the wafer can be cleaved.

Here, in the production of this LD, all the semiconductor layers can be grown either by an MOCVD apparatus or an MBE apparatus alone. Also, the example of each semiconductor is merely an example, so that for example GaN or the like may be used in place of AlGaN, and materials having a crystal mixing ratio to give a suitable band gap energy can be used by selection among the range of GaN-based compound semiconductor and ZnO-based compound semiconductor. Further, if the p-type layer is grown in the MBE apparatus, it can be turned into p-type as it is in a grown state without an annealing treatment after the growth of the p-type layer because a p-type dopant does not combine with H at the time of growth. Further, in the case of growing an n-type ZnO-based compound semiconductor layer, an n-type layer can be obtained without doping it with an n-type dopant such as Ga or Al. However, it is preferable to introduce an n-type dopant because then the carrier concentration can be easily controlled.

According to this example, since a semiconductor light emitting device is formed by heterogeneous joining using a GaN-based compound semiconductor and a ZnO-based compound semiconductor, a p-type layer can be obtained with the use of the GaN-based compound semiconductor while utilizing the high light-emission efficiency and the facility in wet etching of the ZnO-based compound semiconductor, whereby pn-junction type electric current injection light emission can be made. As a result, a highly efficient light emission can be made, and the etching for forming an electrode and the etching of semiconductor layers for defining an electric current injection region of an LD can be easily carried out, thereby simplifying the production process with reduced costs and manufacturing a blue semiconductor light emitting device being excellent in light-emission characteristics. Particularly, a blue LED can be easily obtained with a low threshold voltage and with a large output.

Here, in the figures shown in each of the previously described examples, the substrate 1 is abbreviated and drawn thin, although the substrate 1 actually has a thickness more than several ten times as compared with other layers. The thicknesses of some of the other semiconductor layers are drawn partially in exaggeration for explanation, so that they do not represent the exact thicknesses.

INDUSTRIAL APPLICABILITY

According to the present invention, a blue LED or LD can be realized with the use of a ZnO-based compound semiconductor that can be easily handled with. As a result, it can be used as a full-color display, a light source of a signal lamp or the like, a laser light source that continuously oscillates at room temperature for a highly fine next-generation DVD, or the like.

What is claimed is:

1. A semiconductor light emitting device comprising:
a substrate; and
a light emitting layer forming portion disposed on said substrate so that an active layer that emits light by electric current injection is sandwiched between n-type and p-type cladding layers made of materials having a larger band gap than said active layer,
wherein said active layer is made of a ZnO-based oxide compound semiconductor containing at least Cd.

2. The semiconductor light emitting device of claim 1, wherein said cladding layers are made of ZnO-based oxide compound semiconductor.

3. The semiconductor light emitting device of claim 1, wherein said cladding layers are made of Group III nitride compound semiconductor.

4. The semiconductor light emitting device of claim 1, 2 or 3, wherein said active layer is made of $Cd_xZn_{1-x}O$ ($0 \leq x < 1$).

5. A semiconductor light emitting device comprising:
a single crystalline substrate; and
a light emitting layer forming portion disposed on said substrate so that an active layer that emits light by electric current injection is sandwiched between n-type and p-type cladding layers made of materials having a larger band gap than said active layer
wherein said cladding layers are made of an ZnO-based oxide compound semiconductor containing Zn or Mg and Zn.

6. The semiconductor light emitting device of claim 5, wherein said cladding layers are made of $Mg_yZn_{1-y}O$ ($0 \leq y < 1$).

7. The semiconductor light emitting device of claim 1, 2, 3, 4, 5 or 6, wherein the substrate on which said cladding layers and said active layer are laminated is one kind selected from the group consisting of GaN, Si having SiC formed thereon, single crystal SiC, and sapphire.

8. The semiconductor light emitting device of claim 1, 2, 3, 4, 5, 6 or 7, wherein said active layer is a single quantum well structure or a multiple quantum well structure.

9. A semiconductor laser comprising:
an active layer that emits light by electric current injection, and
n-type and p-type cladding layers made of materials having a larger band gap than said active layer and sandwiching said active layer from both sides thereof,
wherein said active layer is made of $Cd_xZn_{1-x}O$ ($0 \leq x < 1$), said cladding layers are made of $Mg_yZn_{1-y}O$ ($0 \leq y < 1$), and an internal electric current constriction layer is built therein.

10. The semiconductor light emitting device of claim 1, wherein said active layer is made of a bulk layer of $Cd_xZn_{1-x}O$ ($0 \leq x < 1$) or a quantum well structure constructed with a composition modification of $Cd_xZn_{1-x}O$ ($0 \leq x < 1$), and a stress-alleviating layer is disposed on at least one side of said n-type cladding layer side and said p-type cladding layer side of said active layer so as to be in contact with said active layer, said stress-alleviating layer being made of a material having a larger band gap than said active layer and having a composition with approximately the same lattice constant as a material of the composition located on the outermost side of said active layer on said at least one side.

11. The semiconductor light emitting device of claim 10, wherein said stress-alleviating layer is made of $Mg_wZn_{1-w}O$ ($0 \leq w < 1$), and said cladding layers are made of oxide compound semiconductor containing Mg and Zn.

12. A semiconductor laser comprising:
an active layer that emits light by electric current injection, and
n-type and p-type cladding layers made of materials having a larger band gap than said active layer and sandwiching said active layer from both sides thereof,
wherein said active layer is made of a quantum well structure constructed with a composition modification of $Cd_xZn_{1-x}O$ ($0 \leq x < 1$), and a stress-alleviating layer is disposed on at least one side of said n-type cladding layer side and said p-type cladding layer side of said active layer so as to be in contact with said active layer, said stress-alleviating layer being made of $Mg_wZn_{1-x}O$ ($0 \leq w < 1$) having a composition with approximately the same lattice constant as the composition located on the outermost side of said active layer on said at least one side.

13. The semiconductor laser of claim 12, wherein said cladding layers are made of $Mg_yZn_{1-y}O$ ($0 \leq y < 1$), and an optical wave guide layer is disposed between said stress-alleviating layer and said n-type or p-type cladding layer.

14. The semiconductor light emitting device of claim 4, wherein a low-temperature ZnO layer is disposed at least on said active layer side between said active layer and an upper cladding layer.

15. The semiconductor light emitting device of claim 14, wherein said low-temperature ZnO layer is disposed to have a thickness from 100 to 1000 Å.

16. A semiconductor light emitting device comprising:
a sapphire substrate,
a buffer layer made of an $Al_2O_3$ film disposed on said sapphire substrate, and
a light emitting layer forming portion made of ZnO-based compound semiconductor disposed on said buffer layer, said light emitting layer forming portion including at least n-type and p-type layers to form a light emitting layer.

17. The semiconductor light emitting device of claim 16, wherein said light emitting layer forming portion has a double heterojunction structure in which an active layer made of $Cd_xZn_{1-x}O$ ($0 \leq x < 1$) is sandwiched between n-type and p-type cladding layers made of $Mg_yZn_{1-y}O$ ($0 \leq y < 1$).

18. A semiconductor light emitting device comprising:
a substrate, and
a semiconductor laminate section disposed on said substrate and made of oxide compound semiconductor layers and including a light emitting layer forming portion,
wherein an oxide thin film containing Zn is disposed as a buffer layer on a front surface of said substrate at a lower temperature than a temperature of growing semiconductor layers of said semiconductor laminate section and is interposed between said substrate and said semiconductor laminate section.

19. The semiconductor light emitting device of claim 18, wherein said buffer layer is formed to have a thickness of 20 to 200 nm by an MBE method, an MOCVD method, or a plasma CVD method between 100 and 300° C.

20. A method of manufacturing a semiconductor light emitting device comprising the steps of:
forming a non-crystalline or polycrystalline oxide thin film containing Zn on a substrate by a sputtering method, a vacuum vapor deposition method, or a laser ablation method,
putting said substrate into an apparatus for epitaxial growth of semiconductor layers and raising a substrate temperature to a growth temperature, and
laminating an oxide compound semiconductor layer to form a light emitting layer forming portion.

21. A semiconductor light emitting device comprising:
a substrate, and
a semiconductor laminate section including a light emitting layer forming portion made of compound semiconductor layers disposed on said substrate and having n-type and p-type layers to form a light emitting layer,
wherein a buffer layer is disposed between said substrate and said semiconductor laminate section, said buffer layer being made of a material having a thermal expansion coefficient larger than the thermal expansion coefficient of an epitaxial growth layer at the lowermost layer of said semiconductor laminate section and smaller than the thermal expansion coefficient of said substrate.

22. The semiconductor light emitting device of claim 21, wherein said substrate is made of a sapphire substrate; wherein the epitaxial growth layer of said lowermost layer is made of a ZnO-based compound semiconductor; and wherein said buffer layer is a compound semiconductor having a wurtzite structure.

23. The semiconductor light emitting device of claim 22, wherein said buffer layer is made of $Al_pGa_{1-p}N$ ($0 \leq p < 1$).

24. The semiconductor light emitting device of claim 1, further comprising:
a reflective film for reflecting light from a front surface side of said substrate, and
a semiconductor laminate section,
wherein said reflective film is laminated by an even number of dielectric films or semiconductor films having different refractive indices with a thickness of $\lambda/(4n)$ (n is a refractive index of the dielectric film or the semiconductor film, and $\lambda$ is a light emission wavelength) on said substrate so that a layer having a smaller refractive index and a layer having a larger refractive index are alternately laminated in this order; and
wherein, in said semiconductor laminate section, semiconductor layers are laminated on said reflective film to form a the light emitting layer.

25. A semiconductor light emitting device comprising:
a substrate;
a reflective film for reflecting light from a front surface side of said substrate;
a semiconductor laminate section; and
wherein said reflective film is laminated by an even number of dielectric films or semiconductor films having different refractive indices with a thickness of $\lambda/(4n)$ (n is a refractive index of the dielectric film or the semiconductor film, and $\lambda$ is a light emission wavelength) on said substrate so that a layer having a smaller refractive index and a layer having a larger refractive index are alternately laminated in this order, and
wherein, in said semiconductor laminate section, semiconductor layers are laminated on said reflective film to form a the light emitting layer, and
wherein a buffer layer made of oxide containing Zn and formed at a low temperature is disposed on said reflective film; and wherein said semiconductor laminate section is formed by lamination of oxide compound semiconductor on said buffer layer.

26. The semiconductor light emitting device of claim 25, wherein said buffer layer is formed by forming a non-crystalline or polycrystalline oxide thin film containing Zn by a sputtering method, a vacuum vapor deposition method, or a laser ablation method, and said semiconductor laminate section is formed by lamination of a ZnO-based compound semiconductor on said buffer layer.

27. A ZnO-based compound semiconductor light emitting device comprising:
a substrate; and
a light emitting layer forming portion disposed on said substrate and forming a light emitting layer by lamination of ZnO-based compound semiconductor having at least an n-type layer, wherein an n-side electrode disposed in contact with said n-type layer of said ZnO-based compound semiconductor is formed so that a portion of said n-side electrode which is in contact with said n-type layer is formed of Ti or Cr, said portion not containing Al.

28. The semiconductor light emitting device of claim 27, wherein a layer containing Ti and Al is disposed on said layer of Ti or Cr.

29. The semiconductor light emitting device of claim 28, wherein said Ti and Al are formed into an alloy by an annealing treatment after said layer containing Ti and Al is formed.

30. A semiconductor light emitting device comprising:
a substrate, and
a light emitting layer forming portion made of ZnO-based compound semiconductor layers disposed on said substrate and forming a light emitting layer with an n-type layer and a p-type layer, wherein said p-type layer contains an element capable of becoming an n-type dopant as a buffering agent.

31. A ZnO-based compound semiconductor light emitting device comprising:
a substrate, and
a light emitting layer forming portion that forms a light emitting layer by lamination of a ZnO-based compound semiconductor layer disposed on said substrate,
wherein said ZnO-based compound semiconductor layer contains C element.

32. A semiconductor light emitting device of claim 31, wherein said C element is C of an organic metal compound used as a Zn material in growing said ZnO-based compound semiconductor layer.

33. A semiconductor laser comprising:
a substrate, a first cladding layer disposed on said substrate and made of a first conductivity type semiconductor,
an active layer disposed on said first cladding layer,
a second cladding layer disposed on said active layer and made of a second conductivity type semiconductor, and
an electric current constriction layer disposed in the inside of or in the vicinity of said second cladding layer,
wherein said electric current constriction layer is made of a ZnO-based compound semiconductor doped with a Group IA or Group VB element.

34. A semiconductor laser of claim 33, wherein said first cladding layer, said active layer, and said second cladding layer are made of ZnO-based or GaN-based compound semiconductor.

35. The semiconductor laser of claim 33 or 34, wherein said electric current constriction layer is made of $Mg_zZn_{1-z}O$ ($0 \leq z < 1$).

36. A semiconductor laser comprising:
a substrate,
a first cladding layer disposed on said substrate and made of a first conductivity type semiconductor,
an active layer disposed on said first cladding layer,
a second cladding layer disposed on said active layer and made of a second conductivity type semiconductor, and
an electric current constriction layer disposed in the inside of or in the vicinity of said second cladding layer and made of $Mg_zZn_{1-z}O$ ($0 \leq z < 1$),
wherein an etching stopping layer made of $Cd_sZn_{1-s}O$ ($0 < s < 1$) or $Be_tZn_{1-t}O$ ($0 < t < 1$) is disposed on said substrate side of said electric current constriction layer.

37. An oxide compound semiconductor light emitting diode comprising:
an n-type layer made of an n-type ZnO-based compound semiconductor,
an i-layer made of a semi-insulating ZnO-based compound semiconductor, and
an electrically conductive layer disposed on a front surface of said i-layer.

38. An oxide compound semiconductor light emitting diode comprising:
an n-type layer made of an n-type ZnO-based compound semiconductor,
a doped layer in which a ZnO-based compound semiconductor layer is doped with at least one kind of element selected from the group consisting of Group IA, Group IB, and Group VB elements, and
an electrically conductive layer disposed on a front surface of said doped layer.

39. The semiconductor light emitting diode of claim 38, wherein said n-type layer is doped with a Group IIIB element.

40. A semiconductor light emitting device comprising:
a substrate, and
a light emitting layer forming portion disposed on said substrate and forming a light emitting layer by lamination of compound semiconductor layers having at least an n-type layer and a p-type layer, wherein said n-type layer is made of a ZnO-based compound semiconductor; and
wherein said p-type layer is made of a GaN-based compound semiconductor.

41. The semiconductor light emitting device of claim 40, wherein an active layer made of $Cd_xZn_{1-x}O$ ($0 \leq x \leq 0.5$) is disposed between said n-type layer and said p-type layer.

42. The semiconductor light emitting device of claim 41, wherein an n-type ZnO-based compound semiconductor layer made of a material having a larger band gap energy than said active layer is disposed between said active layer and said p-type layer.

43. A semiconductor light emitting device comprising:
an insulating substrate,
a light emitting layer forming portion formed of a p-type layer disposed on said insulating substrate and made of a GaN-based compound semiconductor and an n-type layer disposed on said p-type layer and made of a ZnO-based compound semiconductor,
an n-side electrode disposed on said n-type layer, and
a p-side electrode disposed on said p-type layer which is exposed by removal of a portion of said ZnO-based compound semiconductor layer through etching.

44. The semiconductor light emitting device of claim 43, wherein said light emitting layer forming portion has a semiconductor laser structure having a p-type layer made of a GaN-based compound semiconductor, an active layer made of a ZnO-based compound semiconductor having a smaller band gap energy than said p-type layer, and an n-type layer made of a ZnO-based compound semiconductor having a larger band gap energy than said active layer; and wherein said laminated ZnO-based compound semiconductor layers are removed by etching except for a region for injecting an electric current into said active layer.

45. The semiconductor light emitting device of claim 44, wherein a buffer layer made of an n-type ZnO-based compound semiconductor having a larger band gap energy than said active layer is disposed between said p-type layer and said active layer.

* * * * *